(12) United States Patent
Ohuchi et al.

(10) Patent No.: US 8,884,281 B2
(45) Date of Patent: Nov. 11, 2014

(54) ORGANIC EL ELEMENT

(75) Inventors: Satoru Ohuchi, Osaka (JP); Ryuuta Yamada, Kyoto (JP); Takahiro Komatsu, Osaka (JP); Shinya Fujimura, Osaka (JP); Hirofumi Fujita, Ehime (JP); Kenichi Nendai, Hyogo (JP); Kou Sugano, Hyogo (JP); Shuhei Yada, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/994,164

(22) PCT Filed: Jan. 21, 2011

(86) PCT No.: PCT/JP2011/000324
§ 371 (c)(1),
(2), (4) Date: Jun. 14, 2013

(87) PCT Pub. No.: WO2012/098587
PCT Pub. Date: Jul. 26, 2012

(65) Prior Publication Data
US 2013/0313543 A1 Nov. 28, 2013

(51) Int. Cl.
*H01L 29/08* (2006.01)
*H01L 51/52* (2006.01)
*H01L 51/50* (2006.01)
*H01L 51/56* (2006.01)

(52) U.S. Cl.
CPC ............ *H01L 51/52* (2013.01); *H01L 51/5088* (2013.01); *H01L 51/56* (2013.01); *H01L 2251/55* (2013.01)
USPC .................. 257/40; 257/43; 257/59; 257/72; 257/89; 257/100

(58) Field of Classification Search
CPC ................................. H01L 33/00; H01L 51/50
See application file for complete search history.

(56) References Cited

U.S. PATENT DOCUMENTS 5,294,869 A   3/1994 Tang et al.
5,443,922 A   8/1995 Nishizaki et al.
(Continued)

FOREIGN PATENT DOCUMENTS

CN   101170124   4/2008
EP   2175504     4/2010
(Continued)

OTHER PUBLICATIONS

Meyer et al., "Charge generation layers comprising transition metal-oxide/organic interfaces: Electronic structure and charge generation mechanism", Applied Physics Letters, 96, 193302, pp. 1-3 (May 2010).

(Continued)

*Primary Examiner* — Kyoung Lee
(74) *Attorney, Agent, or Firm* — Greenblum & Bernstein, P.L.C.

(57) ABSTRACT

Provided is an organic EL element which withstands mass production of organic EL display panels, and promises driving at a low voltage and high luminous efficiency due to excellent hole-injection efficiency. Specifically, an organic EL element is formed by sequentially laminating an anode, a hole injection layer, a buffer layer, a light-emitting layer, and a cathode on one surface of a substrate. The hole injection layer is a at least 2 nm thick tungsten oxide layer formed under predetermined film forming conditions, and includes an occupied energy level that is 1.8 eV to 3.6 eV lower than a lowest energy level of a valence band of the hole injection layer in terms of a binding energy. This reduces the hole injection barrier between the anode and the hole injection layer and the hole injection barrier between the hole injection layer and the buffer layer.

33 Claims, 40 Drawing Sheets

(56) References Cited

U.S. PATENT DOCUMENTS

| | | |
|---|---|---|
| 5,688,551 A | 11/1997 | Littman et al. |
| 6,132,280 A | 10/2000 | Tanabe et al. |
| 6,284,393 B1 | 9/2001 | Hosokawa et al. |
| 6,309,801 B1 | 10/2001 | Meijer et al. |
| 7,785,718 B2 | 8/2010 | Yatsunami et al. |
| 8,058,797 B2 | 11/2011 | Frey et al. |
| 2002/0051894 A1 | 5/2002 | Yoshikawa |
| 2002/0158835 A1 | 10/2002 | Kobayashi et al. |
| 2003/0137242 A1 | 7/2003 | Seki |
| 2004/0178414 A1 | 9/2004 | Frey et al. |
| 2005/0064633 A1 | 3/2005 | Mikoshiba |
| 2005/0170208 A1 | 8/2005 | Yatsunami et al. |
| 2005/0208206 A1 | 9/2005 | Yoshikawa |
| 2005/0266763 A1 | 12/2005 | Kimura et al. |
| 2006/0008931 A1 | 1/2006 | Lee et al. |
| 2006/0204788 A1 | 9/2006 | Yoshikawa |
| 2006/0243377 A1 | 11/2006 | Matsuo et al. |
| 2006/0284166 A1 | 12/2006 | Chua et al. |
| 2007/0029929 A1 | 2/2007 | Nakamura et al. |
| 2007/0034864 A1 | 2/2007 | Liu |
| 2007/0172978 A1 | 7/2007 | Chua et al. |
| 2007/0241665 A1 | 10/2007 | Sakanoue et al. |
| 2007/0290604 A1 | 12/2007 | Sakanoue et al. |
| 2008/0100209 A1 | 5/2008 | Ito |
| 2008/0150422 A1 | 6/2008 | Ohara |
| 2008/0231179 A1 | 9/2008 | Abe et al. |
| 2008/0312437 A1* | 12/2008 | Inoue et al. ............ 544/225 |
| 2009/0115318 A1 | 5/2009 | Gregory et al. |
| 2009/0160325 A1 | 6/2009 | Yatsunami et al. |
| 2009/0200917 A1 | 8/2009 | Yamagata et al. |
| 2009/0243478 A1 | 10/2009 | Shoda et al. |
| 2009/0250685 A1 | 10/2009 | Moon |
| 2009/0272999 A1 | 11/2009 | Yoshida et al. |
| 2009/0284135 A1 | 11/2009 | Yoshida et al. |
| 2009/0284141 A1 | 11/2009 | Sakanoue et al. |
| 2009/0284144 A1 | 11/2009 | Fujioka et al. |
| 2010/0102310 A1 | 4/2010 | Komatsu et al. |
| 2010/0181554 A1 | 7/2010 | Yoshida et al. |
| 2010/0181559 A1 | 7/2010 | Nakatani et al. |
| 2010/0213827 A1 | 8/2010 | Yoshida et al. |
| 2010/0252857 A1 | 10/2010 | Yoshida |
| 2010/0258833 A1 | 10/2010 | Okumoto et al. |
| 2010/0302221 A1 | 12/2010 | Okumoto |
| 2011/0037068 A1 | 2/2011 | Yamazaki et al. |
| 2011/0042703 A1 | 2/2011 | Okumoto et al. |
| 2011/0140091 A1* | 6/2011 | Friend et al. ............ 257/40 |
| 2012/0061656 A1 | 3/2012 | Ohuchi et al. |
| 2012/0132934 A1 | 5/2012 | Ohuchi et al. |
| 2012/0132935 A1 | 5/2012 | Isobe et al. |
| 2012/0178191 A1 | 7/2012 | Sakanoue et al. |

FOREIGN PATENT DOCUMENTS

| | | |
|---|---|---|
| JP | 05-163488 A | 6/1993 |
| JP | 10-162959 A | 6/1998 |
| JP | 2000-133446 A | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 A | 9/2003 |
| JP | 2003-264083 A | 9/2003 |
| JP | 2004-139746 A | 5/2004 |
| JP | 2004-228355 A | 8/2004 |
| JP | 2004-234901 A | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 A | 7/2005 |
| JP | 2005-203340 A | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 A | 6/2008 |
| JP | 2008-177557 A | 7/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| WO | 2008/120714 A1 | 10/2008 |
| WO | 2008/149498 A1 | 12/2008 |
| WO | 2008/149499 A1 | 12/2008 |
| WO | 2009/107323 | 9/2009 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |
| WO | 2012/017495 A1 | 2/2012 |
| WO | 2012/017502 A1 | 2/2012 |
| WO | 2012/017503 A1 | 2/2012 |

OTHER PUBLICATIONS

United States Office Action in U.S. Appl. No. 13/742,593, dated Apr. 3, 2014.

United States Office Action in U.S. Appl. No. 13/746,485, dated Apr. 25, 2014.

Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).

Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.

Jingze Li et al., "Enhanced performance of organic light emitting device by insertion of conducting/insulating WO3 anodic buffer layer", Syntetic Metals 151, pp. 141-146 (2005).

(56) References Cited

OTHER PUBLICATIONS

Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.
Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.
Min Jung Son et al., "Interface electronic structures of organic light-emitting diodes with WO3 interlayer: A study by photoelectron spectroscopy", Organic Electronics 10, pp. 637-642 (2009).
Kaname Kanai et al., "Electronic structure of anode interface with molybdenum oxide buffer layer", Organic Electronics 11, pp. 188-194 (2010).
F. Bussolotti et al, "Surface electronic properties of polycrystalline WO3 thin films: a study by core level and valence band photoemission", Surface Science 538, pp. 113-123 (2003).
Qin-Ye Bao et al., "Interfacial electronic structures of WO3-based intermediate connectors in tandem organic light-emitting diodes", Organic Electronics 11, pp. 1578-1583 (2010).
Th. Kugler et al., "Polymer band alignment at the interface with indium tin oxide: consequences for light emitting devices", Chemical Physics Letters 310, pp. 391-396 (1999).
I. N. Yakovkin et al., "Driving force for the WO3(001) surface relaxation", Surface Science 601, pp. 1481-1488 (2007).
J. B. Pedley et al., "Thermochemical Data for Gaseous Monoxides", Journal of Physical and Chemical Reference Data. vol. 12, No. 4, pp. 967-1032 (1983).
M. Stolze et al., "Nature of substoichiometry in reactively DC-sputtered tungsten oxide thin films and its effect on the maximum obtainable colouration by gases", Thin Solid Films 409, pp. 254-264 (2002).
V. Bulovic et al., "Transparent light-emitting devices", Nature, vol. 380, p. 29 (1996).
United States Office Action in U.S. Appl. No. 13/298,528, dated Jan. 11, 2013.
United States Office Action in U.S. Appl. No. 13/298,528, dated May 17, 2013.
Japan Office Action in Japanese Patent Application No. 2009-189658, dated Apr. 8, 2013.
Stella Tsuushin (Stella communication), Stella Corporation, undated, available at http://www.stellacorp.co.jp/media/conference#past/0902sorst.html, accessed on Apr. 8, 2013, together with a partial English language translation.
L. Chkoda et al., "Work function of ITO substrates and band-offsets at the TPD/ITO interface determined by photoelectron spectroscopy", Synthetic metals 111-112, pp. 315-319 (2000).
U.S. Appl. No. 13/298,528 to Satoru Ohuchi et al., filed Nov. 27, 2011.
U.S. Appl. No. 13/739,363 to Seiji Nishiyama et al., filed Jan. 11, 2013.
U.S. Appl. No. 13/746,485 to Kenji Harada et al., filed Jan. 22, 2013.
U.S. Appl. No. 13/742,593 to Kenji Harada et al., filed Jan. 16, 2013.
U.S. Appl. No. 13/995,205 to Takahiro Komatsu et al., filed Jun. 18, 2013.
International Search Report in PCT/JP2010/004471, dated Oct. 5, 2010.
International Search Report in PCT/JP2010/004987, dated Sep. 7, 2010.
International Search Report in PCT/JP2010/004993, dated Sep. 7, 2010.
International Search Report in PCT/JP2010/004989, dated Sep. 7, 2010.
International Search Report in PCT/JP2011/000324, dated Feb. 22, 2011.
International Search Report in PCT/JP2012/000288, dated Apr. 17, 2012.
United States Office Action in U.S. Appl. No. 13/739,363, dated Aug. 1, 2014.
United States Office Action in U.S. Appl. No. 13/746,485, dated Aug. 4, 2014.
United States Office Action in U.S. Appl. No. 13/742,593, dated Aug. 6, 2014.
China Office Action from State Intellectual Property Office (SIPO) in Chinese Patent Application No. 201080019186.5, dated Apr. 3, 2014, together with a partial English language translation.
Dinesh Kabra et al., "High Efficiency Composite Metal Oxide-Polymer Electroluminescent Devices: A Morphological and Material Based Investigation", Advanced Materials, vol. 20, Issue 18, pp. 3447-3452 (2008).
United States Office Action in U.S. Appl. No. 13/298,528, dated Jan. 14, 2014.
United States Interview Summary in U.S. Appl. No. 13/742,593, dated Jun. 4, 2014.
United States Notice of Allowance in U.S. Appl. No. 13/995,205, dated May 13, 2014.

* cited by examiner

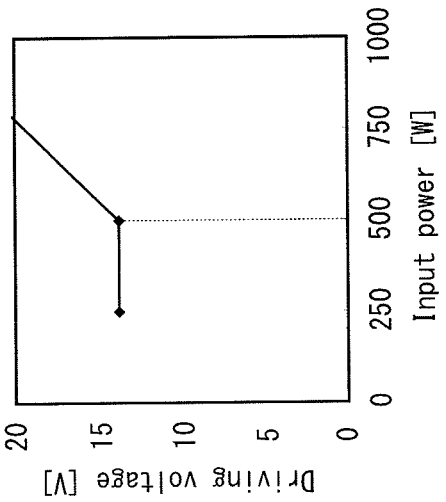
FIG. 3A Dependence on total pressure
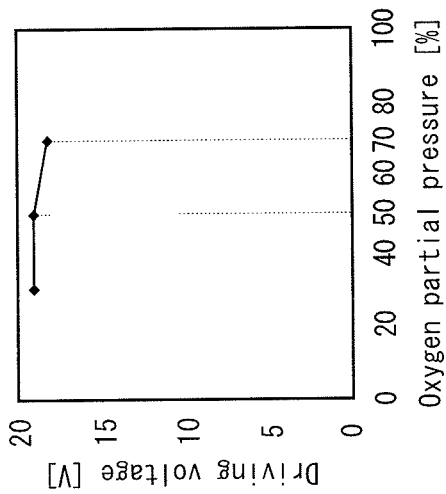
FIG. 3B Dependence on oxygen partial pressure
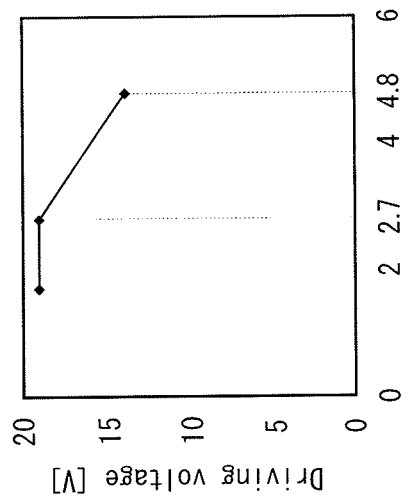
FIG. 3C Dependence on input power (A: a case where an appropriate number of injection sites exists in the tungsten oxide layer)

(B, C: a case where there are no injection sites in the tungsten oxide layer and a case where there is a shortage of injection sites in the tungsten oxide layer)

◯ :Tungsten
◯ :Oxygen

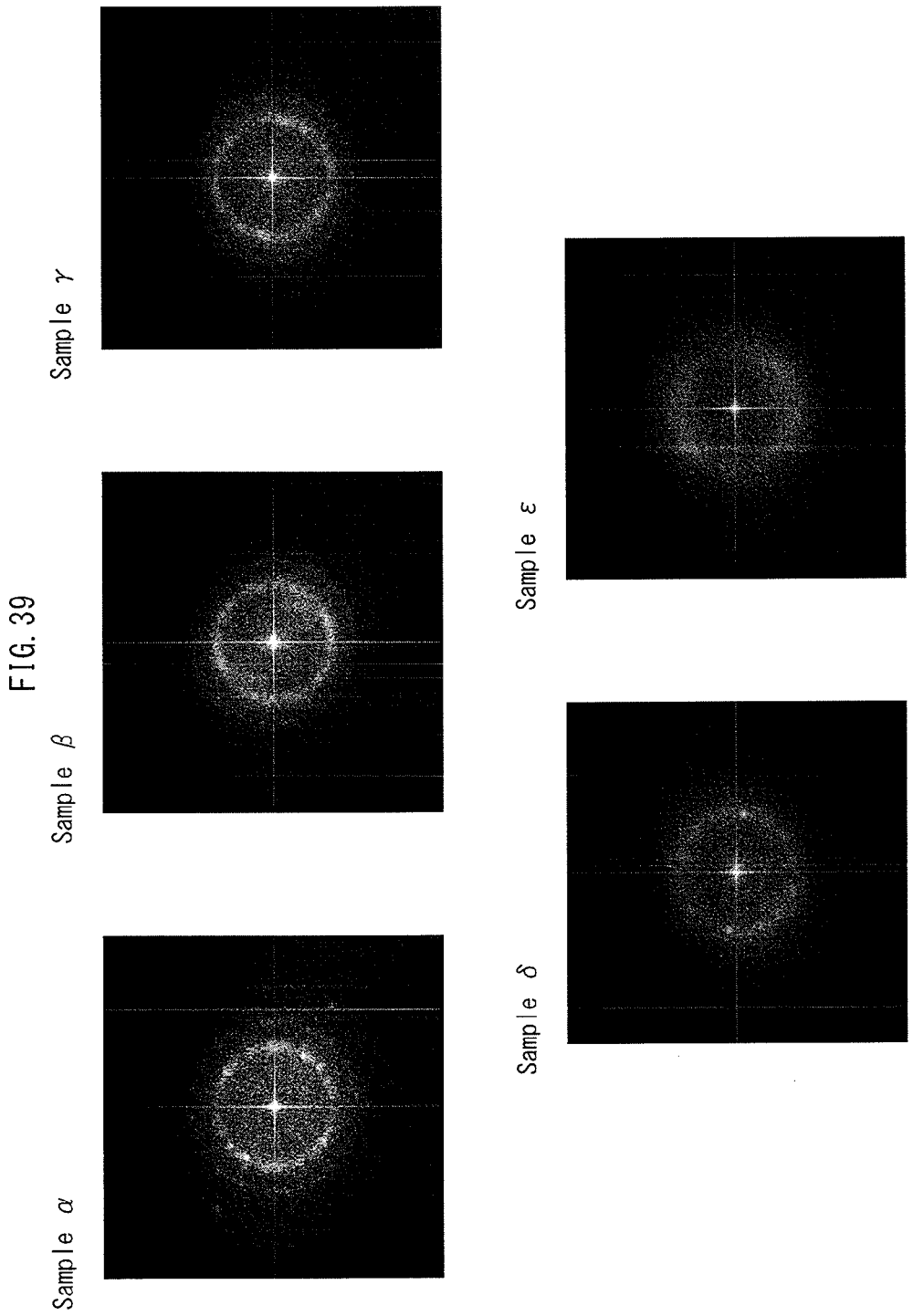

FIG. 41
Sample α
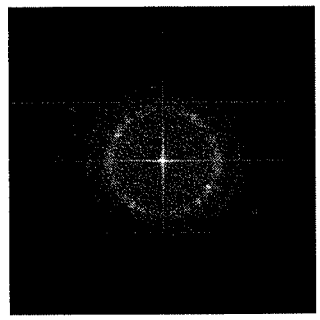 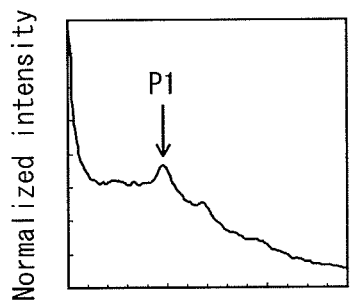
Sample β
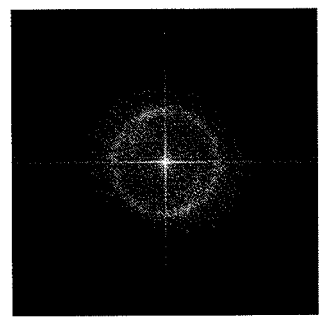 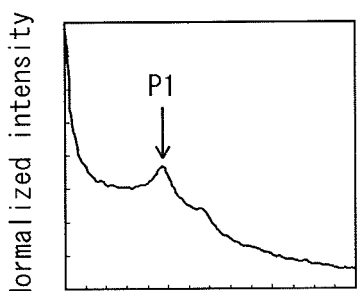
Sample γ
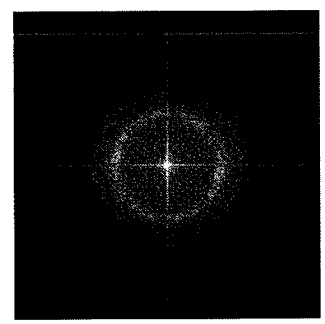 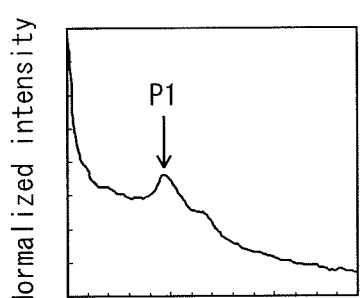

FIG. 42
Sample δ
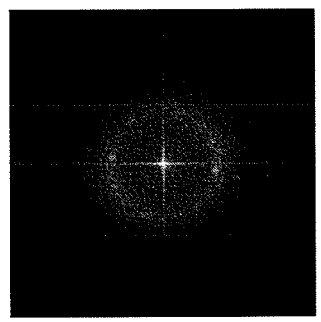 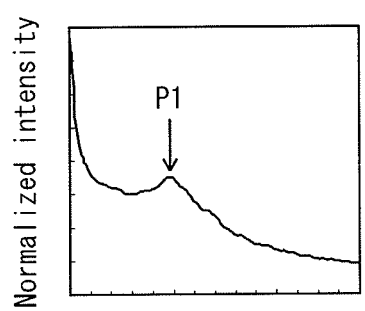
Sample ε
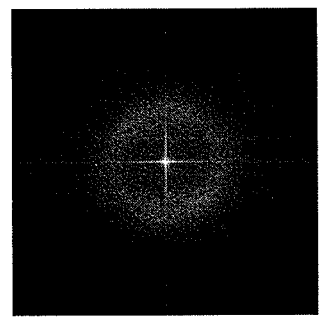 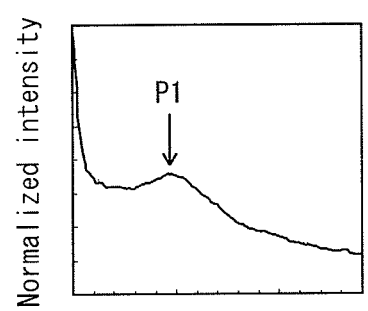

ORGANIC EL ELEMENT

TECHNICAL FIELD

The present invention relates to an organic electric-field light-emitting element (referred to hereinafter as an "organic EL element"), which is an electric light emitter. Particularly, the present invention relates to a technology for driving such an organic EL element at low electricity while ensuring a wide range of luminous intensity from low luminous intensity to high luminous intensity for the use as a light source or the like.

BACKGROUND ART

In recent years, progress is being made in research and development of diverse functional elements which involve the use of an organic semiconductor.

Organic EL elements are known as being one of the most common among such functional elements. An organic EL element is an electric current-driven light emitter, and commonly includes a pair of electrodes consisting of an anode and a cathode, and a functional layer containing organic material disposed between the pair of electrodes. The functional layer includes layers such as a light-emitting layer and a buffer layer. Further, there are cases where a hole injection layer is disposed between the functional layer and the anode. The hole injection layer is disposed for injecting holes to the functional layer. The emission of light from the organic EL element is caused by an electric-field light-emitting phenomenon taking place as a result of the recombination of holes which are injected from the anode to the functional layer, and the electrons which are injected from the cathode to the functional layer. Now, more attention is being given to the application of organic EL elements as a light emitter or a light source for various display devices. This owes to the advantageous characteristics of the organic EL element, which include: high visibility resulting from self-luminescence; and excellent shock resistance resulting from the fully solid-state structure thereof.

Organic EL elements can be largely divided into two types, according to the material used for forming the functional layer therein. The first type of organic EL elements is a vapor deposition type. A vapor deposition-type organic EL element has a functional layer that is mainly composed of low molecular organic material and that is formed as a film by applying a vacuum process such as a vapor deposition method. The second type of organic EL elements is an application type. An application-type organic EL element has a functional layer that is mainly composed of either high molecular organic material, or low molecular organic material having an excellent thin film forming property, and that is formed as a film by applying a wet process such as an inkjet method and a gravure printing method.

When comparing the two types of organic EL elements, vapor deposition-type organic EL elements have gained more popularity up to this point, for reasons such as higher light-emitting efficiency of the light-emitting material and longer operating lifetime in comparison with application-type organic EL elements (for instance, refer to Patent Literatures 1 and 2). As a result, vapor deposition-type organic EL elements have already been put into practical use in mobile phone displays, small-sized TVs and the like.

However, although vapor deposition-type organic EL elements may be ideal for use in small-sized organic EL panels, application thereof is extremely difficult, for example, to full-color, large-sized organic EL panels having display sizes of around 100 inches. The difficulty of such an application derives from the technology applied in the manufacturing of a vapor deposition-type organic EL element. For instance, when manufacturing an organic EL panel using vapor deposition-type organic EL elements, a mask vapor deposition method is commonly applied for separately forming light-emitting layers corresponding to each of the colors (for instance R, G, and B) to be displayed on the organic EL panel. However, as the surface area of the organic EL panel to be manufactured becomes larger, it becomes more and more difficult to maintain the precision with which mask position adjustment is performed. This is due to reasons such as the difference in thermal expansion coefficients between the mask and the glass substrate. Hence, the manufacturing of a large-sized display without any deficiencies is extremely difficult when applying vapor deposition-type organic EL elements. One possible countermeasure as to overcome such a problem is using vapor deposition-type organic EL elements having a light-emitting layer formed of a white-colored layer, and further providing color filters of the respective colors R, G, and B. This excludes the need for the separate application of colors, but however, such a countermeasure has a shortcoming as well. In specific, when taking such a countermeasure, the amount of light which can be actually used is a mere third of the amount of light emitted from the entire light-emitting layer, and thus, more electricity will be consumed, in principle.

As such, attempts are being made to realize the manufacturing of larger organic EL panels by using application-type organic EL elements. As already described in the above, a functional layer is formed by applying a wet process in an application-type organic EL element. In the application of the wet process, the precision with which the application of functional layer material of the respective colors to corresponding positions on the substrate is performed is not influenced by the size of the substrate. Hence, the technical barrier to be overcome in realizing the manufacturing of larger organic EL panels is not as high as in the case of vapor deposition-type organic EL elements.

At the same time, much effort is also being made in research and development of technology for enhancing the light-emitting efficiency of organic EL elements. Efficient injection of carriers (holes and electrons) from the electrodes to the functional layer is essential in causing an organic EL element to emit light with high efficiency, high luminous intensity, and low electrical consumption. Generally, provision of an injection layer in between each of the electrodes and the functional layer is effective in realizing efficient injection of carriers to the functional layer. This is since an injection layer has the function of lowering the energy barrier (injection barrier) to be overcome in the injection of carriers. As a hole injection layer, the following films are commonly used: a vapor deposition film of an organic low molecule such as copper phthalocyanine (CuPc); an application film of solution of an organic high molecule such as PEDOT:PSS; and a vapor deposition film or a sputtered film of inorganic material such as molybdenum oxide. Among such hole injection layers, it has been reported that a vapor deposition film composed of molybdenum oxide contributes to the improvement of hole injection efficiency, as well as to the longevity of the organic EL element (for instance, refer to Patent Literature 3). The hole injection layer is formed on the surface on an anode composed of a tarnsparend conductive film of ITO (Indium Tin Oxide), IZO, or the like, a metal film of aluminum or the like, or these films which are layered one on top of the other.

CITATION LIST

Patent Literature

Patent Literature 1: Japanese Patent Publication No. 3369615
Patent Literature 2: Japanese Patent Publication No. 3789991
Patent Literature 3: Japanese Patent Application Publication No. 2005-203339

Non-Patent Literature

Non-Patent Literature 1: Th. Kugler et al., Chemical Physics Letters 310, 391 (1999).
Non-Patent Literature 2: Jingze Li et al., Synthetic Metals 151, 141 (2005).
Non-Patent Literature 3: Hiromi Watanabe et al., Yuki EL Tohronkai Dai 7 Kai Reikai Yokoushuu, 17 (2008).
Non-Patent Literature 4: Hyunbok Lee et al., Applied Physics Letters 93, 043308 (2008).
Non-Patent Literature 5: Yasuo Nakayama et al., Yuki EL Tohronkai Dai 7 Kai Reikai Yokoushuu, 5 (2008).
Non-Patent Literature 6: Kaname Kanai et al., Organic Electronics 11, 188 (2010).
Non-Patent Literature 7: I. N. Yakovkin et al., Surface Science 601, 1481 (2007).

Summary of Invention

Technical Problem

However, despite such advantages as described above of application-type organic EL elements, problems to be overcome similarly exist, especially in the manufacturing thereof.

The first problem is described. It is commonly known that, a problem of the hole injection efficiency occurs in the case where an anode of ITO or the like and a functional layer are directly layered one on top of the other without disposing a hole injection layer, or in the case where an organic low molecule such as copper phthalocyanine is evaporated, as a hole injection layer, on the anode of ITO or the like. Specifically, in the above case, the work function of the anode varies depending on the surface conditions of the anode (such as the oxidation degree, and the absorption degree of impurities and gas molecule). As a result, the hole injection barrier between the anode and either the functional layer or a low molecular organic layer greatly varies depending on the surface conditions of the anode. Accordingly, in order to achieve a stable hole injection efficiency from the anode, control is required to be performed to maintain the surface conditions of the anode constant. However, since the anode is exposed to various processes and environments in the manufacturing of large-sized organic EL panels, it is difficult to stably maintain the surface conditions constant under such circumstances.

Next, the second problem is described. The following report has been made on the hole injection efficiency (see Non-Patent Literature 1). Specifically, in the case where an organic high molecule such as PEDOT:PSS is formed as a hole injection layer on an anode of ITO or the like in an application process, excellent hole injection efficiency from the anode is achieved. This is because PEDOT:PSS is one kind of conductive material, and therefore can form ohmic contact with the anode with no great influence from the surface conditions of the anode. However, a problem of the hole injection efficiency inevitably occurs, which is similar to the first problem. Specifically, in the application process, an organic high molecule is dissolved in solvent to create ink for application, and this necessitates to maintain excellent wettability between the anode and the ink. After all, control is required to be performed on the surface conditions of the anode in order to ensure the wettability. As a result, the second problem inevitably occurs, which is similar to the first problem, as described above.

The decrease in production efficiency is caused by such control to stably maintain the surface conditions of the anode constant, and accordingly improvement in production efficiency has been demanded.

Note that the above problems might occur commonly in both application-type organic EL elements and vapor deposition-type organic EL elements.

In view of such problems, the present invention provides an organic EL element having a hole injection layer which can exhibit excellent hole injection efficiency and which, at the same time, is able to withstand processing performed during mass production of organic EL panels.

In other words, the present invention provides, as the first aim, an organic EL element that promises high hole injection efficiency and excellent driving at a low voltage due to reduction of the respective hole injection barriers at the interface between an anode and a hole injection layer and the interface between the hole injection layer and a functional layer.

Also, the present invention provides, as the second aim, an organic EL element in which high hole injection efficiency from an anode to a hole injection layer is maintained during mass production of organic EL panels.

Solution to Problem

In order to solve the above problem, one aspect of the present invention provides an organic EL element, comprising: an anode; a functional layer containing an organic material; and a hole injection layer for injecting holes to the functional layer, the hole injection layer being between the anode and the functional layer and in contact with the anode, wherein the hole injection layer comprises tungsten oxide, is at least 2 nm thick, and includes an occupied energy level that is 1.8 electron volts (eV) to 3.6 electron volts lower than a lowest energy level of a valence band of the hole injection layer in terms of a binding energy, and the occupied energy level at an interface between the hole injection layer and the anode is approximately equal to an energy level of a Fermi level of the anode in terms of the binding energy.

Advantageous Effects of Invention

According to the organic EL element that is one aspect of the present invention, the hole injection layer comprises tungsten oxide, and is at least 2 nm thick. The hole injection layer includes an occupied energy level that is 1.8 electron volts to 3.6 electron volts lower than a lowest energy level of a valence band of the hole injection layer in terms of a binding energy. According to the organic EL element that is one aspect of the present invention, with use of the occupied energy level of the hole injection layer, it is possible to extremely reduce the hole injection barrier between the Fermi level of the anode and the occupied energy level of the hole injection layer and the hole injection barrier between the occupied energy level of the hole injection layer and the highest occupied molecular orbital (HOMO) of the functional layer. As a result, the organic EL element that is one aspect of the present invention achieves high hole injection efficiency, and realizes driving at a low voltage and promises excellent light-emitting efficiency due to the high hole injection efficiency.

Also, according to the organic EL element that is one aspect of the present invention, with no special strict adjustment or maintenance of the surface conditions of the anode, it is possible to stably reduce the hole injection barrier between the anode and the hole injection layer during normal manufacturing process. Accordingly, manufacturing of organic EL elements having stable performance requires no high control on the surface conditions of the anode. Therefore, the organic EL element that is one aspect of the present invention facilitates manufacturing of large-sized organic EL panels at comparatively low costs, and is excellent in feasibility.

BRIEF DESCRIPTION OF DRAWINGS

FIGS. 3A through 3C are graphs illustrating a dependence of driving voltage of hole-only devices on film forming conditions of a hole injection layer.

FIG. 39 shows 2D Fourier transform images for the TEM photographs shown in FIG. 38.

FIG. 41 shows 2D Fourier transform images and plots of change in luminance for samples α, β, and γ.

FIG. 42 shows 2D Fourier transform images and plots of change in luminance for samples δ and ε.

DESCRIPTION OF EMBODIMENTS

Figure 1:
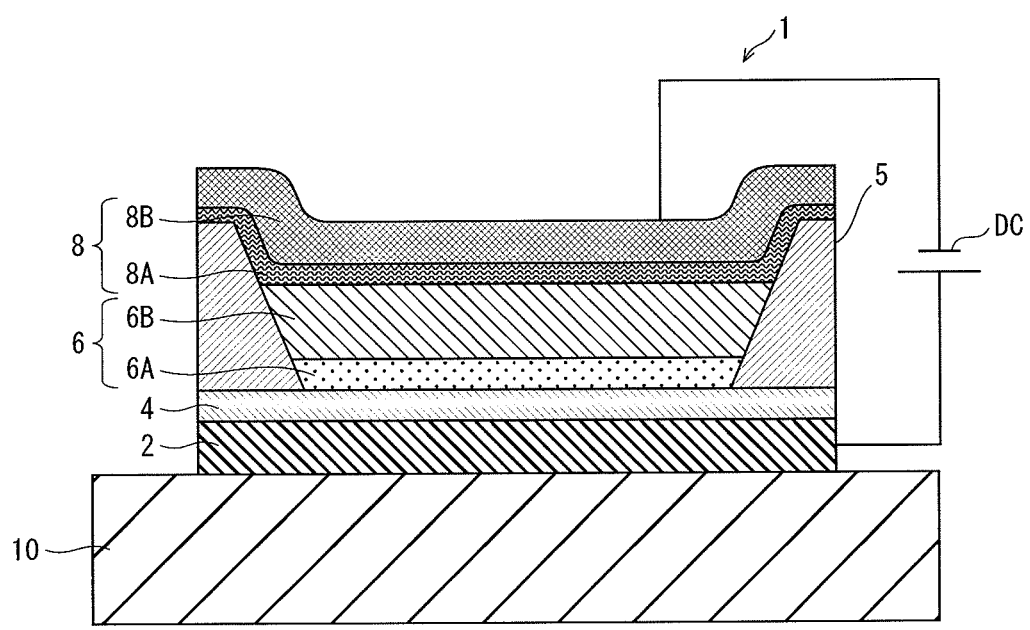
FIG. 1 is a schematic cross-sectional view illustrating a structure of an organic EL element pertaining to Embodiment 1.

One aspect of the present invention provides an organic EL element, comprising: an anode; a functional layer containing an organic material; and a hole injection layer for injecting holes to the functional layer, the hole injection layer being between the anode and the functional layer and in contact with the anode, wherein the hole injection layer comprises tungsten oxide, is at least 2 nm thick, and includes an occupied energy level that is 1.8 electron volts to 3.6 electron volts lower than a lowest energy level of a valence band of the hole injection layer in terms of a binding energy, and the occupied energy level at an interface between the hole injection layer and the anode is approximately equal to an energy level of a Fermi level of the anode in terms of the binding energy.

Since the hole injection layer has the above-described occupied energy level and film thickness, it is possible to reduce at least the hole injection barrier between the anode and the hole injection layer. As a result, during driving of the organic EL element, it is possible to exhibit a high hole injection efficiency from the anode to the hole injection layer, thereby realizing excellent driving at a low voltage and promising excellent light emitting efficiency. Furthermore, since the hole injection layer has the above-described occupied energy level and film thickness, it is possible to maintain a stable hole injection efficiency from the anode to the hole injection layer without depending on the surface conditions of the anode too much.

Here, according to another aspect of the present invention, a gap between the occupied energy level at the interface between the hole injection layer and the anode and the energy level of the Fermi level of the anode may be at most 0.3 electron volts in terms of the binding energy.

With this structure, it is possible to cause the anode and the hole injection layer to excellently form a Schottky ohmic contact therebetween, thereby improving the hole injection efficiency from the anode to the hole injection layer.

Also, an ultraviolet photoelectron spectroscopy spectrum of the hole injection layer may exhibit an upward protrusion that is 1.8 electron volts to 3.6 electron volts lower than the lowest energy level of the valence band in terms of the binding energy, where the ultraviolet photoelectron spectroscopy spectrum expresses a relation between the binding energy and one of photoelectron intensity and normalized intensity of the photoelectron intensity.

Also, according to another aspect of the present invention, an X-ray photoelectron spectroscopy spectrum of the hole injection layer may exhibit an upward protrusion that is 1.8 electron volts to 3.6 electron volts lower than the lowest energy level of the valence band in terms of the binding energy, where the X-ray photoelectron spectroscopy spectrum expresses a relation between the binding energy and one of photoelectron intensity and normalized intensity of the photoelectron intensity.

Also, according to another aspect of the present invention, a differential spectrum obtained by differentiating an ultraviolet photoelectron spectroscopy spectrum of the hole injection layer may have a shape that is expressed by a non-exponential function throughout a range between 2.0 electron volts and 3.2 electron volts lower than the lowest energy level of the valence band in terms of the binding energy, where the ultraviolet photoelectron spectroscopy spectrum expresses a relation between the binding energy and one of photoelectron intensity and normalized intensity of the photoelectron intensity.

Also, according to another aspect of the present invention, the hole injection layer may be in contact with the functional layer, and the occupied energy level at an interface between the hole injection layer and the functional layer may be approximately equal to an energy level of an HOMO of the functional layer in terms of the binding energy.

With this structure, it is possible not only to reduce the hole injection barrier between the anode and the hole injection layer, but also to reduce the hole injection barrier between the hole injection layer and the functional layer. This is even preferable for improvement in the hole injection efficiency.

Also, according to another aspect of the present invention, a gap between the occupied energy level at an interface between the hole injection layer and the functional layer and an energy level of an HOMO of the functional layer may be at most 0.3 electron volts in terms of the binding energy.

With this structure, it is possible to further improve the hole injection efficiency from the hole injection layer to the functional layer.

Also, according to another aspect of the present invention, the hole injection layer may be a metal oxide film, metal atoms constituting the metal oxide include both metal atoms at a maximum valence thereof and metal atoms at a valence less than the maximum valence, and the metal oxide film may include a crystal of the metal oxide, a particle diameter of the crystal being on an order of nanometers.

Also, according to another aspect of the present invention, the metal atoms at the maximum valence may be tungsten atoms with a valence of six, and the metal atoms at the valence less than the maximum valence may be tungsten atoms with a valence of five.

The organic EL element according to one aspect of the present invention has the structure in which the hole injection layer is formed from tungsten oxide, and tungsten atoms constituting the tungsten oxide include both metal atoms with a valence of six that is a maximum valence thereof and metal atoms with a valence less than the maximum valence. As a result, the hole injection layer is provided with regions for the conduction of holes. Additionally, the hole injection layer includes a crystal of tungsten oxide with a particle diameter on the order of nanometers. Therefore, numerous crystal surfaces and grain boundaries provided with abundant regions for hole conduction form in the hole injection layer. As a result, conduction paths for holes can be extended through the hole injection layer in the direction of thickness thereof, thus achieving effective hole conduction at a low voltage. In this context, the "particle diameter on an order of nanometers" refers to a size that is approximately 3 nm to 10 nm and that is smaller than the thickness of the hole injection layer.

Also, according to another aspect of the present invention, a ratio $W^{5+}/W^{6+}$ of the number of the tungsten atoms with a valence of five to the number of the tungsten atoms with a valence of six may be at least 3.2%. This structure achieves even better hole conduction efficiency.

Also, according to another aspect of the present invention, the ratio $W^{5+}/W^{6+}$ may be at least 3.2% and at most 7.4%. This structure achieves even better hole conduction efficiency.

Also, according to another aspect of the present invention, a hard X-ray photoelectron spectroscopy spectrum of the hole injection layer formed from tungsten oxide may include a first component and a second component, the first component corresponding to a $4f_{7/2}$ energy level of the tungsten atoms with a valence of six, and the second component being in a region lower than the first component in terms of the binding energy.

Also, according to another aspect of the present invention, the second component may be in a region between 0.3 electron volts and 1.8 electron volts lower, in terms of the binding energy, than a peak top of the first component.

Also, according to another aspect of the present invention, an area intensity of the second component may be between 3.2% and 7.4% of an area intensity of the first component.

Also, according to another aspect of the present invention, tungsten atoms at a valence less than the maximum valence may cause an electronic state of the hole injection layer formed from tungsten oxide to have an occupied energy level in a range between 1.8 electron volts and 3.6 electron volts lower than a lowest energy level of a valence band in terms of the binding energy.

Also, according to another aspect of the present invention, the hole injection layer formed from tungsten oxide may include a plurality of crystals of the tungsten oxide, each of the crystals having a particle diameter of between 5 nm and 10 nm.

Also, according to another aspect of the present invention, regular linear structures at intervals of between 1.85 angstroms and 5.55 angstroms may appear in a lattice image by transmission electron microscopy observation of the hole injection layer formed from tungsten oxide.

Also, according to another aspect of the present invention, in a 2D Fourier transform image of the lattice image, a bright region formed by concentric circles centering on a center point of the 2D Fourier transform image may appear.

Also, according to another aspect of the present invention, in a plot of distance from the center point versus normalized luminance of luminance of the 2D Fourier transform image at the corresponding distance, at least one peak of the normalized luminance may appear other than the center point.

Also, according to another aspect of the present invention, with a peak width being a difference between the distance corresponding to a position of a peak top of the normalized luminance appearing closest to the center point in the plot and the distance corresponding to a position at which a peak of the normalized luminance begins to rise, the peak width may be less than 22 when the distance corresponding to the peak top is 100.

Also, according to another aspect of the present invention, the functional layer may comprise an amine-containing material.

Also, according to another aspect of the present invention, the functional layer may include at least one of a hole transfer layer that transfers the holes, a light-emitting layer that emits light by recombination of electrons and the holes injected to the functional layer, and a buffer layer that one of adjusts optical characteristics of the organic EL element and blocks electrons.

Also, according to another aspect of the present invention, the occupied energy level may be 2.0 electron volts to 3.2 electron volts lower than the lowest energy level of the valence band in terms of the binding energy.

Also, another aspect of the present invention provides an organic EL element, comprising: an anode; a tungsten oxide layer that is in contact with the anode; a layer that is disposed opposite the anode with the tungsten oxide layer being interposed therebetween, and contains an organic material; and a cathode that is disposed opposite the anode with the layer containing the organic material being interposed therebetween, wherein the tungsten oxide layer is at least 2 nm thick, and includes an occupied energy level that is 1.8 electron volts to 3.6 electron volts lower than a lowest energy level of a valence band of the tungsten oxide layer in terms of a binding energy.

Also, another aspect of the present invention provides a display device comprising the organic EL element.

Alternatively, another aspect of the present invention provides a light-emitting device comprising the organic EL element.

Also, another aspect of the present invention provides a manufacturing method for an organic EL element, comprising: a first step of preparing an anode; a second step of forming a tungsten oxide layer above the anode by introducing a gas comprising an argon gas and an oxygen gas to a chamber of a sputtering device, a total pressure of the gas in the chamber being greater than 2.7 pascals and at most equal to 7.0 pascals, a partial pressure ratio of the oxygen gas with respect to the total pressure of the gas in the chamber being at least 50% and at most 70%, and an input power density per unit surface area of a sputtering target being at least 1 W/cm$^2$ and at most 2.8 W/cm$^2$; a third step of forming a functional layer containing an organic material above the tungsten oxide layer; and a fourth step of forming a cathode above the functional layer, wherein in the second step, the tungsten oxide layer is formed so as to be at least 2 nm thick.

Also, according to another aspect of the present invention, in the second step, the tungsten oxide layer may be formed such that an ultraviolet photoelectron spectroscopy spectrum of the tungsten oxide layer exhibits an upward protrusion that is 1.8 electron volts to 3.6 electron volts lower than a lowest energy level of a valence band of the tungsten oxide layer in terms of the binding energy.

Also, according to another aspect of the present invention, in the second step, the tungsten oxide layer may be formed such that a differential spectrum, obtained by differentiating an ultraviolet photoelectron spectroscopy spectrum of the tungsten oxide layer, has a shape that is expressed by a non-exponential function throughout a range between 2.0 electron volts and 3.2 electron volts lower than a lowest energy level of a valence band of the tungsten oxide layer in terms of the binding energy.

Also, according to another aspect of the present invention, in the second step, a value, yielded by dividing the total pressure of the gas by the input power density, may be larger than 0.7 Pa·cm$^2$/W.

Also, according to another aspect of the present invention, in the second step, the value, yielded by dividing the total pressure of the gas by the input power density, may be smaller than 3.2 Pa·cm$^2$/W.

In the following, description is provided on an organic EL element pertaining to the embodiments of the present invention. Subsequently, results and analysis will be presented for each of the experiments having-been performed to assess the efficiency of the present invention.

It is to be noted that, in each of the accompanying figures, the relation between sizes of each of the members are not illustrated directly reflecting the actual relation.

Embodiment 1

(Structure of Organic EL Element)

FIG. 1 is a schematic cross-sectional view illustrating the structure of an organic EL element 1 pertaining to Embodiment 1.

The organic EL element 1 is an application-type organic EL element, which is characterized in that a functional layer is applied by a wet process in the manufacturing thereof. The organic EL element 1 includes: a hole injection layer 4; various functional layers (a buffer layer 6A and a light-emitting layer 6B, in this case); and a pair of electrodes composed of an anode 2 and a cathode 8. The hole injection layer 4 and the functional layers are disposed one on top of the other, and are disposed between the pair of electrodes. Each of the functional layers contains functional material having a predetermined function.

More specifically, the organic EL element 1 includes, as illustrated in FIG. 1, the anode 2, the hole injection layer 4, the buffer layer 6A, the light-emitting layer 6B, and the cathode 8 (composed of a barium layer 8A and an aluminum layer 8B), which are disposed in the stated order on one main surface of a substrate 10. The anode 2 and the cathode 6 are connected to a power supply DC, and thereby the organic EL element 1 is supplied with power from the outside.

(Substrate)

The substrate 10 is the base material for the organic EL element 1, and may be formed with one of insulating materials such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

While not shown in the figures, TFTs (thin film transistors) are provided on the surface of the substrate 10 for driving the organic EL elements 1.

(Anode)

The anode 2 is a 50 nm-thick transparent conductive film of ITO. Note that the structure of the anode 2 is not limited in this way and may instead be formed from an alloy film, such as a transparent conductive film of IZO or the like; a metal film of aluminum or the like; or an alloy film of APC (alloy of silver, palladium, and copper), ARA (alloy of silver, rubidium, and gold), MoCr (alloy of molybdenum and chromium), NiCr (alloy of nickel and chromium), or the like. Furthermore, a structure may be adopted having a plurality of layers selected from the above films.

(Hole Injection Layer)

The hole injection layer 4 is, for example, formed as a layer of tungsten oxide that is at least 2 nm thick (in the present example, 30 nm). In the composition formula (WOx) denoting the composition of tungsten oxide, x is a real number existing within a range of approximately 2<x<3. A thickness under 2 nm is not desirable, as such a thickness makes it difficult to form the hole injection layer 4 uniformly and to form Schottky ohmic contact between the anode 2 and the hole injection layer 4 which are described below. The above Schottky ohmic contact can be stably formed when the thickness of the tungsten oxide layer is at least 2 nm. Therefore, by forming the hole injection layer 4 to at least this thickness, a stable efficiency of hole injection from the anode 2 to the hole injection layer 4 of the light-emitting cell can be expected.

While it is desirable for the hole injection layer 4 to be formed only from tungsten oxide, the inclusion of a trace level of impurities is acceptable, provided that the amount does not exceed the amount of impurities that might normally be incorporated.

Here, the hole injection layer 4 is formed under specific conditions. It is by forming the hole injection layer under such specific conditions that the hole injection layer is provided, in an electronic state thereof, with an occupied energy level which is 1.8 eV to 3.6 eV lower than the lowest energy level of a valence band of the hole injection layer, in terms of binding energy. Furthermore, the occupied energy level corresponds to the energy level of the highest occupied molecular orbital (HOMO) of the hole injection layer 4. That is, in the electronic state of the hole injection layer 4, the occupied energy level is closest to the Fermi level (Fermi surface) of the hole injection layer 4, in terms of binding energy. As such, the occupied energy level of the hole injection layer is referred to as "the occupied energy level near the Fermi surface" in the following description.

The existence of the occupied energy level near the Fermi surface results in a so-called interface energy level alignment being formed at an interface between the hole injection layer 4 and the functional layer (the buffer layer 6A, in this case). By the interface energy level alignment being formed, the energy level of the HOMO of the buffer layer 6A substantially equals the occupied energy level near the Fermi surface of the hole injection layer 4, in terms of binding energy.

Note that the expressions "substantially equals" and "interface energy level alignment being formed" as referred to here indicate a state where a gap between the lowest occupied energy level near the Fermi surface of the hole injection layer 4 and the lowest energy level of the HOMO of the functional layer, at an interface between the hole injection layer 4 and the buffer layer 6A, is equal to or less than 0.3 eV in terms of binding energy.

Furthermore, the expression "interface" as referred to here denotes an area which includes a surface of the hole injection layer 4 facing the buffer layer 6A, and a portion of the buffer layer 6A which is within 0.3 nm in distance from the surface of the hole injection layer 4 facing the buffer layer 6A.

Concerning the occupied energy level, it is preferable that the occupied energy level near the Fermi surface is provided to all portions of the hole injection layer 4. However, the present invention is not limited to this. Other cases are included within the scope of the present invention, provided that the occupied energy level near the Fermi surface is provided at least at the interface between the hole injection layer 4 and the buffer layer 6A. Note that not all tungsten oxide has such an occupied energy level near the Fermi surface; rather, within the hole injection layer 4 and at the interface with the buffer layer 6A, this particular energy level only forms under predetermined film forming conditions described below.

Additionally, a characteristic of the hole injection layer 4 is the formation of a so-called Schottky ohmic contact at the interface with the anode 2.

The expression "Schottky ohmic contact" as referred to here denotes that the Fermi level of the anode 2 differs from the above-described lowest binding energy of the occupied energy level near the Fermi surface of the hole injection layer 4 by a small amount, specifically ±0.3 eV, at a position that is 2 nm away from the surface of the anode 2 towards the hole injection layer 4. Furthermore, the expression "interface" as referred to here denotes a region that includes a surface of the anode 2 and the Schottky barrier formed on the side of the surface facing the hole injection layer 4.

(Bank)

On the surface of the hole injection layer 4, banks 5 composed of organic material with insulating property (for instance, acrylic resins, polyimide resins, novolac-type phenolic resins and the like) are formed. The banks 5 are disposed such that each of the banks has a uniform trapezoidal cross-section, and such that the banks form either a line bank structure or a pixel bank structure on the surface of the hole injection layer 4. By the provision of the banks 5, the surface of the hole injection layer 4 is divided into a plurality of sections.

Here, it should be noted that the banks 5 are not essential to the present invention, and when an organic EL element 1 is to be used alone, the banks need not be formed.

(Functional Layer)

By the provision of the banks 5, the surface of the hole injection layer 4 is divided into a plurality of sections. At each of the sections on the surface of the hole injection layer 4, a functional layer is formed. The functional layer includes the buffer layer 6A, and a light-emitting layer 6B of a corresponding color among the colors of R, G, and B. When applying the organic EL element 1 to an organic EL panel, a plurality of units (pixels) of organic EL elements 1 are disposed in parallel on the surface of the substrate 10. More specifically, each unit, or pixel, is a series of three organic EL elements 1, and each of the three organic EL elements 1 in a pixel is allocated to a corresponding one of the colors R, G, and B.

(Buffer Layer)

The buffer layer 6A is a 20 nm-thick layer of TFB (poly(9,9-di-n-octylfluorene-alt-(1,4-phenylene-((4-sec-butylphenyl)imino)-1,4-phenylene)), which is an amine-containing organic polymer.

(Light-Emitting Layer)

The light-emitting layer 6B is a 70 nm-thick layer of F8BT (poly(9,9-di-n-octylfluorene-alt-benzothiadiazole)), which is an organic polymer. However, the material to be used in forming the light-emitting layer 6B is not limited to this, and the light-emitting layer 6B may include a commonly-known organic material. Examples of such commonly-known organic material for the light-emitting layers 5 include fluorescent material, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

The functional layer of the present invention is either one of, a combination of more than two of, or all of layers such as a hole transfer layer, a light-emitting layer, and a buffer layer. The hole transfer layer transfers holes, the light-emitting layer emits light as a result of recombination of holes and electrons which are injected thereto, and the buffer layer is used for adjusting optical characteristics of the organic EL element 1 or for blocking electrons. Although the target of the present invention is the hole injection layer, an organic EL element commonly includes layers having each of the functions of the above-described hole transfer layer, light-emitting layer and the like, in addition to the hole injection layer. As such, the expression "functional layer" here refers to all such layers which need to be included in the organic EL element, in addition to the hole injection layer.

(Cathode)

The cathode 8 includes a 5 nm-thick barium layer 8A and a 100 nm-thick aluminum layer 8B, which are disposed one on top of the other.

Note that there are cases where an electron transport layer is disposed between the light-emitting layer 6B and the cathode 8. Also, the barium layer 8A may be regarded as an electron transport layer (or an electron injection layer).

(Effects and Advantages Produced by Organic EL Element)

According to the organic EL element 1 having the above structure, the existence of the occupied energy level near the Fermi surface in the hole injection layer 4 results in a so-called interface energy level alignment being formed at an interface between the occupied energy level near the Fermi surface and the HOMO of the buffer layer 6A. This results in extreme reduction of the hole injection barrier between the hole injection layer 4 and the buffer layer 6A.

Furthermore, according to the organic EL element 1, an excellent Schottky ohmic contact forms between the anode 2 and the hole injection layer 4, and this results in reduction of the hole injection barrier between the anode 2 and the hole injection layer 4, too.

As a result, when voltage is applied to the organic EL element 1 for driving, hole injection is performed comparatively smoothly at a low voltage from the Fermi level of the anode 2 to the occupied energy level near the Fermi surface of the hole injection layer 4, and from the occupied energy level near the Fermi surface to the HOMO of the buffer layer 6A. Accordingly, the organic EL element 1 exhibits high hole injection efficiency. Furthermore, the light-emitting layer 6B exhibits excellent light-emitting characteristics due to recombination of holes and electrons. Specifically, the Fermi level of the anode 2 differs from the lowest binding energy of the occupied energy level near the Fermi surface of the hole injection layer 4 by ±0.3 eV. Also, the lowest binding energy of the occupied energy level of the hole injection layer 4 differs from the lowest binding energy of the HOMO of the buffer layer 6A by ±0.3 eV. As a result, the hole injection efficiency is extremely increased.

Note that, as confirmed in experiments which are described later, a Schottky ohmic contact which is formed between the anode 2 and the hole injection layer 4 has a high stability with no great influence from the extent of the surface conditions of the anode 2 (including the characteristics such as the work function). For this reason, in the manufacturing of the organic EL element 1, it is unnecessary to perform strict control on the surface conditions of the anode 2. This allows manufacturing of the organic EL elements 1 having a high hole injection efficiency or large-sized organic EL panels formed from a number of the organic EL elements 1, at a high yield rate and comparatively low costs.

Note that the expression "surface conditions of anode" as referred to here denotes that the surface conditions of the anode immediately before formation of the hole injection layer in the standard manufacturing process of the organic EL element or the organic EL panel.

Note that there has been a report made of the technology of applying tungsten oxide as the material of the hole injection layer (see Non-Patent Literature 2). However, the hole injection layer as obtained in Non-Patent Literature 2 has an exemplary thickness of approximately 0.5 nm, and the characteristics of the organic EL element depends largely on film thickness. Thus, the hole injection layer of Non-Patent Literature 2 does not exhibit a level of practicality which enables application thereof to the mass production of large-sized organic EL panels. Furthermore, Non-Patent Literature 2 does not suggest forming the occupied energy level near the Fermi surface in the hole injection layer in a constructive manner. Hence, it is concluded that the present invention largely differs from conventional technology. The present invention is characterized in that a predetermined occupied energy level near the Fermi surface is provided to a chemically-stable hole injection layer that is composed of tungsten oxide and that withstands processing during mass production of large-sized organic EL panels. This provides the hole injection layer with excellent hole injection efficiency, and enables the organic EL element to be driven at a low voltage.

In the following, description is provided of an example of a method of manufacturing the entire the organic EL element 1.

(Method of Manufacturing Organic EL Element)

Firstly, the substrate 10 is mounted inside a chamber of a sputtering film-forming device. Then, a predetermined gas is introduced into the chamber, and the 50 nm-thick anode 2 composed of ITO is formed according to the reactive sputtering method.

The forming of the hole injection layer 4 is performed subsequently. Here, it is preferable that the hole injection layer 4 be formed similarly according to the reactive sputtering method. Especially, in a case where the organic EL element of the present invention is to be applied to a large-sized organic EL panel, the hole injection layer needs to be formed over a large area. In such a case, the forming of the hole injection layer according to the vapor deposition method is problematic in that there is a risk that unevenness may be formed in terms of film thickness, etc. The occurrence of such unevenness can be readily prevented by forming the hole injection layer 4 according to the reactive sputtering method.

More specifically, the reactive sputtering method is performed after replacing the previous sputtering target with metal tungsten. Further, argon gas and oxygen gas are respectively introduced into the chamber as the sputtering gas and the reactive gas. Under this condition, the argon in the argon gas is ionized by the application of high voltage, and the ionized argon is caused to bombard the sputtering target. The metal tungsten ejected as a result of the sputtering phenomenon reacts with the oxygen, and produces tungsten oxide. As a result, the "sputtered" tungsten oxide forms a film on the anode 2 of the substrate 10.

Note that in the forming of the hole injection layer 4, it is preferable that the tungsten oxide film be formed under conditions where: (i) gas pressure (total gas pressure) is higher than 2.7 Pa and lower than or equal to 7.0 Pa; (ii) the ratio of oxygen partial pressure to the total gas pressure is higher than or equal to 50% and lower than or equal to 70%; and (iii) input power per unit surface area of the sputtering target (input power density) is higher than or equal to 1 W/cm$^2$ and lower than or equal to 2.8 W/cm$^2$. By forming the hole injection layer 4 under such conditions, the hole injection layer 4 having an occupied energy level which is 1.8 eV to 3.6 eV lower than the lowest energy level of a valence band of the hole injection layer 4, in terms of binding energy, is yielded on at least a surface portion of the hole injection layer 4.

Subsequently, as the material for forming the banks 5, photosensitive resin material or, more preferably, photoresist material containing fluorine material is to be prepared. In order to form the banks 5, first, the bank material so prepared is uniformly applied on the hole injection layer 4. After performing prebaking, a mask having an aperture of a predetermined shape (a pattern of the banks 5 to be formed) is placed over the prebaked bank material. After exposing the bank material to light from over the mask, unhardened, redundant bank material is removed by using a developer. Finally, by performing rinsing with pure water, the banks 5 are yielded.

Here, it should be noted that in Embodiment 1, the hole injection layer 4 is composed of tungsten oxide. Tungsten oxide has resistance with respect to dissolution, decomposition, and degradation by alkaline solutions, water, organic solvents, etc. For this resistance, even when the hole injection layer 4 having been formed falls into contact with such solutions, pure water, etc. in the subsequent bank forming process, damage to the hole injection layer 4, by dissolution, decomposition, degradation and the like, is prevented. Thus, the hole injection layer 4 maintains an appropriate form thereof at the completion of the manufacturing of the organic EL element 1. This too, in addition to the above-described characteristics of the present invention, enables the efficient injection of holes to the buffer layer 6A via the hole injection layer 4, and further enables the organic EL element 1 to be driven at a low voltage.

Following this, the buffer layer 6A is formed by ejecting drops of ink composition containing organic amine-containing molecular material onto a surface of the hole injection layer 4, which is exposed from between adjacent ones of banks 5, and removing the solvent of the ink composition by volatilization. The ejection of ink composition is performed according to a wet process, such as the inkjet method and the gravure printing method.

Following the forming of the buffer layer 6A, drops of ink composition containing organic light-emitting material is ejected onto the surface of the buffer layer 6A, and again, the solvent of the ink composition is removed by volatilization by applying a similar method as in the forming of the buffer layer 6A. Thus, the light-emitting layer 6B is formed.

Here, it should be noted that the method applied for forming the buffer layer 6A and the light-emitting layer 6B is not limited to the above-described method. Other commonly-known methods besides the inkjet method and the gravure printing method may be applied for the ejection/application of ink. Such commonly-known methods include: the dispenser method; the nozzle coating method; the spin coating method; the intaglio printing method; the relief printing method and the like.

Subsequently, the barium layer 8A and the aluminum layer 8B are formed on a surface of the light-emitting layer 6B by applying the vacuum vapor deposition method. Thus, the cathode 8 is formed.

It should be noted that, although not illustrated in FIG. 1, a sealing layer may be additionally provided on the surface of the cathode 8, or a sealing cap may be provided to isolate the entire organic EL element 1 from external space, in order as to prevent atmospheric exposure of the organic EL element 1. The sealing layer may be formed, for instance, by using materials such as SiN (silicon nitride) and SiON (silicon oxynitride), and may be disposed such that the organic EL element 1 is sealed therein. When using a sealing cap to prevent atmospheric exposure of the organic EL element 1, the sealing cap may be formed by using, for instance, the same material as the substrate 10, and a getter which absorbs moisture and the like may be provided within the sealed space formed by the substrate 10 and the sealing cap.

By following the above-provided procedures, the manufacturing of the organic EL element 1 is completed.

<Experiments and Analysis>

(Conditions for Forming Tungsten Oxide Layer)

In Embodiment 1, the tungsten oxide film constituting the hole injection layer 4 is formed under predetermined conditions, thereby providing the hole injection layer 4 with the above-described occupied energy level near the Fermi surface. This reduces the hole injection barrier between the hole injection layer 4 and the buffer layer 6A and allows for driving of the organic EL element 1 at a low voltage.

A method for obtaining a tungsten oxide film having the above-described characteristics employs a DC magnetron sputtering device, with metal tungsten as the sputtering target. The film is formed without controlling substrate temperature, and by introducing argon gas and oxygen gas into the chamber of the sputtering device. It is considered desirable to form the tungsten oxide film with the reactive sputtering method under the following conditions: (1) gas pressure (total gas pressure) is higher than 2.7 Pa and lower than or equal to 7.0 Pa; (2) the ratio of oxygen partial pressure to the total pressure is at least 50% and at most 70%; and (3) the input power per unit surface area of the target (input power density) is at least 1 W/cm$^2$ and at most 2.8 W/cm$^2$.

The effectiveness of such film forming conditions (1) through (3) has been confirmed through the following experiments.

First, hole-only devices were prepared as assessment devices to be used in accurately assessing the dependence of the efficiency of hole injection, from the hole injection layer 4 to the buffer layer 6A, on the film forming conditions.

In an organic EL element, the carriers constituting electric current consist of both holes and electrons. As such, the electrical characteristics of an organic EL element reflect not only hole current, but also electron current. In a hole-only device, however, the injection of electrons from the cathode is blocked, and there is almost no flow of electron current. Therefore, the electrical current consists almost entirely of hole current, and the carriers can be considered almost entirely to be holes. A hole-only device is therefore desirable when assessing hole injection efficiency.

Figure 2:
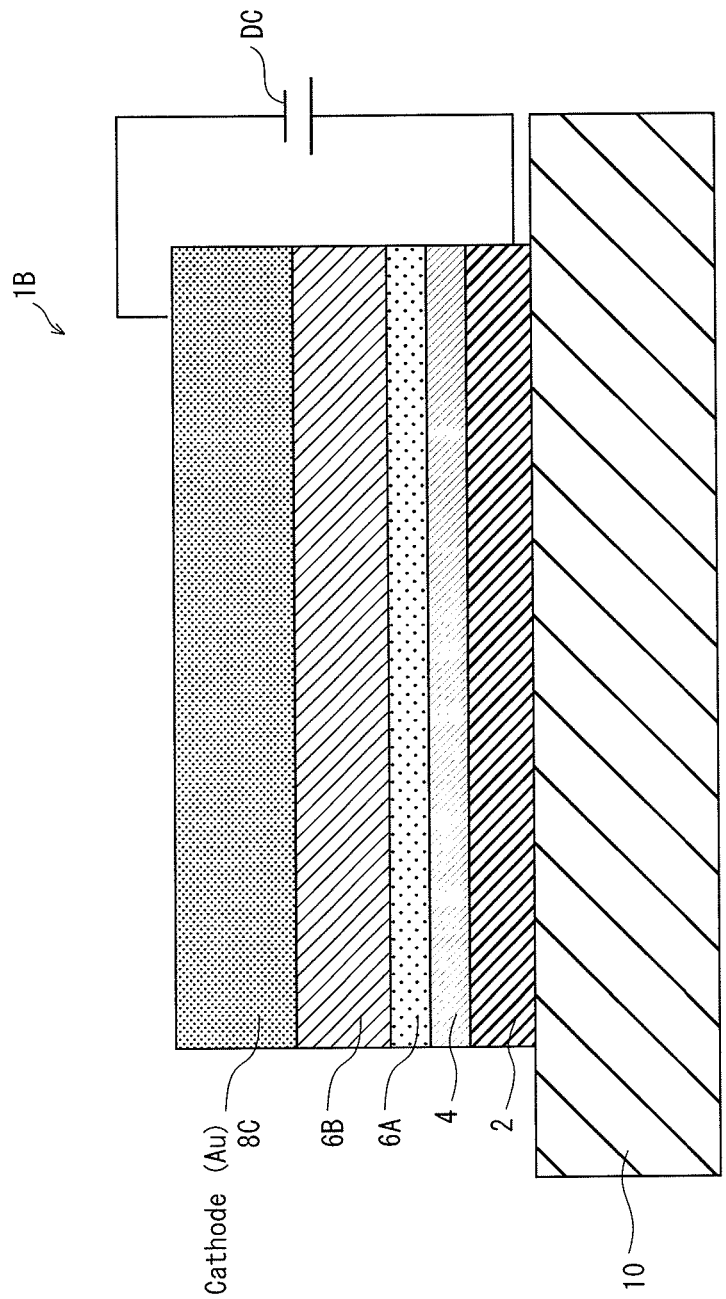
FIG. 2 is a schematic cross-sectional view illustrating a structure of a hole-only device.

In detail, the hole-only devices prepared by the inventors were actually obtained by replacing the cathode 8 of the organic EL element 1 illustrated in FIG. 1 with gold to form a cathode 8C as illustrated in FIG. 2. That is, the inventors obtained the hole-only device illustrated in FIG. 2 by forming a 50 nm-thick anode 2 composed of an ITO thin film on a substrate 10, and further disposing, on the anode 2 so formed, the following layers in the order in which they are introduced: a 30 nm-thick hole injection layer 4 composed of tungsten oxide; a 20 nm-thick buffer layer 6A composed of TFB, which is an organic amine-containing polymer; a 70 nm-thick light-emitting layer 6B composed of F8BT, which is an organic polymer; and a 100 nm-thick cathode 8C composed of gold. Note that, considering that the organic EL elements 1 are assessment devices, the banks 5 were omitted from the structure thereof.

In the manufacturing of the hole-only devices, the hole injection layers 4 were formed by applying the reactive sputtering method with a DC magnetron sputtering device. The gas introduced into the chamber was composed of at least one of argon gas and oxygen gas, and the sputtering target used was metal tungsten. Further, no control was performed regarding substrate temperature, while control of argon partial pressure, oxygen partial pressure, and total gas pressure within the chamber was performed by adjusting the flow amount of the respective gases. Furthermore, in order as to obtain the hole-only devices, changes were made to certain film forming conditions, namely total gas pressure, oxygen partial pressure, and input power, as illustrated in Table 1. As a result, hole-only devices 1B (element Nos. 1 through 14), each having a hole injection layer 4 formed under different film forming conditions, were obtained. Note that, hereinafter, oxygen partial pressure is indicated as a ratio (%) with respect to the total pressure of the gases in the chamber of the sputtering device.

TABLE 1

Film Forming Conditions of Hole-only Devices 1B

| | Device No. | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Oxygen Partial Pressure (%) | 70 | 50 | 100 | 50 | 70 | 100 | 70 | 50 | 100 | 50 | 70 | 30 | 30 | 50 |
| Total Pressure (Pa) | 2.7 | 4.8 | 1.7 | 1.7 | 2.7 | 1.7 | 2.7 | 4.8 | 1.7 | 2.7 | 1.7 | 1.7 | 2.7 | 4.8 |
| Input Power (W) | 500 | 500 | 500 | 500 | 250 | 250 | 1000 | 1000 | 1000 | 500 | 500 | 500 | 500 | 250 |
| T-S (mm) | 113 | 113 | 113 | 113 | 113 | 113 | 113 | 113 | 113 | 113 | 113 | 113 | 113 | 113 |
| Film Forming Rate (nm/s) | 0.164 | 0.14 | 0.111 | 0.181 | 0.057 | | 0.308 | 0.311 | 0.246 | 0.154 | 0.153 | 0.364 | 0.177 | 0.049 |
| Film Thickness (nm) | 30 | 30 | 30 | 30 | 30 | 30 | 30 | 30 | 30 | 30 | 30 | 30 | 30 | 30 |

Table 2 illustrates a relation between input power and input power density of the above-presented DC magnetron sputtering device.

TABLE 2

| Input Power (W) | Input Power Density (W/cm$^2$) |
|---|---|
| 250 | 1.4 |
| 500 | 2.8 |
| 1000 | 5.6 |

The completed hole-only devices 1B were then connected to a direct current power supply DC, and voltage was applied thereto. Furthermore, by changing the applied voltage, an electric current value per unit surface area (electric current density) was calculated for different voltages. Hereinafter, the expression "driving voltage" refers to the voltage applied when the electric current density value is 10 mA/cm².

It can be inferred that as the driving voltage grows smaller, the efficiency of hole injection from the hole injection layer 4 to the buffer layer 6A is higher. This is because the components of each hole-only device 1B other than the hole injection layer 4 are prepared according to the same manufacturing method. Therefore, other than the hole injection layer 4, the hole injection barrier between two adjacent layers can be assumed to be constant. Furthermore, as described below, it was confirmed through another experiment that the cathode 2 and the hole injection layer 4 in this experiment are in Schottky ohmic contact. Accordingly, the differences in driving voltage depending on the conditions for forming the hole injection layer 4 strongly reflect the hole injection efficiency from the hole injection layer 4 to the buffer layer 6A and the hole conduction efficiency of the hole injection layer 4 itself.

It can be assumed that in addition to the hole injection efficiency from the hole injection layer 4 to the buffer layer 6A, the hole conduction efficiency of the hole injection layer 4 also influences the characteristics of the elements in the experiments described in Embodiment 1. The below assessment of energy diagrams, however, also clearly indicates that the hole injection barrier between the hole injection layer 4 and the buffer layer 6A is strongly reflected in the characteristics of the elements.

Embodiment 1 mainly offers an analysis of the hole injection efficiency from the hole injection layer 4 to the buffer layer 6A, whereas Embodiment 2 offers an analysis of hole conduction efficiency of the hole injection layer 4.

Table 3 illustrates the driving voltages obtained through experiments for each hole-only device 1B under various film forming conditions of total pressure, oxygen partial pressure, and input power. Note that the numbers enclosed in circles in Table 3 indicate the device number of each of the hole-only devices 1B.

TABLE 3

Film Forming Conditions and Driving Voltages of the Hole-Only Devices 1B (Applied Voltage Under Current Density of 10 mA/cm²)

| | | Total Pressure | | |
| --- | --- | --- | --- | --- |
| | | 1.7 Pa | 2.7 Pa | 4.8 Pa |
| Oxygen Partial Pressure | 30% | (12) 500 W (unmeasured) | (13) 500 W (19 V) | Film could not be formed |
| | 50% | (4) 500 W (19 V) | (10) 500 W (19 V) | (14) 250 W (13.7 V) (2) 500 W (13.7 V) (8) 1000 W (>20 V) |
| | 70% | (11) 500 W (unmeasured) | (5) 250 W (14.7 V) (1) 500 W (18.2 V) (7) 1000 W (>20 V) | Film could not be formed |
| | 100% | (6) 250 W (unmeasured) (3) 500 W (>20 V) (9) 1000 W (>20 V) | Film could not be formed | Film could not be formed |

Furthermore, FIGS. 3A through 3C are graphs illustrating the dependence of driving voltages of the hole-only devices 1B on the film forming conditions. Each of the points in FIG. 3A indicates, from left to right in the figure, a driving voltage of element Nos. 4, 10, and 2. Similarly, each of the points in FIG. 3B indicates, from left to right in the figure, a driving voltage of element Nos. 13, 10, and 1. Finally, each of the points in FIG. 3C indicates, from left to right in the figure, a driving voltage of element Nos. 14, 2, and 8.

Here, it should be noted that in the following cases, film formation was not successfully performed due to limitations of the sputtering device, such as gas flow amount: total pressure of 2.7 Pa and oxygen partial pressure of 100%, total pressure of 4.8 Pa and oxygen partial pressure of 30%, total pressure of 4.8 Pa and oxygen partial pressure of 70%, and total pressure of 4.8 Pa and oxygen partial pressure ratio of 100%.

First, concerning the dependence of driving voltage on total pressure, when the oxygen partial pressure ratio was set to 50% and the input power was set to 500 W, a clear reduction in driving voltage was observed when the total pressure was set higher than 2.7 Pa and lower than or equal to 4.8 Pa, as illustrated in FIG. 3A. In addition, as a result of a different experiment, it was found that this trend of reduction in driving voltage continues at least until the total pressure is lower than or equal to 7.0 Pa. Taking this into account, it is desirable that total pressure during the forming of the hole injection layer 4 be set higher than 2.7 Pa and lower than or equal to 7.0 Pa.

Next, concerning the dependence of driving voltage on oxygen partial pressure ratio, when the total pressure was set to 2.7 Pa and the input power was set to 500 W, it was observed that driving voltage decreases as oxygen partial pressure ratio increases, at least when the oxygen partial pressure ratio was set higher than or equal to 50% and lower than or equal to 70%, as illustrated in FIG. 3B. However, as a result of a different experiment, it was found that when the oxygen partial pressure ratio exceeds this range, the driving voltage begins to increase adversely. Taking this into account, it is desirable that oxygen partial pressure ratio during the forming of the hole injection layer 4 be set higher than or equal to 50%, while setting an upper limit at approximately 70%.

Finally, concerning the dependence of driving voltage on input power, when total pressure was set to 4.8 Pa and oxygen partial pressure ratio was set to 50%, a rapid increase in driving voltage was observed when the input power exceeded 500 W, as illustrated in FIG. 3C. Taking this into account, it is desirable that input power be restricted to be lower than or equal to 500 W. Here, it should be noted that, when referring to devices Nos. 1 and 3 in Table 3, it could be seen that, even when the input power was set to 500 W, driving voltage increased when the total pressure was set lower than or equal to 2.7 Pa.

Figure 4:
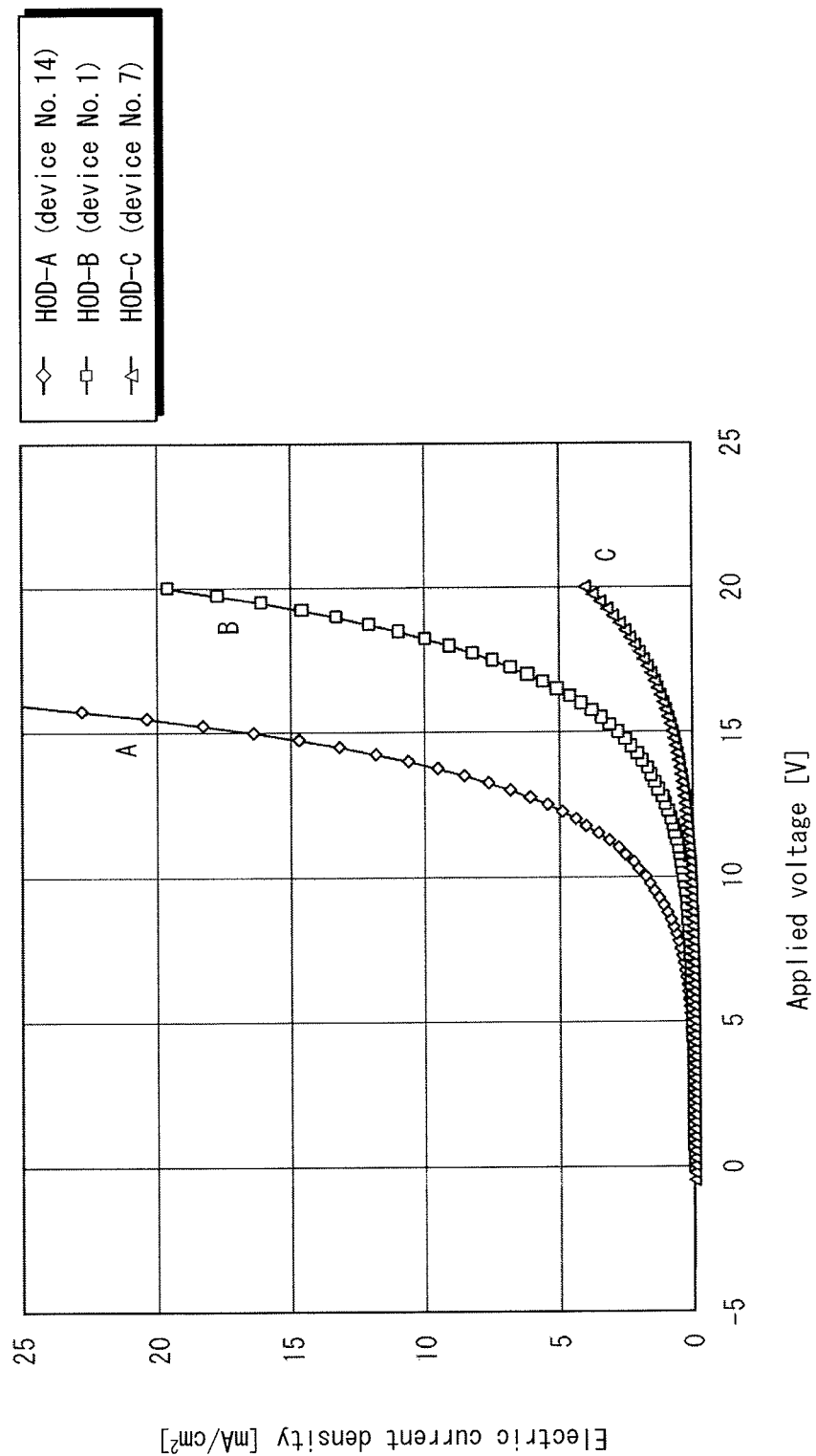
FIG. 4 is a device characteristics diagram showing a relation curve illustrating a relation between applied voltage and electric current density of the hole-only devices.

The subsequent FIG. 4 illustrates an electric current density-applied voltage curve of the hole-only devices 1B, taking devices Nos. 14, 1, and 7 as examples. In FIG. 4, the vertical axis indicates electric current density (mA/cm²), whereas the horizontal axis indicates applied voltage (V). Furthermore, device No. 14 fulfills all desirable film forming conditions explained in the above of total pressure, oxygen partial pressure, and input power, while on the other hand, each of devices Nos. 1 and 7 do not fulfill at least one of the desirable film forming conditions.

Concerning the film forming conditions under which the hole injection layer 4 (and the later-described tungsten oxide layer 12) is formed, in order as to facilitate the explanations to be provided in the following, hereinafter, the film forming conditions under which the hole injection layer 4 was formed in device No. 14 is referred to as film forming conditions A, the film forming conditions under which the hole injection layer 4 was formed in device No. 1 is referred to as film forming conditions B, and the film forming conditions under which the hole injection layer 4 was formed in device No. 7 is referred to as film forming conditions C. In addition, devices Nos. 14, 1, and 7 are respectively illustrated as HOD-A, HOD-B, and HOD-C in FIG. 4.

As illustrated in FIG. 4, the electric current density-applied voltage curve indicating HOD-A indicates that HOD-A has a higher degree of responsiveness to an increase in applied voltage compared with HOD-B and HOD-C. Further, it could be seen that HOD-A requires for the lowest level of applied voltage to reach a high electric current density compared with HOD-B and HOD-C. As a result, as compared to HOD-B and HOD-C, the hole injection efficiency from the hole injection layer 4 to the buffer layer 6A can be inferred to be superior in HOD-A. Here, it should be noted that HOD-A operates at the lowest driving voltage among the hole-only devices 1B.

In the above, observation has been made of the hole injection efficiency from the hole injection layer 4 to the buffer layer 6A in each of the hole-only devices 1B. However, here it should be emphasized that the hole-only devices 1B and the organic EL element 1 have nearly the same structure, differing only in the cathodes included. Therefore, the dependence of the hole injection efficiency from the hole injection layer 4 to the buffer layer 6A on the film forming conditions under which the hole injection layer 4 is formed is basically the same in the organic EL element 1 and in the hole-only devices 1B. In order as to confirm the existence of such a similar dependence on the film forming conditions under which the hole injection layer 4 is formed, the inventors prepared three separate organic EL elements 1, each having a hole injection layer 4 formed under a corresponding one of film forming conditions A, film forming conditions B, and film forming conditions C.

More specifically, the inventors prepared the organic EL elements 1 illustrated in FIG. 1 by forming the 50 nm-thick anode 2 composed of an ITO thin film on the substrate 10, and further disposing, on the anode 2 so formed, the following layers in the order in which they are introduced: a 30 nm-thick hole injection layer 4 composed of tungsten oxide; a 20 nm-thick buffer layer 6A composed of TFB, which is an organic amine-containing polymer; a 70 nm-thick light-emitting layer 6B composed of F8BT, which is an organic polymer; and the cathode 8 composed of a 5 nm-thick barium layer and a 100 nm-thick aluminum layer. Note that, considering that the organic EL elements 1 are assessment devices, the banks 5 were omitted from the structure thereof.

Figure 5:
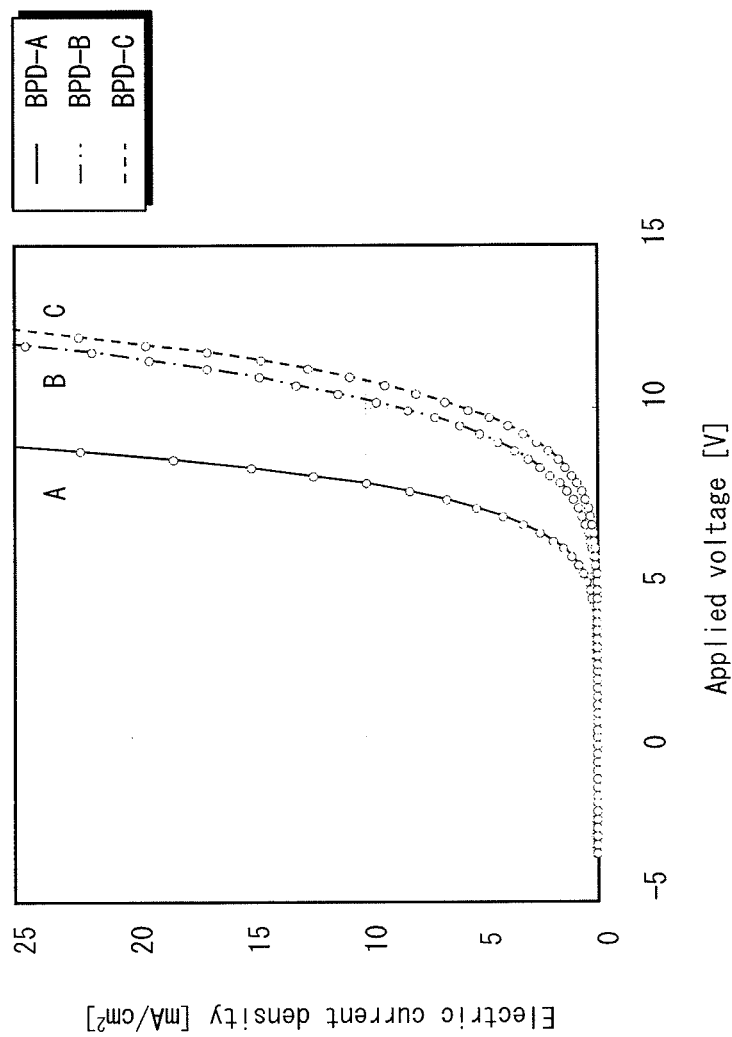
FIG. 5 is a device characteristics diagram showing a relation curve illustrating a relation between applied voltage and electric current density of organic EL elements.

The organic EL elements 1 prepared under film forming conditions A, B, and C were then connected to a direct current power supply DC, and voltage was applied thereto. FIG. 5 is a diagram illustrating the electric current density-applied voltage curve at this point. In FIG. 5, the vertical axis indicates electric current density (mA/cm$^2$), and the horizontal axis indicates applied voltage (V).

Note that, in order as to facilitate the explanations to be made in the following, the organic El elements 1 prepared under film forming conditions A, B, and C are respectively illustrated as BPD-A, BPD-B, and BPD-C in FIG. 5.

As illustrated in FIG. 5, the electric current density-applied voltage curve indicating BPD-A indicates that HOD-A has a higher degree of responsiveness to an increase in applied voltage compared with BPD-B and BPD-C. Further, it could be seen that BPD-A requires for the lowest level of applied voltage to reach a high electric current density compared with BPD-B and BPD-C. This trend is similar to the trend which could be seen in the hole-only devices HOD-A, HOD-B, and HOD-C, which were prepared under the same respective film forming conditions as BPD-A, BPD-B, and BPD-C.

Figure 6:
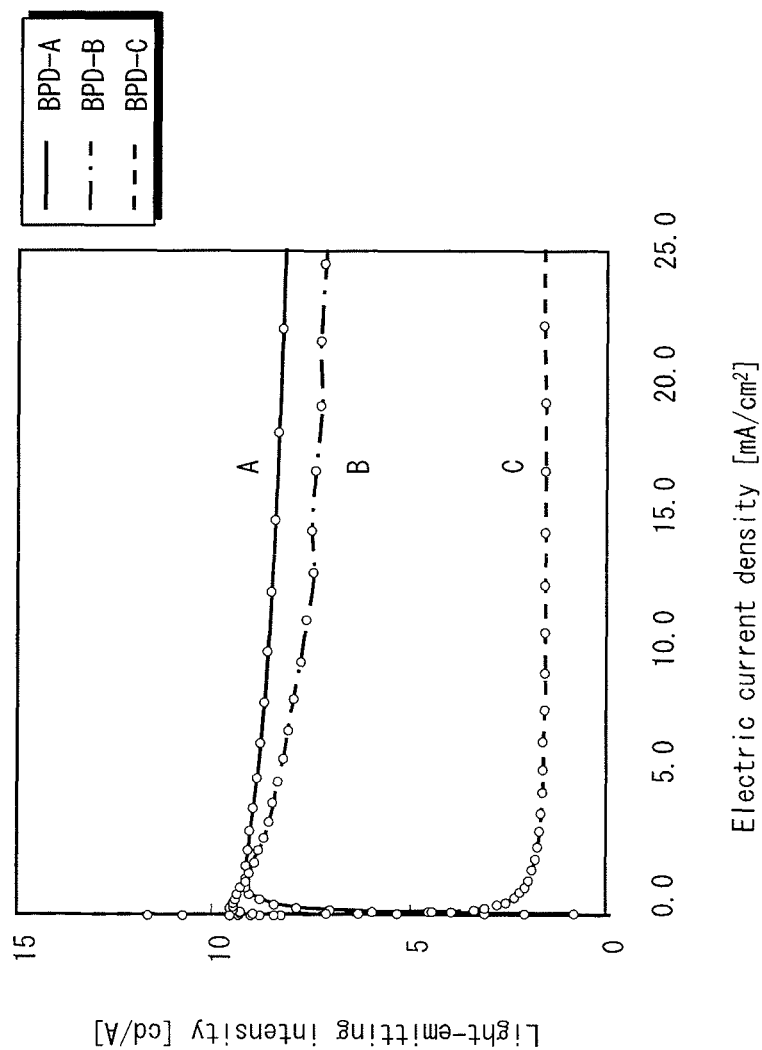
FIG. 6 is a device characteristics diagram showing a relation curve illustrating a relation between electric current density and light-emitting intensity of the organic EL elements.

In addition, FIG. 6 illustrates light-emitting intensity-electric current density curves corresponding to the above organic EL elements 1, each curve indicating the relation between the change in electric current density and the resultant change in light-emitting intensity. In FIG. 6, the vertical axis indicates light-emitting intensity (cd/A), and the horizontal axis indicates electric current density (mA/cm$^2$). FIG. 6 shows that the light-emitting intensity was strongest for BPD-A, at least over the range in which the electric current density was measured.

From the above results, it can be inferred that in the organic EL elements 1, the hole injection efficiency from the hole injection layer 4 to the buffer layer 6A depends on the film forming conditions in the same way as was the case with the hole-only devices 1B. Namely, in the organic EL elements 1 of the present experiment, the tungsten oxide film constituting the hole injection layer 4 was formed using metal tungsten as the sputtering target in a DC magnetron sputtering device, applying the reactive sputtering method without controlling the substrate temperature. The chamber gas was composed of argon gas and oxygen gas, with a total pressure higher than 2.7 Pa and lower than or equal to 7.0 Pa, an oxygen partial pressure ratio to the total pressure of at least 50% and at most 70%, and input power density at least 1 W/cm$^2$ and at most 2.8 W/cm$^2$. Under these conditions, it can be inferred that the hole injection efficiency from the hole injection layer 4 to the buffer layer 6A was good, thereby achieving a superb low driving voltage and high light-emitting efficiency.

Note that among the above conditions, the condition concerning input power is represented in terms of input power density based on Table 2. When using a DC magnetron sputtering device that is different from the DC magnetron sputtering device used in the present experiment, a hole injection layer 4 that achieves an organic EL element one with a superb low driving voltage and high light-emitting efficiency, as in the present experiment, can be yielded by adjusting the input power according to the size of the sputtering target so that the input power density fulfills the above condition. Conditions on total pressure and oxygen partial pressure, on the other hand, are independent of the device and the size of the sputtering target.

Additionally, as already explained above, no intentional adjustment of the substrate temperature was performed while forming the hole injection layer 4 by applying the reactive sputtering method, and during the experiment, the sputtering device was placed under room temperature. Therefore, the substrate was at room temperature at least before the forming of the hole injection layer 4 was performed. However, while the hole injection layer 4 was being formed, there is a possibility that the substrate temperature may have risen by several tens of degrees Celsius.

Furthermore, the organic EL element 1 having the hole injection layer 4 formed under film forming conditions A corresponds to the organic EL element 1 in Embodiment 1, which has the occupied energy level near the Fermi surface. Detailed analysis is to be made regarding this point in the following.

(Electronic State of Hole Injection Layer)

The tungsten oxide constituting the hole injection layer 4 of the organic EL element 1 of Embodiment 1 has the above-described occupied energy level near the Fermi surface. The occupied energy level near the Fermi surface is formed by adjusting the film forming conditions under which the hole injection layer 4 is formed as described above. Details are provided below.

The inventors conducted an experiment to determine whether the occupied energy level near the Fermi surface exists in each of the tungsten oxide films formed under a corresponding one of film forming conditions A, B, and C.

Figure 7:
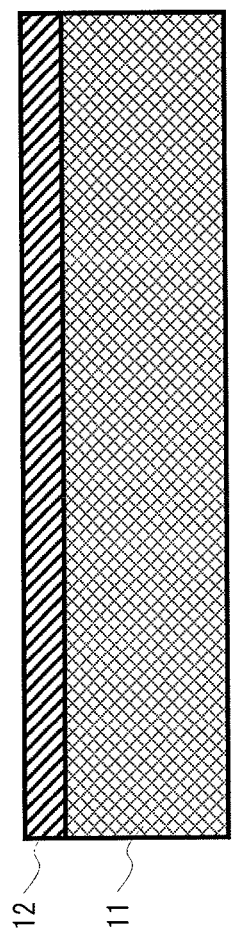
FIG. 7 is a schematic cross-sectional view illustrating a structure of a sample device which is used for photoelectron spectroscopy measurement.

The inventors prepared sample devices for photoelectron spectroscopy measurement under film forming conditions A, B, and C. As illustrated by the sample 1A in FIG. 7, each of the samples was prepared by forming a 10 nm-thick tungsten oxide layer 12 (corresponding to the hole injection layer 4) on a conductive silicon substrate 11 by applying the above-described reactive sputtering method. Hereinafter, a sample 1A formed under film forming conditions A is referred to as sample A, a sample 1A formed under film forming conditions B is referred to as sample B, and a sample 1A formed under film forming conditions C is referred to as sample C.

The forming of the tungsten oxide layer 12 of each of the sample devices was performed inside a sputtering device. Then, to prevent atmospheric exposure, the samples A, B, and C were transported to a glovebox which was connected to the sputtering device and which was filled with nitrogen gas. Subsequently, the sample devices were sealed inside transfer vessels in the glovebox, and were mounted on a photoelectron spectroscopy device. Thus, ultraviolet photoelectron spectroscopy (UPS) measurement of the sample devices was performed while preventing the tungsten oxide layer 12 having been formed on the sample devices from undergoing atmospheric exposure.

In general, a UPS spectrum obtained as a result of the UPS measurement reflects a state of occupied energy levels, such as a valence band and the like, within several nanometers in distance from the surface of the target of measurement. As such, the present experiment was conducted in order as to observe the state of occupied energy levels at a surface portion of the tungsten oxide layer 12 by utilizing UPS measurement.

The conditions under which the UPS measurement was conducted are as follows. Here, it should be noted that, since the samples A, B, and C commonly include the conductive silicon substrate 11, charge-up did not occur during the UPS measurement.

Figure 8:
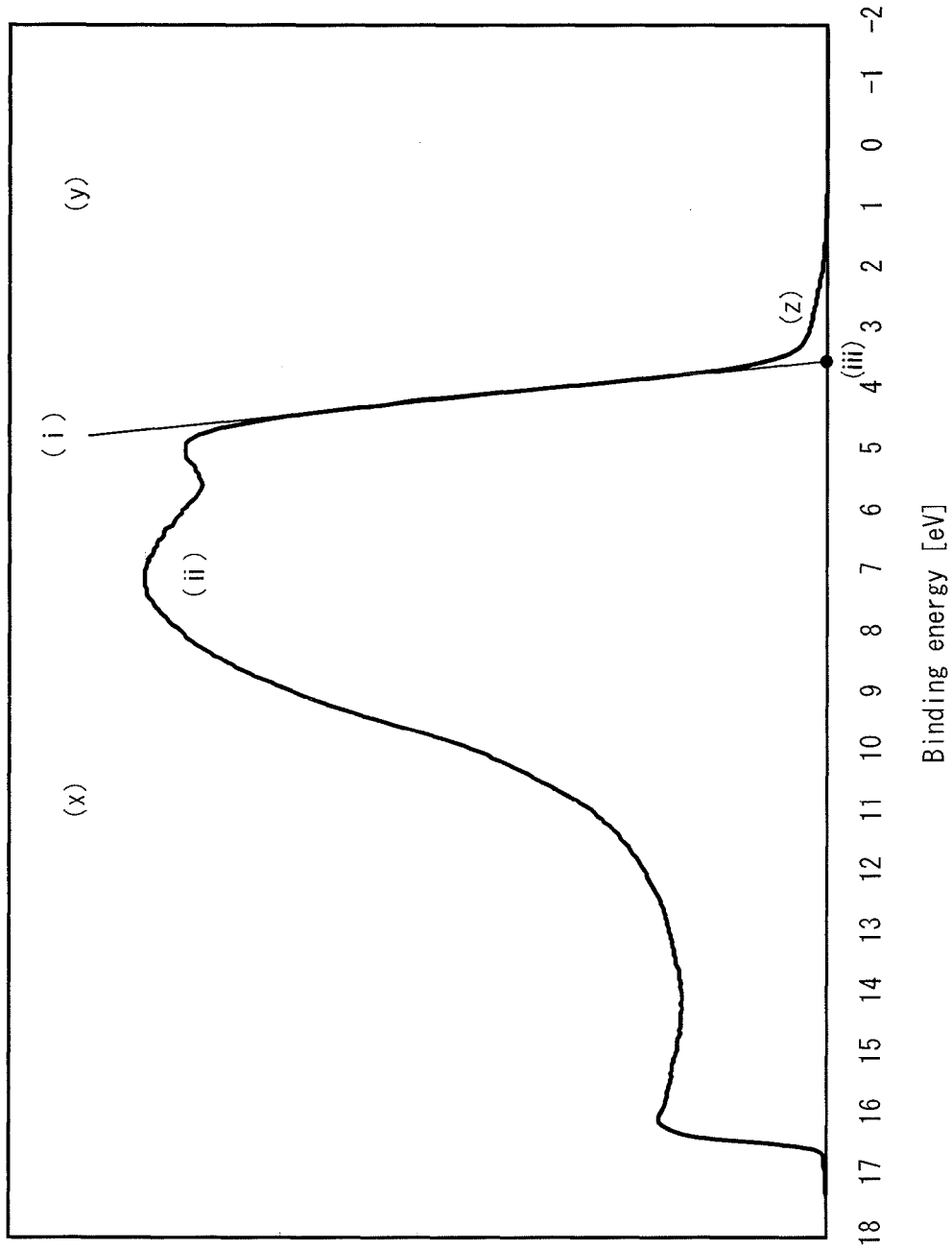
FIG. 8 illustrates a UPS spectrum of a tungsten oxide layer.

Light source: He I line
Bias: None
Electron emission angle: Direction of normal line to the substrate
Interval between measurement points: 0.05 eV FIG. 8 illustrates a UPS spectrum of the tungsten oxide layer 12 of the sample A. The origin of the horizontal axis, which indicates binding energy, corresponds to the Fermi surface of the conductive silicon substrate 11, and the left direction with respect to the origin is positive.

In the following, description is provided on each of the occupied energy levels of the tungsten oxide layer 12 with reference to FIG. 8.

Commonly, a UPS spectrum of tungsten oxide indicates a distinct, rapid rise which can be uniquely distinguished from other areas thereof. Here, a tangential line passing through an inflection point of the above rise is referred to as line (i), and the point at which line (i) intersects the horizontal axis is referred to as point (iii). The UPS spectrum of tungsten oxide can be divided into two areas: area x that extends in the high binding energy direction departing from point (iii); and area y that extends in the low binding energy direction departing from point (iii).

Here, according to Table 4, each of the samples A, B, and C has a tungsten oxide layer 12 whose composition ratio between tungsten atoms and oxygen atoms is approximately 1:3. The composition ratios illustrated in Table 4 were obtained by performing X-ray photoelectron spectroscopy (XPS) measurement. More specifically, XPS measurement of the sample devices was performed by using the photoelectron spectroscopy device while preventing atmospheric exposure of the tungsten oxide layer 12 having been formed on the sample devices, in a similar way as in the UPS measurement. By conducting the XPS measurement, the composition ratio of tungsten to oxygen within several nanometers in distance from the surface of the tungsten oxide layer 12 was estimated for each of the samples A, B, and C. Note that the film forming conditions under which the tungsten oxide layers 12 were formed are also illustrated in Table 4.

TABLE 4

| Sample | Sample A | Sample B | Sample C |
|---|---|---|---|
| Film Forming Conditions | Film forming conditions A | Film forming conditions B | Film forming conditions C |
| Total Pressure (Pa) | 4.8 | 2.7 | 2.7 |
| Oxygen Partial Pressure (%) | 50 | 70 | 70 |
| Input Power (W) | 250 | 500 | 1000 |
| Composition Ratio (oxygen/tungsten) | 3.0 | 2.9 | 2.8 |

Based on the composition ratios, it can be assumed that in each of the samples A, B, and C, the tungsten oxide layer 12, at least within several nanometers in distance from the surface thereof, has an atomic arrangement basically in accordance with tungsten trioxide. That is, in the basic structure of the tungsten oxide layer 12, six oxygen atoms bond with one tungsten atom in octahedral coordination such that octahedrons share oxygen atoms at corners thereof with adjacent octahedrons. Accordingly, the area x in FIG. 8 has either the structure of tungsten trioxide crystal or an amorphous structure in which the crystalline order is disturbed (yet in which bonds are not broken, thus preserving the above basic structure). The area x thus corresponds to a valence band with an occupied energy level deriving from the above basic structure. Note that the inventors have performed X-ray absorption fine structure (XAFS) measurement with respect to the tungsten oxide layer 12 of each of the samples A, B, and C, and have confirmed that the above-mentioned basic structure is formed therein.

Accordingly, the area y in FIG. 8 corresponds to the band gap between the valence band and the conductive band of the tungsten oxide layer 8. Further, it is commonly known that an occupied energy level that differs from the occupied energy level of the valence band may exist in the area y of the tungsten oxide, as is suggested by the UPS spectrum in FIG. 8. The occupied energy level in area y derives from another structure that is different from the above-mentioned basic structure, and is referred to as a so-called band gap energy level (in-gap state or gap state).

Figure 9:
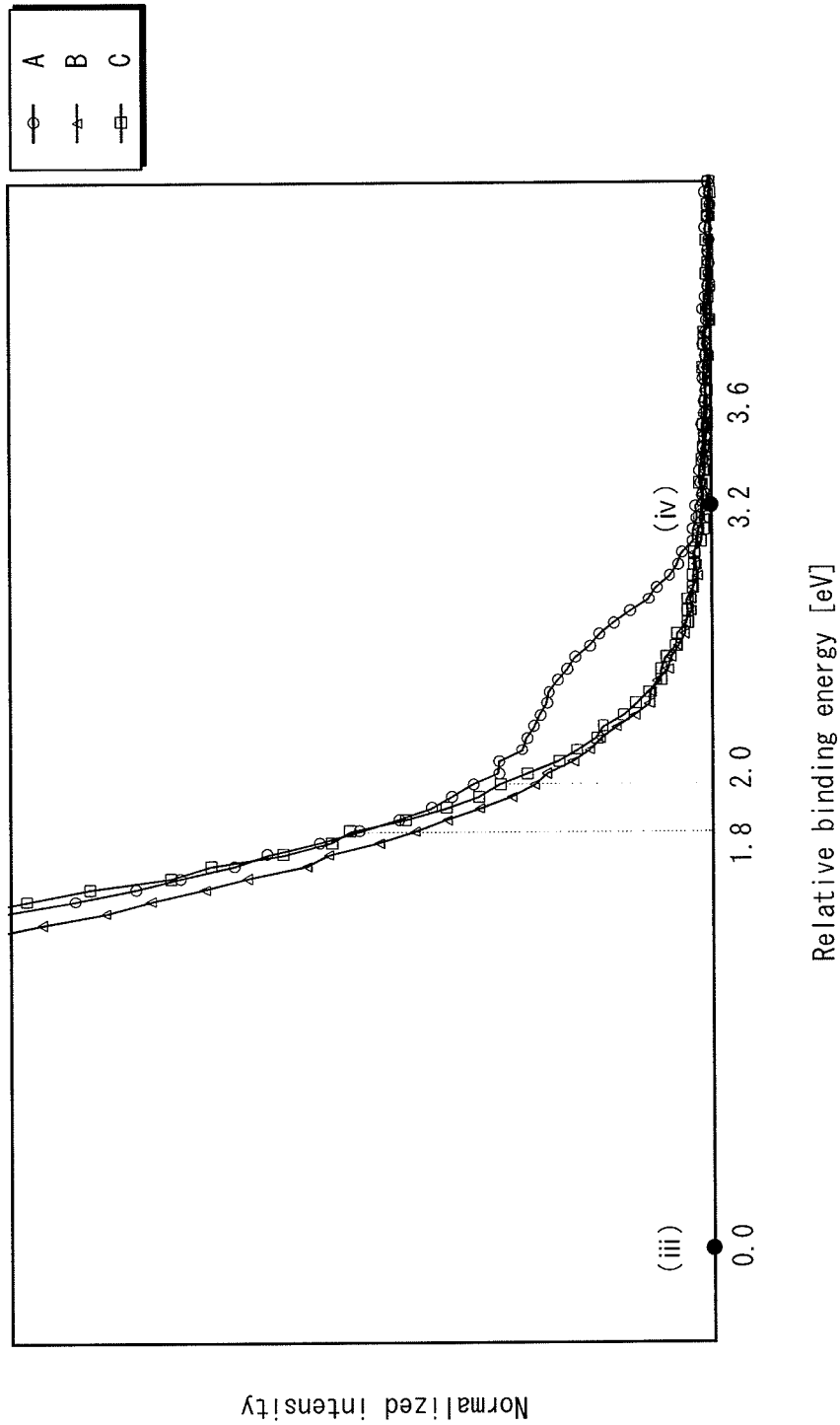
FIG. 9 illustrates UPS spectra of a tungsten oxide layer.

The subsequent FIG. 9 illustrates a UPS spectrum of the tungsten oxide layer 12 of each of the samples A, B, and C, particularly within area y in FIG. 8. The spectrum intensity indicated by the vertical axis in FIG. 9 has been normalized using the peak-top intensity value of a peak (ii) in FIG. 8, which is located approximately 3 eV to 4 eV to the high binding energy direction from point (iii). In addition, note that point (iii) in FIG. 9 is illustrated at the same point on the horizontal axis as in FIG. 8. In FIG. 9, the horizontal axis indicates a relative value (relative binding energy) with respect to point (iii), and the binding energy decreases from left to right.

As illustrated in FIG. 9, the spectrum indicating the tungsten oxide layer 12 of the sample A exhibits a peak in an area between a point which is 3.6 eV lower in terms of binding energy than point (iii) and a point which is 1.8 eV lower in terms of binding energy than point (iii). Point (iv) in FIG. 9 indicates a point at which such a peak in the spectrum indicating the tungsten oxide layer 12 of the sample A is first obviously observed. That is, point (iv) is a point at which the peak begins. The existence of such a peak is not observed in the spectra corresponding to the samples B and C.

For forming the hole injection layer, the present invention thus uses tungsten oxide whose UPS spectrum indicates an upward protrusion (not necessarily in the form of a peak) in an area which is between 1.8 eV and 3.6 eV lower in terms of binding energy than point (iii), thereby endowing the organic EL display element with excellent hole injection efficiency.

Furthermore, it has been found that hole injection efficiency tends to increase when the upward protrusion has a higher degree of sharpness. Therefore, as illustrated in FIG. 9, it can be said that the area that is between 2.0 eV and 3.2 eV lower than point (iii) in terms of binding energy is particularly essential, since the upward protrusion is relatively easier to confirm in this area and has a relatively sharper inclination.

Note that, in the following description, the upward protrusion as observed in the UPS spectrum is referred to as "spectral protrusion near the Fermi surface". Furthermore, the energy level corresponding to this spectral protrusion near the Fermi surface is the "occupied energy level near the Fermi surface", which has been already described in the above.

Subsequently, the inventors performed differentiation on the normalized intensity of the UPS spectrum of each of the samples A, B, and C indicated in FIG. 9. The differentiation was performed for the purpose of making the spectral protrusion near the Fermi surface more distinguishable.

In specific, by using the graph analysis software IGOR Pro 6.0, binomial smoothing (where smoothing factor was set to 1) was conducted eleven times with respect to the UPS spectra illustrated in FIG. 9, and differentiation was subsequently performed applying the central difference method. Such processing of data was conducted so as to remove fluctuation factors such as background noise generated during the UPS measurement, to smoothen the differential curves, and to convey the arguments presented in the following in a clear manner as possible.

Figure 10:
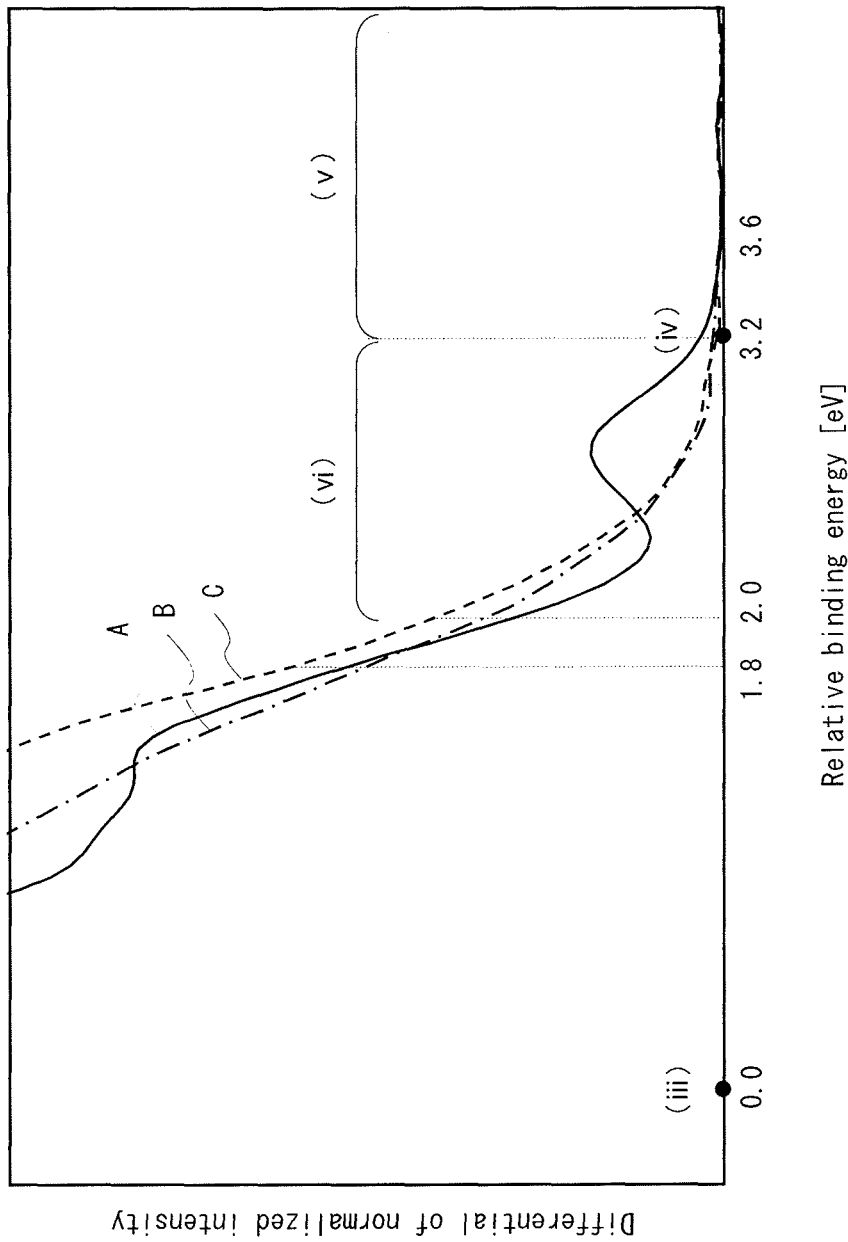
FIG. 10 illustrates differential curves corresponding to the respective UPS spectra illustrated in FIG. 9.

FIG. 10 illustrates differential curves yielded as a result of the above processing. Points (iii) and (iv) in FIG. 10 are provided at the same points on the horizontal axis as the respective points (iii) and (iv) in FIG. 9.

According to the differential curves illustrated in FIG. 10, the derivatives of normalized intensities of the tungsten oxide layers 12 corresponding to the samples B and C do not depart from the vicinity of "0" within an area (v). Area (v) indicates an area which extends from a point which indicates a minimal binding energy that can be measured by using the photoelectron spectroscopy device to point (iv). Furthermore, in an area (vi) extending approximately 1.2 eV in the high binding energy direction from point (iv), the derivatives corresponding to the samples B and C exhibit only a slight increase as approaching the high binding energy direction, although increase is seen in the increase rates thereof. In addition, the shapes of the differential curves corresponding to the samples B and C within areas (v) and (vi) turn out to exhibit similarity with the respective UPS spectra illustrated in FIG. 9, from which the differential curves of FIG. 10 have been derived. Therefore, it can be said that the shapes of the UPS spectrum and the differential curve derived therefrom of each of the samples B and C within areas (v) and (vi) resemble the shape of an exponential function curve.

On the other hand, for the tungsten oxide layer 12 of the sample A, the differential curve exhibits a rapid rise from the vicinity of point (iv) towards the direction of higher binding energy. Thus, the shape of the differential curve within the areas (v) and (vi) clearly differs from the shape of an exponential function curve. Similarly, in FIG. 9, the spectrum for the sample A from which FIG. 10 is derived begins to protrude in the vicinity of point (iv). At the same time, it is clear that the spectrum in FIG. 9 exhibits a spectral protrusion near the Fermi surface differing from the shape of an exponential function curve.

In other words, the sample A is characterized in that an occupied energy level near the Fermi surface is found in an area which is approximately 1.8 eV to 3.6 eV lower than the lowest binding energy of the valence band. In particular, a spectral protrusion near the Fermi surface corresponding to the occupied energy level near the Fermi surface can be clearly seen in the UPS spectrum in an area that is approximately between 2.0 eV and 3.2 eV lower than the lowest binding energy of the valence band.

Figure 11:
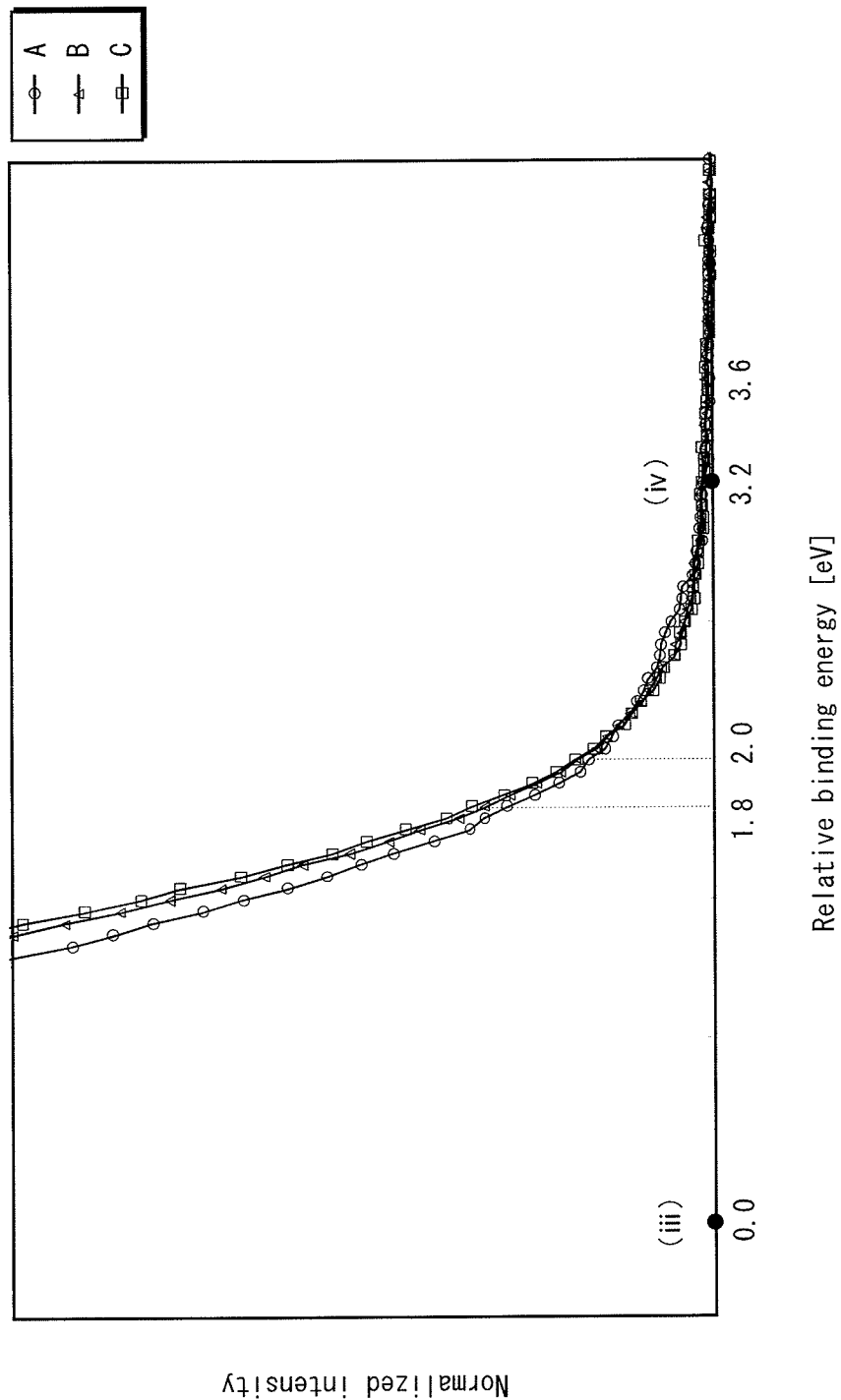
FIG. 11 illustrates UPS spectra of a tungsten oxide layer that has been subjected to atmospheric exposure.

Next, the inventors conducted atmospheric exposure, at room temperature for a period of one hour, of the tungsten oxide layer 12 of each of the samples A, B, and C on which the UPS spectra measurement illustrated in FIG. 9 had been performed. These sample devices had not previously been exposed to the atmosphere after film formation. The inventors then conducted UPS measurement again to confirm changes in the spectra. FIG. 11 is a diagram illustrating UPS spectra within the above area y. The horizontal axis in FIG. 11 is similar to the horizontal axis in FIG. 9, with points (iii) and (iv) located along the horizontal axis at the same position as in FIG. 9.

Based on the UPS spectra illustrated in FIG. 11, the tungsten oxide layer 12 of each of the samples B and C does not exhibit the spectral protrusion near the Fermi surface either before or after atmospheric exposure. On the other hand, the tungsten oxide layer 12 of the sample A still exhibits the spectral protrusion near the Fermi surface, although the spectrum after atmospheric exposure differs in intensity and shape. Hence, the sample A maintains the same characteristics as before atmospheric exposure even after conducting atmospheric exposure for a certain duration, thus clearly demonstrating that the sample A has a certain level of stability with respect to the surrounding atmosphere.

Thus far, the measured UPS spectra of the samples A, B, and C have been discussed. It should be noted, however, that the spectral protrusion near the Fermi surface can similarly be observed in the spectra obtained by XPS measurement or hard X-ray photoelectron spectroscopy measurement.

Figure 12:
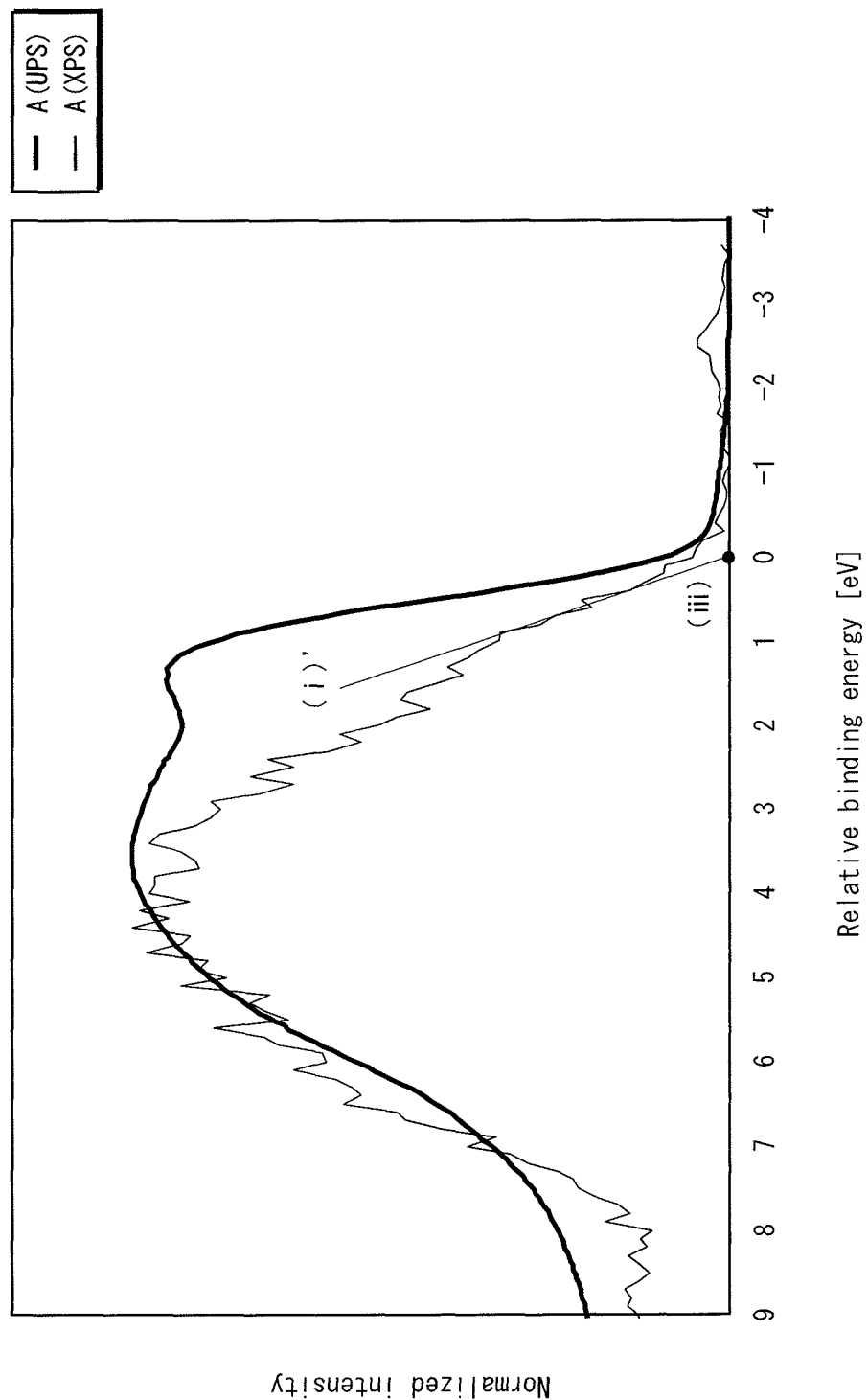
FIG. 12 illustrates both a UPS spectrum and an XPS spectrum of a tungsten oxide layer of the present invention.

FIG. 12 is a diagram illustrating an XPS spectrum of the tungsten oxide layer 12 of the sample A after the above atmospheric exposure. For the sake of comparison, the UPS spectrum of the tungsten oxide layer 12 of the sample A (as illustrated in FIG. 8) is also shown overlaid on the XPS spectrum.

The conditions under which the XPS measurement was conducted are similar to the conditions for the above UPS measurement, differing only in that an Al—Kα line was used as the light source. The interval between measurement points, however, was 0.1 eV. In FIG. 12, point (iii) is provided at the same point on the horizontal axis as point (iii) in FIG. 8, and like FIG. 9, the horizontal axis indicates a relative binding energy with respect to point (iii). In addition, a line in the XPS spectrum corresponding to the line (i) in FIG. 8 is illustrated as line (i)' in FIG. 12.

As illustrated in FIG. 12, the spectral protrusion near the Fermi surface of the tungsten oxide layer 12 of the sample A is found in the XPS spectrum, as well as in the UPS spectrum, as a protrusion of a considerable degree within an area approximately between 1.8 eV and 3.6 eV lower than the lowest binding energy of the valence band. The spectral protrusion near the Fermi surface was similarly found in a separate experiment in the spectrum observed with hard X-ray photoelectron spectroscopy.

The sample 1A (FIG. 7) was used instead of the organic EL element 1 shown in FIG. 1 as the sample device for conducting the above photoelectron spectroscopy measurements. Unlike the structure of the organic EL element 1, the sample 1A is composed of the tungsten oxide layer 12 formed on the conductive silicon substrate 11. This step was taken merely to prevent the occurrence of charge-up during measurement; the structure of the organic EL element of the present invention is not to be limited to such a structure.

According to another experiment conducted by the inventors, when UPS measurement and XPS measurements were conducted against a sample device having the structure of the organic EL element 1 illustrated in FIG. 1 (i.e. an anode 2 composed of ITO and a hole injection layer 4 composed of tungsten oxide formed in this order on one surface of the substrate 10), charge-up occurred during measurement of the tungsten oxide layer under film forming conditions B and C.

However, by using a neutralizing electron gun that cancels such charge-up, a similar spectrum as for the sample 1A was obtained at least in the range extending from the band gap to the lowest binding energy in the valence band, even though in some cases the absolute value of the binding energy indicated by each of the occupied energy levels of the hole injection layer 4 (for example, the binding energy value when the Fermi level of the photoelectron spectroscopy device itself is set as a reference point) differed from the corresponding value of the tungsten oxide layer 12 of the sample 1A.

(Analysis of Hole Injection Efficiency from Hole Injection Layer to Functional Layer)

In the case of an occupied energy level near the Fermi surface in a hole injection layer composed of tungsten oxide, the principle behind the effect that the occupied energy level has on the efficiency of hole injection from the hole injection layer to the functional layer can be explained as follows. Note that in this case, the existence of the occupied energy level can be confirmed as a protrusion near the Fermi surface in, for instance, a UPS spectrum.

It has been frequently reported, with reference to results of experiments and first principles calculations, that existence of the occupied energy level near the Fermi surface, which can be seen in a thin film or a crystal of tungsten oxide, derives from a structure similar to an oxygen vacancy.

Specifically, it can be assumed that the existence of the occupied energy level near the Fermi surface derives from a binding orbital formed by 5d orbitals of adjacent tungsten atoms due to a deficiency of oxygen atoms, or from a 5d orbital of a singular tungsten atom which is not terminated with an oxygen atom and which exists at the surface of a film or within a film. Further, it is assumed that such 5d orbitals, when either in semi-occupied state or unoccupied state, are capable of pulling an electron off of the HOMO of an organic molecule when contact is formed therebetween. The pulling of an electron from the organic molecule performed by the 5d orbital is believed to have the effect of stabilizing the energy state of both the tungsten atom and the organic molecule.

As a matter of fact, a report has been made that, when a layer composed of α-NPD, which is a small organic molecule, is layered on a thin film of molybdenum oxide, electrons transfer from the α-NPD molecule to the molybdenum oxide thin film (see Non-Patent Literature 3). Note that molybdenum oxide has many common physical properties similar to those of tungsten oxide, such as a catalyst effect, electrochromism, and photochromism.

In further detail, the inventors arrived at the conception that, in the case of tungsten oxide, a semi-occupied 5d orbital or a structure similar thereto of a single tungsten atom corresponds to the occupied energy level near the Fermi surface. The semi-occupied 5d orbital is lower in terms of binding energy than a binding orbital of 5d orbitals of adjacent tungsten atoms.

Figure 13:
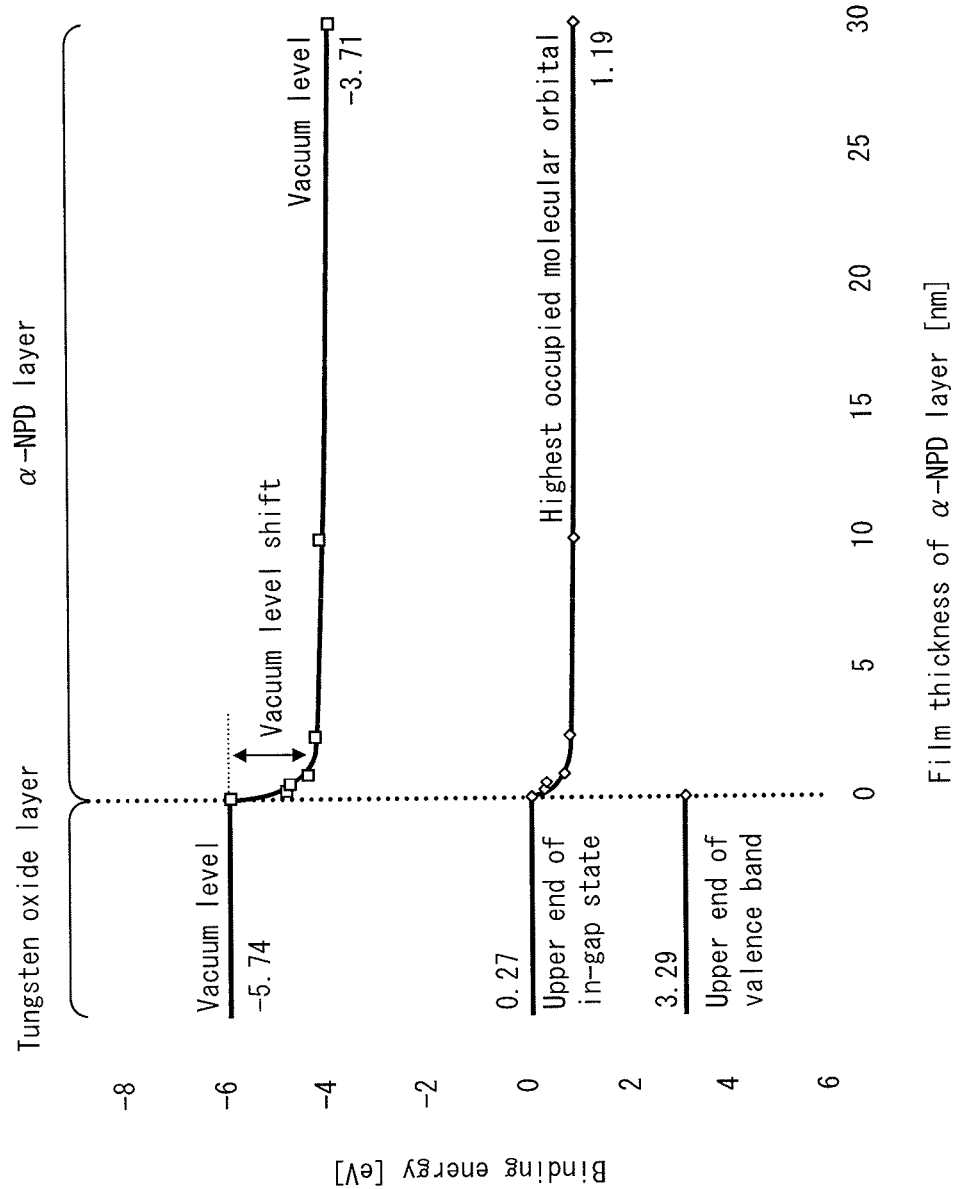
FIG. 13 is a diagram illustrating an energetic state at an interface between the tungsten oxide layer of the present invention and an α-NPD layer.

FIG. 13 is a diagram illustrating an energetic state at an interface between the tungsten oxide layer having the occupied energy level near the Fermi surface and an α-NPD layer.

Within the tungsten oxide layer (corresponding to the hole injection layer), FIG. 13 illustrates the lowest binding energy of the valence band (the "upper end of the valence band" in FIG. 13) and the lowest binding energy of the occupied energy level near the Fermi surface, corresponding to the point at which the occupied energy level near the Fermi surface rises (the "upper end of the in-gap state" in FIG. 13). In the UPS spectrum, the upper end of the valence band corresponds to point (iii) in FIG. 8, and the upper end of the in-gap state corresponds to point (iv) in FIG. 9.

In addition, FIG. 13 illustrates the relationship between (i) the thickness of the α-NPD layer, in a case where the α-NPD layer (corresponding to the functional layer) is formed on the tungsten oxide layer, and (ii) the binding energy of the HOMO of the α-NPD as well as the vacuum level. Here, the binding energy of the HOMO of the α-NPD layer corresponds to the binding energy at a point at which a peak in the HOMO begins in the UPS spectrum, i.e. the lowest binding energy of the HOMO in the α-NPD.

More specifically, the energy diagram illustrated in FIG. 13 is obtained through repeated alternate execution of the UPS measurement and the ultra-high vacuum vapor deposition of the α-NPD, where the tungsten oxide layer formed on the ITO substrate is transferred back and forth between a photoelectron spectroscopy device and an ultra-high vacuum vapor deposition device connected to the photoelectron spectroscopy device. Since the occurrence of charge-up was not encountered during the UPS measurement, the binding energy on the vertical axis in FIG. 13 is indicated as an absolute value taken with respect to a reference point, which is the Fermi level of the ITO substrate.

FIG. 13 demonstrates that, at least within a range of between 0 nm and 0.3 nm from the surface of the α-NPD layer, i.e. in a vicinity of the interface between the tungsten oxide layer and the α-NPD layer, the upper end of the in-gap state of the tungsten oxide layer and the HOMO of the α-NPD layer substantially equal in terms of binding energy. In other words, the energy levels are in a state of alignment (the state described above as the "interface energy level alignment"). Here, it should be noted that the state of "substantially equal" as referred to above actually includes a state where a slight difference exists between the binding energies of the two layers, and specifically denotes a range of +0.3 eV inclusive.

Further, it can be seen from FIG. 13 that the interface energy level alignment is formed as a result of interaction between the tungsten oxide and the α-NPD, and not by mere coincidence. Refer to the following for reasons as to why such an indication can be made.

For instance, the change in vacuum level (vacuum level shift) observed at the interface between the tungsten oxide layer and the α-NPD layer indicates that an electrical double layer (EDL) is formed at the interface. Further, considering the direction in which the vacuum level shift is oriented, it can be seen that the EDL is formed to be negative in the direction of the tungsten oxide layer, and positive in the direction of the α-NPD layer. In addition, since the magnitude of the vacuum level shift is considerably large near 2 eV, it can be reasonably assumed that the EDL has been formed not due to physical adsorption or the like, but rather as a result of an effect similar to a chemical bond. Thus, it can be reasonably assumed that the interface energy level alignment has been formed as a result of interaction between the tungsten oxide and the α-NPD.

Furthermore, the inventors assume that the interaction is specifically caused by a mechanism as described below.

First of all, as described above, the occupied energy level near the Fermi surface derives from the 5d orbital of a tungsten atom that has a structure similar to an oxygen vacancy. In the following, the 5d orbital of the tungsten atom is referred to as a "W5d orbital corresponding to the spectral protrusion".

When the HOMO of an α-NPD molecule approaches the W5d orbital corresponding to the spectral protrusion at the surface of the tungsten oxide layer, an electron transfers from the HOMO of the α-NPD molecule to the W5d orbital corresponding to the spectral protrusion. Such transfer of an electron takes place since both the tungsten oxide layer and the α-NPD molecule seek for stabilization of energetic state. Hence, an EDL is formed at the interface, thus causing the vacuum level shift and the interface energy level alignment observed in FIG. 13.

More specifically, many reports have been made, as a result of first principles calculations, that the HOMO of an organic amine-containing molecule, such as α-NPD, is characterized in that the electron density thereof typically exhibits a distribution biased towards a nitrogen atom of the amine structure, and that the structure thereof includes, as the main component, a lone pair of electrons of the nitrogen atom. It can therefore be assumed that, particularly at the interface between the tungsten oxide layer and the layer of an organic amine-containing molecule, an electron transfers from the lone pair of electrons of the nitrogen atom in the amine structure of the amine-containing molecule, to the W5d orbital corresponding to the spectral protrusion.

This assumption is supported by reports made of interface energy level alignments, similar to the interface energy level alignment between the tungsten oxide layer and the α-NPD layer illustrated in FIG. 13, at interfaces formed between both α-NPD and F8BT and a vapor deposition film of molybdenum oxide, which has a physical property similar to tungsten oxide, as described above (see Non-Patent Literature 4, 5, and 6).

In the organic EL element of the present invention, the excellent efficiency of the hole injection layer for hole injection into the functional layer can be explained according to the interface energy level alignment as described above. That is, an interface energy level alignment occurs between the hole injection layer composed of tungsten oxide that has the occupied energy level near the Fermi surface and the adjacent functional layer. As a result, the binding energy at the point at which the occupied energy level near the Fermi surface begins to rise and the binding energy of the HOMO of the functional layer become substantially equal. The injection of holes takes place between such energy levels having the interface energy level alignment formed therebetween. Therefore, the hole injection barrier between the hole injection layer and the functional layer of the present invention is nearly nonexistent.

The cause behind formation of the occupied energy level near the Fermi surface is a structure similar to an oxygen vacancy, and it is highly unlikely for tungsten oxide that is completely free of such a structure to actually exist. For example, it can be reasonably assumed that, even in such tungsten oxide as used to prepare the above-described samples B and C, which does not exhibit the spectral protrusion near the Fermi surface in the photoelectron spectroscopy spectrum, structures similar to an oxygen vacancy exist, however minimal they may be in number.

Figure 14A:
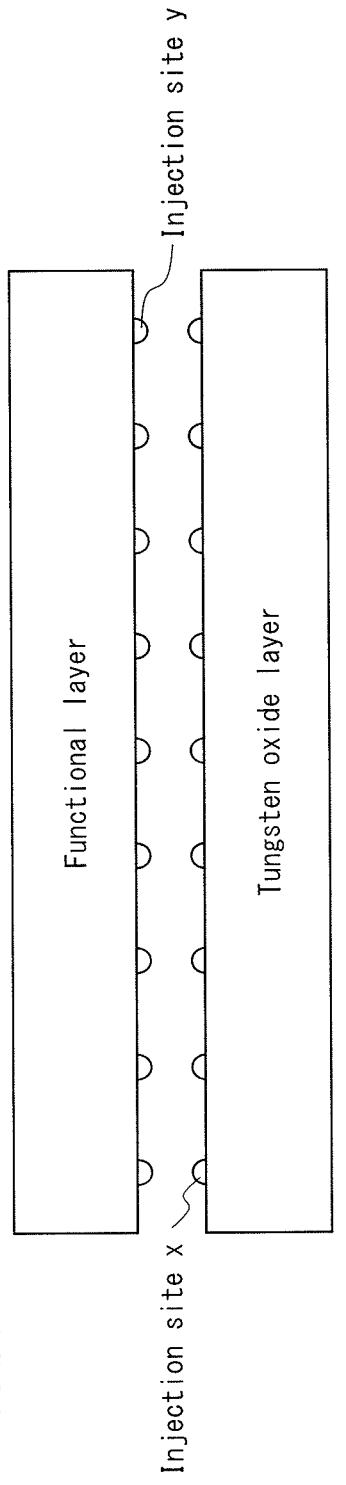
FIGS. 14A and 14B are diagrams for explanation of effects yielded by injection sites of a hole injection layer and a functional layer.
Figure 14B:
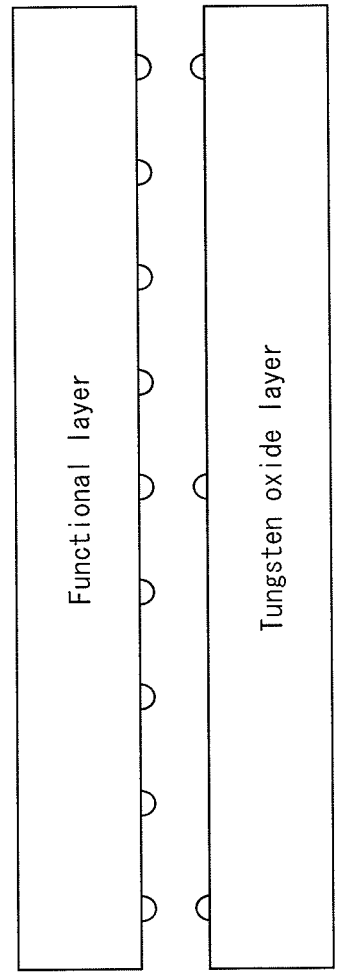

With respect to this point, explanation is now provided, with reference to FIGS. 14A and 14B, of the reason for which the hole-only device HOD-A and the organic EL element BPD-A, both having the hole injection layer 4 which corresponds to the tungsten oxide layer 12 of the sample A, exhibit the superb low driving voltage observed in the above experiments.

To bring about the interaction between the HOMO of the organic molecule composing the functional layer and the occupied energy level near the Fermi surface of the tungsten oxide layer when disposing the tungsten oxide layer on the functional layer, the following condition needs to be fulfilled. Namely, at the interface between the layers, a portion of the organic molecule where the electron density of the HOMO of the organic molecule is high and a structure similar to an oxygen vacancy on the surface of the tungsten oxide layer (illustrated as "injection site x" in FIGS. 14A and 14B) must approach (i.e. contact) each other to within a distance at which the interaction is triggered. The portion of the organic molecule (illustrated as "injection site y" in FIGS. 14A and 14B) is, for instance, a nitrogen atom in the amine structure of an organic amine-containing molecule.

However, in a tungsten oxide layer as incorporated in the samples B and C, the number density of the injection site x, if any, is extremely small, as illustrated in FIG. 14B. Accordingly, the spectral protrusion near the Fermi surface does not appear in the UPS spectra thereof. Thus, the possibility of the injection site y and the injection site x coming into contact is extremely low. Since the injection of holes takes place where the injection site x and the injection site y come into contact, it is clear that hole injection efficiency in samples B and C is extremely low.

In contrast to this, as illustrated in FIG. 14A, an abundance of injection sites y exists in the tungsten oxide layer which exhibits the spectral protrusion near the Fermi surface, as for example in the above-described sample A. Thus, there is a high possibility of the injection sites y and the injection sites x coming into contact, thereby providing a high hole injection efficiency from the hole injection layer to the functional layer.

To further substantiate the analysis made thus far, the energy diagram at the interface with the α-NPD layer was also measured, as in FIG. 13, for the tungsten oxide layer formed under film forming conditions C, i.e. the tungsten oxide layer in which no spectral protrusion near the Fermi surface could be confirmed.

Figure 15:
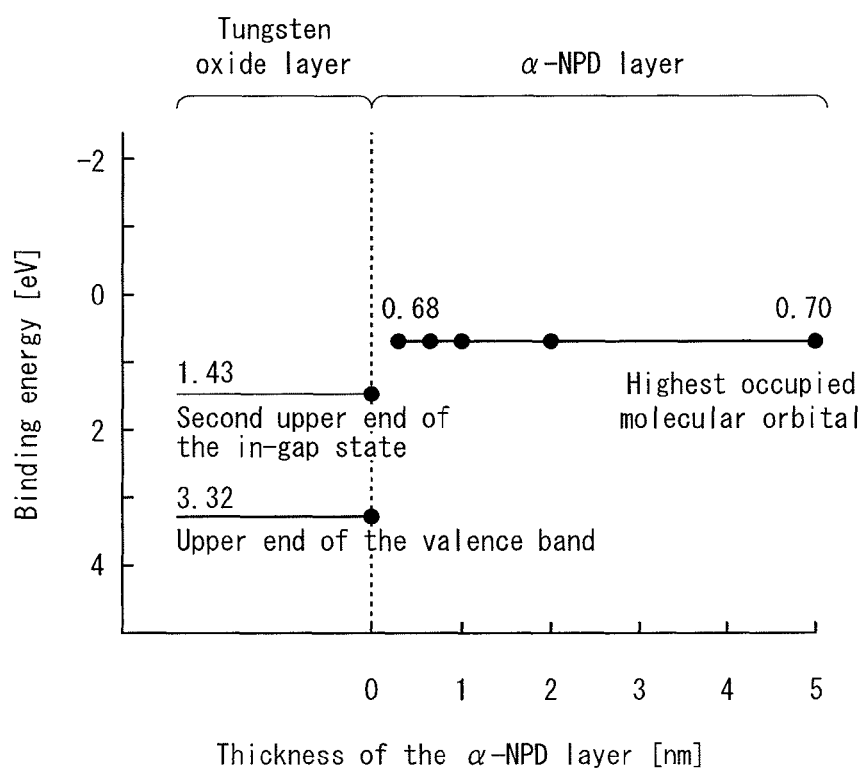
FIG. 15 is a diagram illustrating an energetic state at an interface between the tungsten oxide layer formed under film forming conditions C and the α-NPD layer.

FIG. 15 shows the results. As described above, the upper end of the in-gap state of the tungsten oxide layer, which corresponds to the spectral protrusion near the Fermi surface, could not be confirmed at all. As a candidate for another energy level used in hole injection, FIG. 15 shows the point at which a structure different from the spectral protrusion ((z) in FIG. 8) rises (the "second upper end of the in-gap state"), this point being observed at a higher binding energy than the location of the spectral protrusion near the Fermi surface in the UPS spectrum. FIG. 15 also shows the upper end of the valence band.

However, the HOMO of the α-NPD in FIG. 15 completely differs from FIG. 13 and approaches neither the second upper-end of the in-gap state nor the upper end of the valence band. In other words, interface energy level alignment does not occur at all. This means that the second in-gap state and the valence band both hardly interact with the HOMO of the α-NPD. Even if holes are injected from the second upper end of the in-gap state to the HOMO of the α-NPD, the injection barrier is 0.75 eV, an extremely large value compared to FIG. 13, in which the injection barrier is nearly zero.

It is considered that this difference in the injection barrier greatly affects the driving voltage and the light-emitting efficiency of the hole-only devices 1B and the organic EL elements 1 formed under the above film forming conditions. Specifically, the differences in characteristics between the hole-only devices 1B and the organic EL elements 1 formed under film forming conditions A, B, and C strongly suggest that the organic EL element of the present invention has excellent hole injection efficiency from the hole injection layer to the functional layer.

To summarize the above analysis, the excellent hole injection efficiency of the organic EL element of the present invention can be explained as follows.

First, a hole injection layer composed of tungsten oxide exhibits, in the photoelectron spectroscopy spectrum thereof, a spectral protrusion near the Fermi surface. This means that a considerable number of structures similar to an oxygen vacancy, as well as occupied energy levels near the Fermi surface deriving from the structures, exist along the surface of the hole injection layer.

The occupied energy level near the Fermi surface, the existence of which is indicated by the spectral protrusion near the Fermi surface, pulls an electron off from the organic molecule composing the functional layer adjacent to the hole injection layer. As a result, the occupied energy level near the Fermi surface establishes an interface energy level alignment with the HOMO of the organic molecule.

As such, if a considerable number of structures similar to an oxygen vacancy is found along the surface of the hole injection layer, the probability increases of contact between the occupied energy level near the Fermi surface and a portion of the HOMO with a high electron density in the organic molecule. Thus, the interface energy level alignment occurs efficiently, whereby the tungsten oxide layer exhibits excellent hole injection efficiency from the hole injection layer to the functional layer.

(Analysis of Hole Injection Efficiency from Anode to Hole Injection Layer)

The following describes the stability of the Schottky ohmic contact (as dependent on the material and surface conditions of the anode), which is formed between the anode and the hole injection layer composed of tungsten oxide of the present invention.

[Hole Injection Barrier Between Anode and Hole Injection Layer]

FIGS. 16 through 19 are energy diagrams near the interface between the anode and the functional layer in a conventional organic EL element, in which the anode in the functional layer are directly laminated together. Here, α-NPD was used as the functional layer. The binding energy along the vertical axis in the figures indicates absolute values, with the Fermi level of the anode at the origin.

Figure 16:
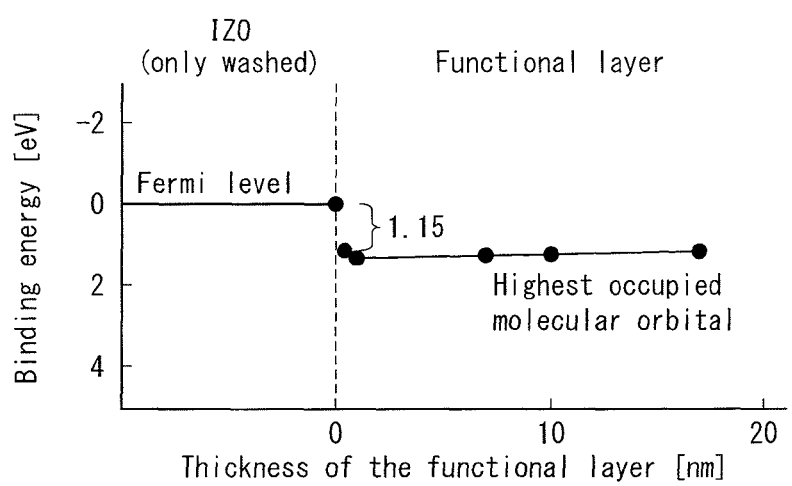
FIG. 16 is a diagram illustrating an energetic state at an interface between the functional layer and an IZO anode cleaned with pure water.
Figure 17:
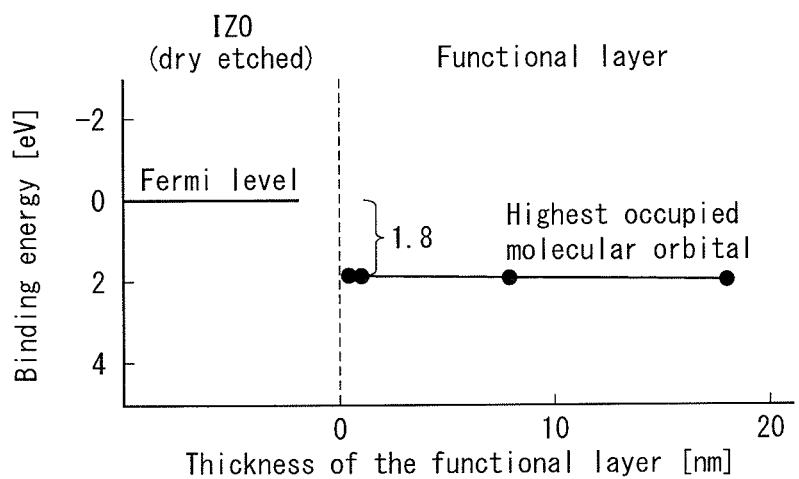
FIG. 17 is a diagram illustrating an energetic state at an interface between the functional layer and an IZO anode cleaned with pure water and subsequently dry etched.

When the anode is formed from IZO, as in FIGS. 16 and 17, the hole injection barrier between the Fermi level of the anode and the HOMO of the functional layer was quite large, exceeding 1 eV both when the surface of the anode was cleaned only with pure water, as in FIG. 16, and when dry etching was performed on the surface of the anode after cleaning with pure water, as in FIG. 17. The magnitude of the hole injection barrier has also been shown to vary greatly depending on differences in how the IZO surface is processed.

Figure 18:
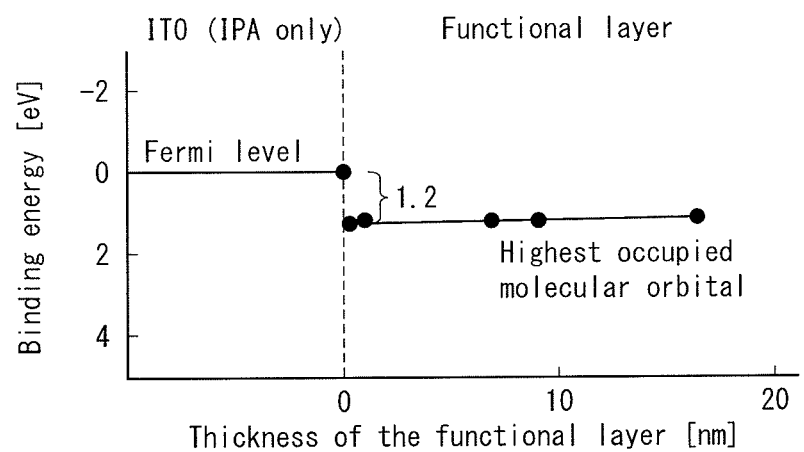
FIG. 18 is a diagram illustrating an energetic state at an interface between the functional layer and an ITO anode cleaned with IPA.
Figure 19:
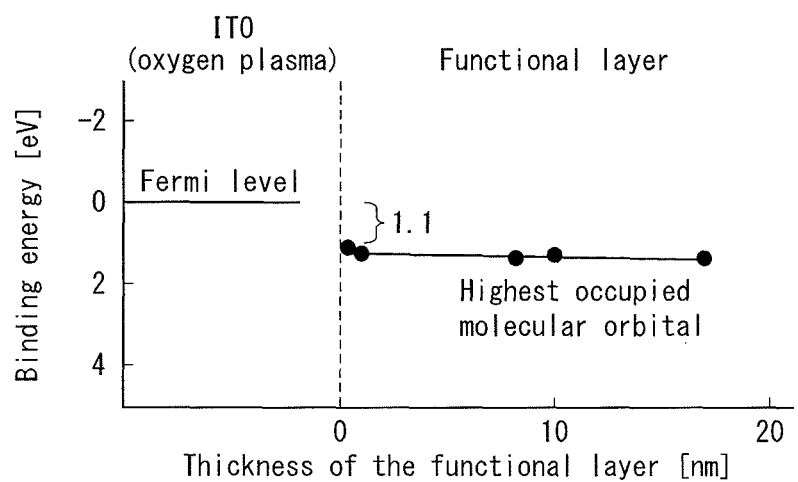
FIG. 19 is a diagram illustrating an energetic state at an interface between the functional layer and an ITO anode cleaned with IPA and subsequently subject to oxygen plasma treatment.

When the anode is formed from ITO, as in FIGS. 18 and 19, is also clear that a very high hole injection barrier exists both when the surface of the anode is only cleaned with IPA (isopropanol), as in FIG. 18, and when the surface of the anode is further treated with oxygen plasma after cleaning with IPA, as in FIG. 19.

As illustrated in FIGS. 16 through 19, in a conventional organic EL element, the hole injection barrier between the anode and the functional layer varies greatly depending on the type of anode material and on the surface conditions of the anode. Moreover, the barrier itself is large, thus clearly pointing to the potential for improvement with regards to driving voltage.

On the other hand, FIGS. 20 through 24 are energy diagrams near the interface between an anode and a hole injection layer when the anode is laminated with the hole injection layer composed of tungsten oxide of the present invention.

Figure 20:
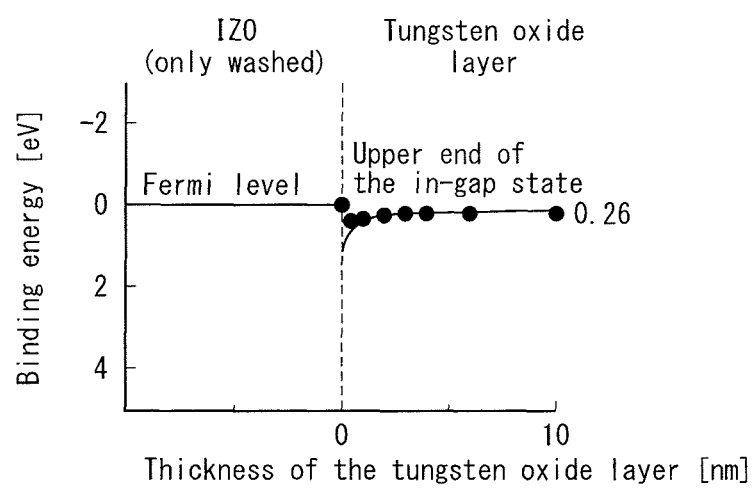
FIG. 20 is a diagram illustrating an energetic state at an interface between the hole injection layer of the present invention and an IZO anode cleaned with pure water.
Figure 21:
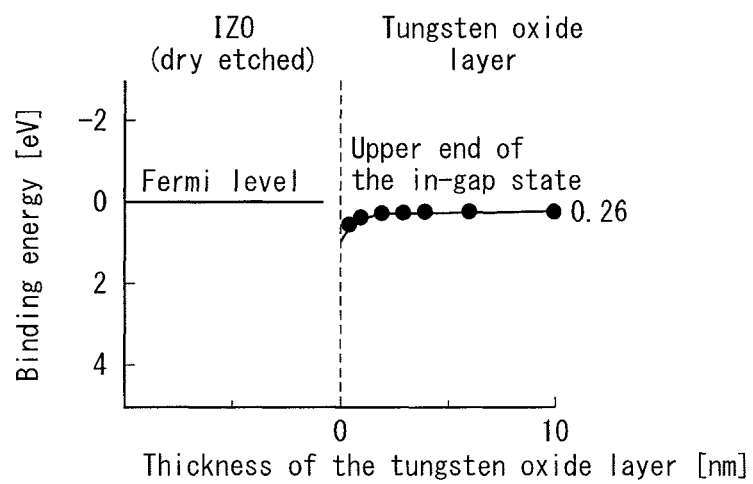
FIG. 21 is a diagram illustrating an energetic state at an interface between the hole injection layer of the present invention and an IZO anode cleaned with pure water and subsequently dry etched.

FIGS. 20 and 21 show the case of forming the anode from IZO. Like FIGS. 16 and 17, the surface of the anode was only cleaned with pure water in FIG. 20, whereas dry etching was performed on the surface of the anode after cleaning with pure water in FIG. 21. The hole injection layer of the present invention was then laminated on the anodes manufactured in this way.

Figure 22:
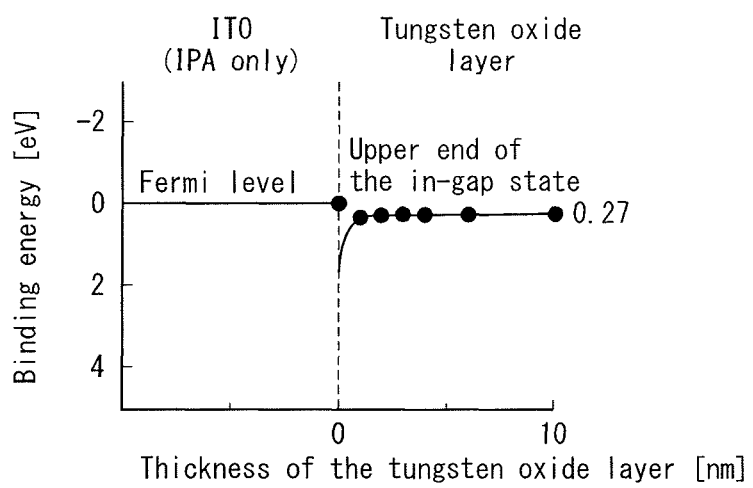
FIG. 22 is a diagram illustrating an energetic state at an interface between the hole injection layer of the present invention and an ITO anode cleaned with IPA.
Figure 23:
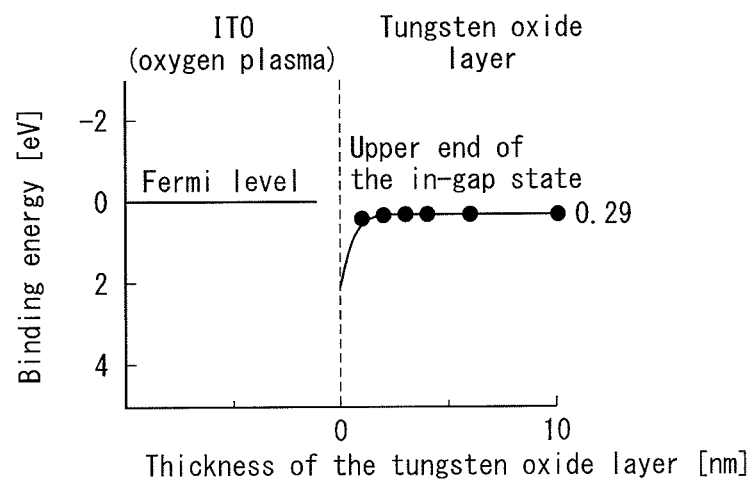
FIG. 23 is a diagram illustrating an energetic state at an interface between the hole injection layer of the present invention and an ITO anode cleaned with IPA and subsequently subject to oxygen plasma treatment.

FIGS. 22 and 23 show the case of forming the anode from ITO. Like FIGS. 18 and 19, the surface of the anode was only cleaned with IPA in FIG. 22, whereas the anode was treated with oxygen plasma after cleaning with IPA in FIG. 23. The hole injection layer of the present invention was then laminated on the anodes manufactured in this way.

Figure 24:
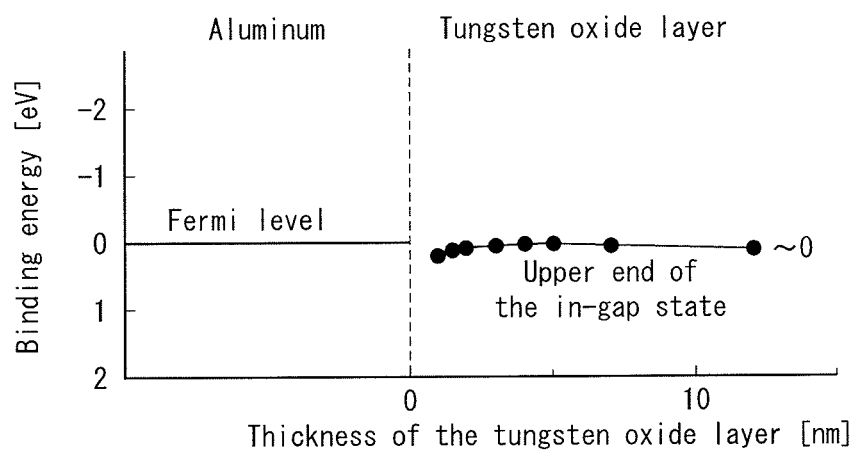
FIG. 24 is a diagram illustrating an energetic state at an interface between the hole injection layer of the present invention and an aluminum anode.

Furthermore, FIG. 24 shows the case of forming the anode from aluminum. After forming the anode, the hole injection layer of the present invention was layered thereon without the anode being exposed to the atmosphere, so as to prevent the surface from undergoing natural oxidation.

The following conclusions can be drawn from the results shown in FIGS. 20 through 24.

First, in every one of FIGS. 20 through 24, when the thickness of the hole injection layer is less than 2 nm, the binding energy at the upper end of the in-gap state, which is the position at which the occupied energy level near the Fermi surface begins to rise, has a relatively sharp inclination. At a thickness of 2 nm or greater, however, the binding energy is nearly constant. The value of the binding energy upon becoming nearly constant is extremely close to the Fermi level of the anode, the gap being within a range of ±0.3 eV. In other words, in all of FIGS. 20 through 24, the width of the Schottky barrier between the anode and the hole injection layer of the present invention is approximately 2 nm, meaning that excellent Schottky ohmic contact is achieved.

Furthermore, for the IZO anodes in FIGS. 20 and 21, as well as the ITO anodes in FIGS. 22 and 23, the gap in binding energy between the Fermi level of the anode and the upper end of the in-gap state when the thickness of the hole injection layer is 2 nm or greater does not depend on the surface conditions of the anode, but rather is nearly the same value (at most a gap of 0.02 eV).

The following conclusions can therefore be drawn. First of all, for all of the anode materials IZO, ITO, and aluminum, if the thickness of the hole injection layer of the present invention is 2 nm or greater, the anode and the hole injection layer are in Schottky ohmic contact. Furthermore, if the surface conditions of the anode have at least undergone one of the above treatments, then this contact is not only preserved well, but the degree of contact (the above gap in binding energy)

does not depend on differences in surface conditions of the anode, thereby maintaining an extremely stable, constant state.

Based on these results, using the hole injection layer composed of tungsten oxide of the present invention promises excellent hole injection efficiency from the anodes to the hole injection layer without the need for a variety of procedures to maintain the work function and the surface conditions of the anode stable. In other words, no special care need be taken to carefully select the anode material, or to maintain the surface conditions of the anode strictly constant immediately before formation of the hole injection layer.

To summarize the above considerations, the hole injection layer composed of tungsten oxide of the present invention includes an occupied energy level near the Fermi surface, and the energy level acts to achieve Schottky ohmic contact with the anode with almost no influence from the work function or surface conditions of the anode. Specifically, at a location that is 2 nm from the surface of the anode towards the hole injection layer, the gap in binding energy between the Fermi level of the anode and the occupied energy level falls within a range of ±0.3 eV. As a result, the hole injection barrier between the anode and the hole injection layer is greatly reduced.

Due to the action of the occupied energy level, as described above, the hole injection barrier between the hole injection layer of the present invention and the functional layer is extremely small. Accordingly, holes can be injected from the anode to the hole injection layer as well as from the hole injection layer to the functional layer with nearly no barrier. Reducing the hole injection barrier in this way between not only the hole injection layer in the functional layer, but also between the anode and the hole injection layer, allows for an even better low driving voltage for the EL element. Furthermore, improving the hole injection efficiency reduces the burden on the EL element during driving thereof, thereby promising an increase in the operating lifetime of the EL element.

[Confirmation of Stability of Schottky Ohmic Contact]

As described above, when the thickness of the hole injection layer composed of tungsten oxide of the present invention is 2 nm or greater, a stable Schottky ohmic contact forms between the hole injection layer and the anode. This has also been confirmed based on characteristics of the EL element.

First, using hole-only devices, the degree to which the hole injection efficiency from the anode to the hole injection layer is dependent on film thickness was assessed for the hole injection layer of the present invention.

The hole injection layer in each of the hole-only devices was manufactured with the same structure by the same manufacturing method with the hole-only device 1B shown in FIG. 2, differing only in the film thickness of the hole injection layer 4A. Specifically, the hole injection layer was formed under the above film forming conditions A, with a thickness in a range between 5 nm and 30 nm. For comparison, an element in which the hole injection layer was omitted, i.e. an element in which the anode and the buffer layer were directly laminated together, was also manufactured (hereinafter referred to as a "film thickness of 0 nm"). Regarding other layers, an anode composed of ITO, a buffer layer composed of TFB, a light-emitting layer composed of F8BT, and a cathode composed of gold have film thicknesses of 50 nm, 20 nm, 80 nm, and 100 nm, respectively.

Except for the element with a film thickness of 0 nm, the hole injection layer was formed under film forming conditions A in all of the hole-only devices. Therefore, the hole injection efficiency from the hole injection layer to the buffer layer is assumed to be equivalent in all of the elements.

Furthermore, the structures were identical except for the thickness of the hole injection layer. Accordingly, the main factors influencing the characteristics of the hole-only devices are expected to be the thickness of the hole injection layer and the extent of formation of the Schottky ohmic contact between the anode and the hole injection layer.

First, the influence of the electric resistance of the hole injection layer might be considered. The resistance of the hole injection layer increases in proportion to the thickness of the hole injection layer. The resistivity of the hole injection layer under film forming conditions A, however, is $\frac{1}{100}$ or less that of the buffer layer and the light-emitting layer, as was confirmed by a separate experiment. Therefore, differences in resistance due to differences in the thickness of the hole injection layer make nearly no contribution to the characteristics of the hole-only devices.

Accordingly, except for the element with the film thickness of 0 nm, the hole-only devices should all have substantially the same characteristics as long as a stable Schottky ohmic contact is formed between the anode and the hole injection layer.

Hole-only devices manufactured to have a hole injection layer with respective thicknesses of 0 nm, 5 nm, and 30 nm were connected to a direct current power supply, and voltage was applied thereto. Furthermore, by changing the applied voltage, an electric current value per unit surface area (electric current density) was calculated for different voltages. Hereinafter, the expression "driving voltage" refers to the voltage applied when the electric current density value is 10 mA/cm$^2$.

Table 5 shows the driving voltage for each of the hole-only devices.

TABLE 5

| Thickness of Hole Injection Layer [nm] | Driving Voltage [V] |
|---|---|
| 0 | 30.0 |
| 5 | 20.1 |
| 30 | 20.2 |

The driving voltage for the element with a film thickness of 0 nm is quite high. This is considered to be because a large hole injection barrier forms between the anode and the functional layer, due to the absence of the hole injection layer of the present invention. On the other hand, in the elements with respective film thicknesses of 5 nm and 30 nm, the driving voltage is kept low. Furthermore, the driving voltage is nearly equal for both elements, thus clearly not depending on film thickness. Based on this table, it can be concluded that when the thickness of the hole injection layer is at least 5 nm, a nearly constant Schottky ohmic contact forms between the anode and the hole injection layer of the present invention, thereby achieving excellent hole injection efficiency from the anode to the hole injection layer.

Next, the degree to which the hole injection efficiency from the anode to the hole injection layer is dependent on film thickness was assessed for the hole injection layer of the present invention in the organic EL elements as well.

The organic EL elements were obtained by changing the above hole-only device where the cathode composed of gold is replaced with a 5 nm-thick barium layer and a 100-nm thick aluminum layer which are layered one on top of the other. The thickness of the hole injection layer was in a range between 2 nm and 30 nm.

Since the structure of the organic EL elements was the same except for the thickness of the hole injection layer, the elements should all have substantially the same characteristics as long as a stable Schottky ohmic contact is formed between the anode and the hole injection layer.

Organic EL elements manufactured to have a hole injection layer with respective thicknesses of 2 nm, 5 nm, 15 nm, 20 nm, and 30 nm were connected to a direct current power supply, and voltage was applied thereto. Furthermore, by changing the applied voltage, an electric current value per unit surface area (electric current density) was calculated for different voltages. Hereinafter, the expression "driving voltage" refers to the voltage applied when the electric current density value is 10 mA/cm$^2$.

Table 6 shows the driving voltage for each of the organic EL elements.

TABLE 6

| Thickness of Hole Injection Layer [nm] | Driving Voltage [V] |
|---|---|
| 2 | 8.6 |
| 5 | 8.4 |
| 15 | 8.7 |
| 20 | 8.7 |
| 30 | 8.4 |

Each of the driving voltages is a good, low value. Taking into consideration variations in the thickness of each layer that naturally occur during manufacturing of the elements, these driving voltages can be concluded not to depend on the thickness of the layers and to be sufficiently equivalent. Therefore, as with the hole-only devices, it can be assumed that a nearly constant Schottky ohmic contact forms between the anode and the hole injection layer of the present invention in the organic EL elements as well when the thickness of the hole injection layer is 2 nm or greater.

Next, the relationship between the thickness of the hole injection layer of the present invention and the operating lifetime of the EL element was assessed using organic EL elements.

The organic EL elements were manufactured with the same structure as in Table 6, with the thickness of the hole injection layer being in a range between 2 nm and 30 nm. For comparison, an element with a film thickness of 0 nm, i.e. an element without a hole injection layer 4A, was also manufactured.

Since the structure of the EL elements was the same except for the thickness of the hole injection layer, the elements are expected to have substantially the same lifetime as long as a stable Schottky ohmic contact is formed between the anode and the hole injection layer.

EL elements respectively manufactured to have hole injection layers with respective film thicknesses of 0 nm, 2 nm, 5 nm, and 30 nm were connected to a direct current power supply and were driven at a constant current with an electric current density of 10 mA/cm$^2$. Changes in the luminance of the emitted light in accordance with driving time were measured.

For each element, Table 7 shows the time from the start of driving for the luminance to decrease to 60%.

TABLE 7

| Thickness of Hole Injection Layer [nm] | 0 | 2 | 5 | 30 |
|---|---|---|---|---|
| Time for Decrease in Luminance [hours] | 100 | 150 | 150 | 170 |

From this table, it is clear that the luminance of the element with a film thickness of 0 nm decreases quickly, i.e. that the lifetime is short. This is considered to be because a large hole injection barrier forms between the anode and the functional layer, due to the absence of the hole injection layer of the present invention. It thus becomes necessary to apply a high driving voltage in order to maintain constant current, increasing the burden on the element and thereby greatly affecting the lifetime.

On the other hand, in the elements with respective film thicknesses of 2 nm, 5 nm, and 30 nm, the decrease in luminance is lower than the element with a film thickness of 0 nm, i.e. the lifetime is longer. This is considered to be because the hole injection layer of the present invention effectively reduces the hole injection barrier, thereby reducing the necessary driving voltage and lessening the burden on the elements.

The results were good for the elements with respective film thicknesses of 2 nm, 5 nm, 30 nm, which all had an approximately equivalent decrease in luminance. Accordingly, it can be inferred that if the thickness of the hole injection layer is 2 nm or greater, a nearly constant Schottky ohmic contact forms between the anode and the hole injection layer of the present invention, and therefore that any element with a hole injection layer that is at least 2 nm thick will have an equivalent driving voltage and an equivalent lifetime.

The above experiments confirm, based on characteristics of the EL element, that when the thickness of the hole injection layer composed of tungsten oxide according of the present invention is 2 nm or greater, a stable Schottky ohmic contact forms between the hole injection layer and the anode.

Also, regarding the elements used in Table 1 and FIGS. 3 through 6, the inventors confirmed formation of Schottky ohmic contact of the present invention between the anode and the hole injection layer, regardless of the film forming conditions for the hole injection layer. The formation of the Schottky ohmic contact results from surface treatment performed on the ITO anode. Details are provided below.

Like the method used in FIG. 13, repeating the cycle of forming the hole injection layer, under the above film forming conditions, on an ITO anode treated as above and performing UPS measurement confirmed the existence of a spectral protrusion near the Fermi surface for hole injection layers having a thickness within approximately 2 nm, regardless of the film forming condition, and confirmed the formation of Schottky ohmic contact with the anode. As the film thickness increased, however, the presence of a spectral protrusion near the Fermi surface depended on the film forming conditions, as in FIG. 9.

This is considered to be due to that, before formation of the hole injection layer, argon ion sputtering was performed on the surface of the ITO anode to clean the ITO anode and oxygen vacancies formed on the surface of the ITO anode.

In other words, oxygen vacancies form on the surface of the ITO anode, making it easier for oxygen atoms in the tungsten oxide to be pulled towards the ITO immediately after the start of formation of the hole injection layer. This results in the formation of numerous structures similar to an oxygen vacancy in the hole injection layer only near the interface. The Schottky ohmic contact of the present invention thus forms between the anode and the hole injection layer.

Once the thickness of the hole injection layer reaches several nanometers immediately after the start of formation of the hole injection layer, the layer proceeds to form uniformly with the properties determined by the film forming conditions. Therefore, the characteristics of the elements in Table 1 and in FIGS. 3 through 6, in which the hole injection layer has a thickness of 30 nm, depend on the film forming conditions.

Embodiment 2

<Overall Structure of Organic EL Element 1C>

FIG. 25A is a schematic cross-sectional view illustrating the structure of an organic EL element 1C according to the present embodiment. FIG. 25B is a partially enlarged view illustrating the vicinity of a hole injection layer 4A.

The organic EL element 1C is for example an applying-type organic EL element, which is characterized in that a functional layer is applied by a wet process in the manufacturing thereof. The organic EL element 1 includes: a hole injection layer 4A; various functional layers; and a pair of electrodes composed of an anode 2 and a cathode 8D. The hole injection layer 4A and the functional layers are disposed one on top of the other, and are disposed between the pair of electrodes. Each of the functional layers contains functional material having a predetermined function.

More specifically, the organic EL element 1C includes the anode 2, an ITO layer 3, the hole injection layer 4A, a buffer layer 6A, a light-emitting layer 6B, an electron injection layer 7, the cathode 8D, and a sealing layer 9, which are disposed in the stated order on one main surface of a substrate 10. The following mainly explains the difference between the organic EL element 1C and the organic EL element 1.

(ITO Layer 3)

The ITO layer 3 is interposed between the anode 2 and the hole injection layer 4A, and has a function of improving the bondability between layers. The organic EL element 1C has the structure where the ITO layer 3 is separated from the anode 2. Alternatively, the ITO layer 3 may be regarded as part of the anode 2.

(Hole Injection Layer 4A)

The hole injection layer 4A is composed of a tungsten oxide layer having a film thickness of at least 2 mm (here, 30 mm) which is formed under predetermined film forming conditions in a similar way as in the hole injection layer 4 of Embodiment 1. The ITO layer 3 and the hole injection layer 4A form Schottky ohmic contact. The Fermi level of the ITO layer 3 differs from the lowest binding energy of the occupied energy level near the Fermi surface by ±0.3 eV, at a position that is 2 nm away from the surface of the ITO layer 3 towards the hole injection layer 4A. This reduces the hole injection barrier between the ITO layer 3 and the hole injection layer 4A compared with conventional structures, thereby enabling the organic EL element 1C to be excellently driven at a low voltage.

In the composition formula (WOx) denoting the composition of tungsten oxide, which constitutes the hole injection layer 4A, x is a real number existing within a range of approximately 2<x<3. It is preferable that the hole injection layer 4A consist of high-purity tungsten oxide as much as possible. However, the inclusion of a trace level of impurities is acceptable, provided that the amount does not exceed the amount of impurities which may be incorporated as a result of normal processing.

Note that the predetermined film forming conditions of the hole injection layer 4A are detailed in the section <Method of Manufacturing Organic EL Element 1C> and the section (Film Forming Conditions of Hole Injection Layers 4A and 4B).

In Embodiment 2, since the tungsten oxide layer constituting the hole injection layer 4A is formed under the predetermined conditions, the hole injection layer 4A includes abundant tungsten oxide crystals 13 as illustrated in FIG. 25B. The particle diameter of each crystal 13 is on the order of nanometers. As an example, if the thickness of the hole injection layer 4A is approximately 30 nm, the particle diameter of the crystals 13 is approximately between 3 nm and 10 nm. Hereinafter, the crystals 13 whose particle diameter is on the order of nanometers are referred to as "nanocrystals 13", and a layered structure composed of nanocrystals 13 is referred to as a "nanocrystal structure". Note that apart from the nanocrystal structure, the hole injection layer 4A may include an amorphous structure.

In a hole injection layer 4A with the above nanocrystal structure, the tungsten atoms constituting the tungsten oxide are distributed to include both atoms at the maximum valence and atoms at a valence less than the maximum valence. Typically, the tungsten oxide layer includes a structure similar to an oxygen vacancy. In tungsten oxide with a crystal structure that does not have a structure similar to an oxygen vacancy, the maximum valence of the tungsten is a valence of six. On the other hand, in tungsten oxide with a crystal structure that has a structure similar to an oxygen vacancy, the valence of the tungsten is less than the maximum. Furthermore, the structure similar to an oxygen vacancy is typically abundant along the crystal surface.

Accordingly, in the organic EL element 1C, in addition to moderating the hole injection barrier between the ITO layer 3 and the hole injection layer 4A which are described above, it is desirable to further improve the efficiency of hole conduction by distributing tungsten atoms with a valence of five throughout the hole injection layer 4A to create structures similar to an oxygen vacancy. In other words, by providing the hole injection layer 4A formed from tungsten oxide with the nanocrystal structure, the holes injected from the ITO layer 3 to the hole injection layer 4A are conducted by an oxygen vacancy existing along the crystal interface of the nanocrystals 13, thereby increasing the paths for conduction of holes and improving the hole conduction efficiency. This efficiently reduces the driving voltage of the organic EL element 1C.

Additionally, the tungsten oxide forming the hole injection layer 4A has high chemical resistance, i.e. the tungsten oxide does not easily undergo undesired chemical reactions. Therefore, even if the hole injection layer 4A comes into contact with solvents or the like used during processes performed after formation of the hole injection layer 4A, damage to the hole injection layer 4A by dissolution, decomposition, degradation, and the like is reduced. Forming the hole injection layer 4A from a material with high chemical resistance thus prevents a reduction in the efficiency of conduction of holes from the hole injection layer 4A.

The hole injection layer 4A formed from tungsten oxide in the present embodiment includes both the case of formation only with a nanocrystal structure and the formation with both a nanocrystal structure and an amorphous structure. Furthermore, it is desirable that the nanocrystal structure be present throughout the hole injection layer 4A. Holes can be efficiently conducted from below the hole injection layer 4A to above the hole injection layer 4A, however, as long as grain boundaries are connected in at least one location in the light-emitting cell from the interface where the ITO layer 3 contacts with the hole injection layer 4A to the interface where the hole injection layer 4A contacts with the buffer layer 6A.

Note that examples have been reported on in the past of using a layer that includes tungsten oxide crystals as the hole injection layer. For example, Non-Patent Literature 2 suggests that crystallizing a tungsten oxide layer by annealing at 450° C. improves the hole conduction efficiency. However, Non-Patent Literature 2 does not disclose the conditions for forming a tungsten oxide layer with a large area, nor the effects that tungsten oxide formed on the substrate as a hole injection layer has on other layers in the substrate. Non-Patent Literature 2 therefore does not demonstrate the potential for practical mass-production of a large organic EL panel. Furthermore, Non-Patent Literature 2 does not disclose purposely forming tungsten oxide nanocrystals having a structure similar to an oxygen vacancy in the hole injection layer. The hole injection layer according to an aspect of the present invention is formed from a tungsten oxide layer that is resistant to chemical reactions, is stable, and can withstand the mass production process of large organic EL panels. Furthermore, purposely incorporating structures similar to an oxygen vacancy in the tungsten oxide layer achieves excellent hole conduction efficiency, another decisive difference from conventional technology.

(Electron Injection Layer 7, Cathode 8D, and Sealing Layer 9)

The electron injection layer 7 has a function of injecting electrons from the cathode 8D to the light-emitting layer 6B. The electron injection layer 7 is for example preferably formed from approximately 5 nm-thick barium, approximately 1 nm-thick lithium fluoride, sodium fluoride, or any combination of these materials.

The cathode 8D is for example formed from approximately 100 nm-thick ITO layer. The anode 2 and the cathode 8 are connected to a direct current power supply DC, and thereby the organic EL element 1C is supplied with power from the outside.

The sealing layer 9 has a function of preventing the organic EL element 1C from being exposed to moisture and air. The sealing layer 9 is for example formed from a material such as SiN and SiON. In the case where the organic EL element 1C is top emission type, the sealing layer 9 is preferably formed from a light-transmissive material.

<Method of Manufacturing Organic EL Element 1C>

The following describes an example of a method of manufacturing the entire organic EL element 1C, with reference to FIGS. 27A through 29C.

Figure 27A:
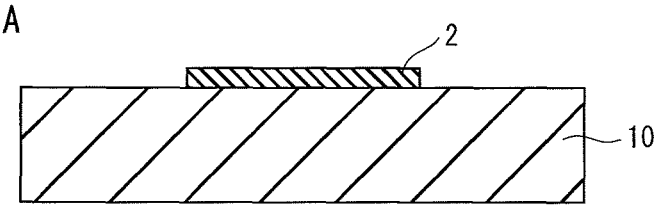
FIGS. 27A through 27C are process drawings illustrating a method of manufacturing the organic EL element 1C pertaining to Embodiment 2.

First, a thin film of silver is formed by sputtering, for example, on the substrate 10. The thin film is then patterned by, for example, photolithography to form the anodes 2 in a matrix (FIG. 27A). Note that the thin film may be formed by another method such as vacuum deposition.

Figure 27B:
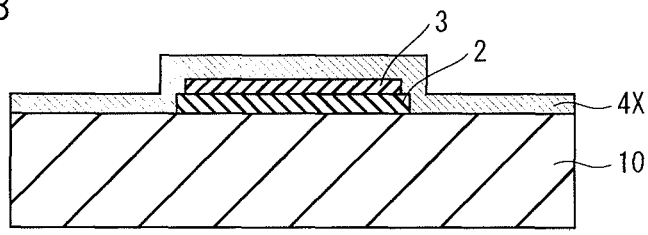

Next, an ITO thin film is formed by sputtering, for example, and is patterned by photolithography, for example, to form the ITO layer 3. A thin film 4X containing tungsten oxide is then formed under the predetermined film forming conditions described below (FIG. 27B).

Figure 27C:
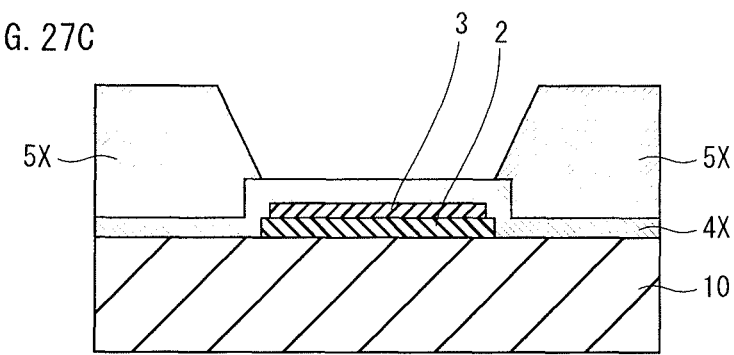

Subsequently, a bank material layer 5X is formed on the thin film 4X with bank material composed of organic material. A portion of the bank material layer 5X is removed to expose a portion of the thin film 4X (FIG. 27C). The bank material layer 5X is formed by application or by another method. The bank material layer 5X can be removed by patterning with a predetermined developer (a solution of tetramethylammonium hydroxide (TMAH) or the like).

Figure 28A:
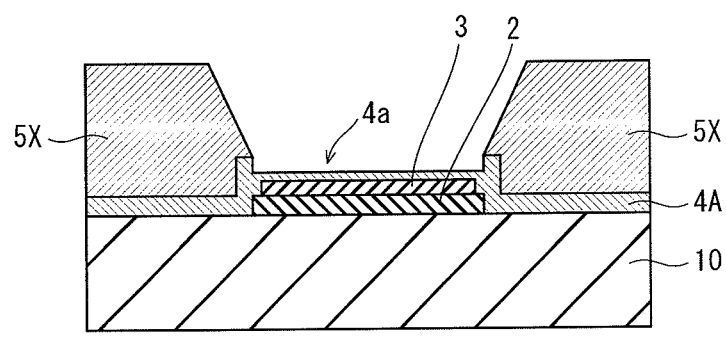
FIGS. 28A and 28B are process drawings illustrating a method of manufacturing the organic EL element 1C pertaining to Embodiment 2.

While the tungsten oxide forming the thin film 4X has good chemical resistance, it has the property of slightly dissolving in TMAH solution. Therefore, washing off the bank residue remaining on the surface of the thin film 4X with the above developer causes the exposed portion of the thin film 4X to erode, leading to formation of a concave structure (FIG. 28A). As a result, the hole injection layer 4A includes a concavity 4a.

Next, repellency treatment is performed on the surface of the bank material layer 5X using fluorine plasma, for example, to form the banks 5. Subsequently, an ink composition containing organic material is dripped, for example using the inkjet method, into a region defined by the banks 5.

Figure 28B:
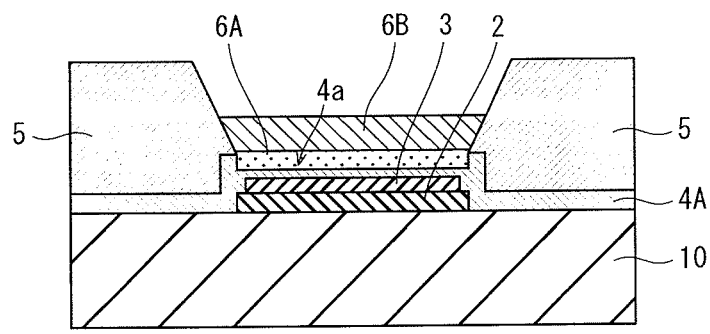

The ink is then dried, thereby forming the buffer layer 6A and the light-emitting layer 6B (FIG. 28B). Note that ink may be dripped with a different method such as the dispenser method, the nozzle coating method, the spin coating method, intaglio printing, or relief printing.

Figure 29A:
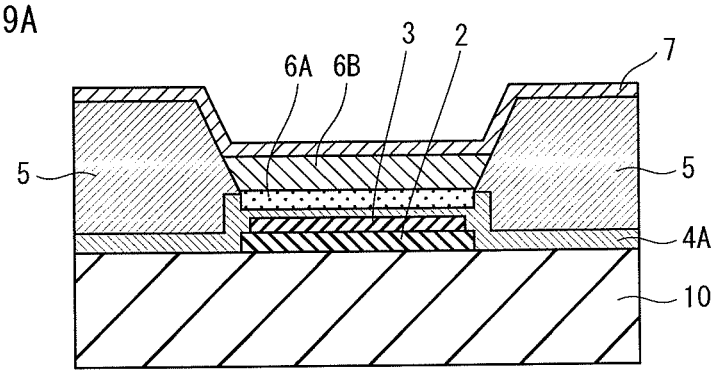
FIGS. 29A through 29C are process drawings illustrating a method of manufacturing the organic EL element 1C pertaining to Embodiment 2.

Next, a thin film of barium constituting the electron injection layer 7 is formed with vacuum deposition, for example (FIG. 29A).

Figure 29B:
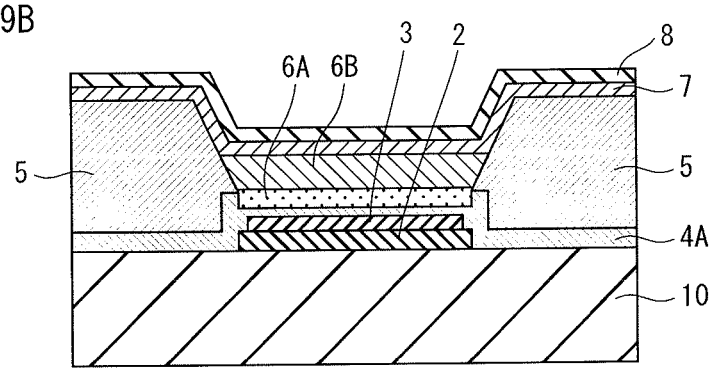

An ITO thin film constituting the cathode 8D is then formed by sputtering, for example (FIG. 29B).

Figure 29C:
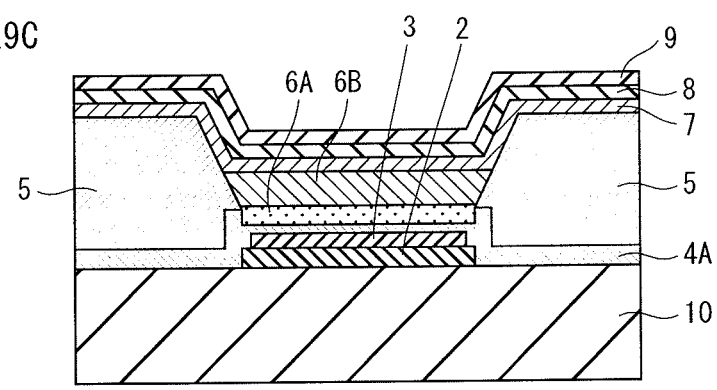

Next, on the cathode 8D, the sealing layer 9 is formed (FIG. 29C).

This completes the organic EL display element 1C.

The following describes the film forming conditions for the hole injection layer 4A (thin film 4X). It is desirable that the hole injection layer 4A (thin film 4X) be formed with the reactive sputtering method. Specifically, metal tungsten is placed in the chamber as the sputtering target, with argon gas as the sputtering gas and oxygen gas as the reactive gas. Under these conditions, the argon is ionized by the application of high voltage and caused to bombard the sputtering target. The metal tungsten ejected as a result of the sputtering phenomenon reacts with the oxygen gas to produce tungsten oxide, thus forming the tungsten oxide layer on the ITO layer 3.

Although detailed in the following section, desirable film forming conditions are described briefly as follows. (1) The total pressure of gas in the chamber should be at least 2.3 Pa and at most 7.0 Pa. (2) The partial pressure of the oxygen gas with respect to the total pressure should be at least 50% and at most 70%. (3) The input power (input power density) per unit area of the target should be at least 1.5 W/cm$^2$ and at most 6.0 W/cm$^2$. (4) The value yielded by dividing the total pressure by the input power density should be larger than 0.7 Pa·cm$^2$/W. The hole injection layer 4A composed of tungsten oxide having a nanocrystal structure is formed under these film forming conditions.

(Another Example of Steps from Formation of Anodes to Formation of Banks)

Next, with reference to FIGS. 30A through 31C, another example of the process from the formation of anodes to the formation of banks is described. Note that in this process, an example of a structure for forming a planarizing layer 17 on the surface of the substrate 10 is described.

Figure 30A:
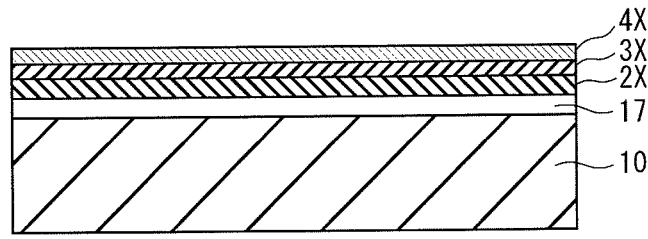
FIGS. 30A through 30D are process drawings illustrating a method of manufacturing the organic EL element 1C pertaining to Embodiment 2.

First, a planarizing layer 17 is formed on the substrate 10 from an insulating resin material such as polyimide or acrylic. With the vapor deposition method, the following three layers are layered sequentially on the planarizing layer 17: an Al alloy thin film 2X, an IZO thin film 3X, and a thin film (tungsten oxide film) 4X (FIG. 30A). ACL (aluminum-cobalt-lanthanum) material, for example, is used as the Al alloy material.

Figure 30B:
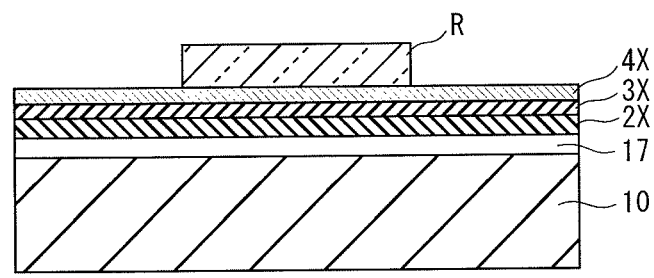

Next, a resist pattern R is formed by photolithography in the regions in which the three layers for the anode 2, the IZO layer 3A, and the hole injection layer 4B are formed (FIG. 30B).

Figure 30C:
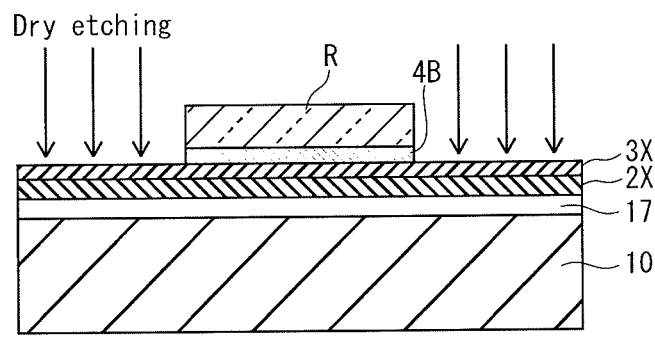

Next, patterning is performed by dry etching (D/E) of the regions of the thin film 4X not covered by the resist pattern R (FIG. 30C). During this dry etching, only the thin film 4X is selectively etched with either a mixture of fluorinated gas and N$_2$ gas, or a mixture of fluorinated gas and O$_2$ gas. The following is an example of specific setting conditions for the dry etching.

[Conditions for Dry Etching]
Target of treatment: tungsten oxide film
Etching gas: fluorine-containing gas (SF$_6$, CF$_4$CHF$_3$)
Mixed gas: O$_2$, N$_2$ Mixed gas ratio: $CF_4:O_2=160:40$
Supplied power: Source 500 W, Bias 400 W
Pressure: Between 10 mTorr and 50 mTorr
Etching temperature: Room temperature Performing the above dry etching yields the hole injection layer 4B. Subsequently, ashing is performed with $O_2$ gas to facilitate removal of the resist pattern during the following wet etching (W/E) process.

Figure 30D:
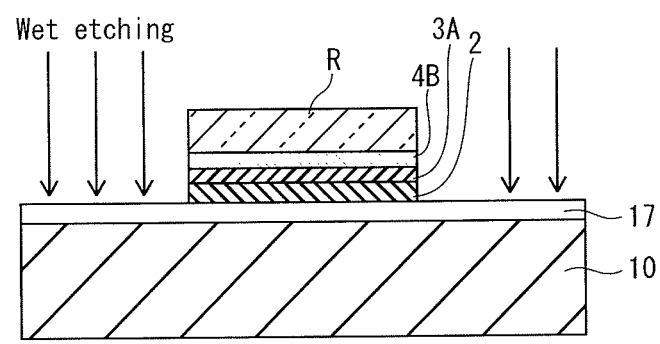

Via wet etching, the regions of the IZO thin film 3X and the Al alloy thin film 2X not covered by the resist pattern R are patterned (FIG. 30D). Using a mixed solution of containing nitric acid, phosphoric acid, acetic acid, and water as the etchant, wet etching is performed simultaneously on both the IZO thin film 3X and the Al alloy thin film 2X.

The following is an example of specific setting conditions for the wet etching.

[Conditions for Wet Etching]

Target of treatment: IZO thin film and Al alloy thin film
Etchant: mixed aqueous solution of nitric acid, phosphoric acid, and acetic acid
Blend ratio of solvent: not specified (mixing is possible under typical conditions)
Etching temperature: lower than room temperature Note that to perform the wet etching well, it is desirable that the IZO thin film, which is the uppermost layer, be a thickness of 20 nm or less. This is because the amount of side etching grows large if the thickness exceeds 20 nm.

Instead of forming an IZO layer from an IZO thin film, an ITO layer may of course be formed from an ITO thin film.

Figure 31A:
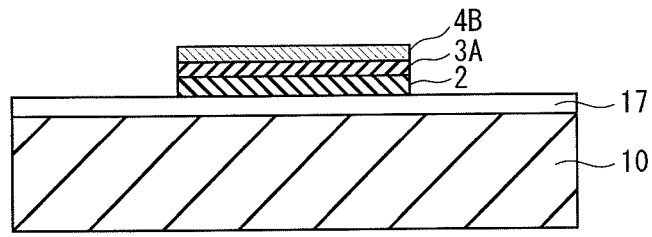
FIGS. 31A through 31C are process drawings illustrating a method of manufacturing the organic EL element 1C relating to a modification of Embodiment 2.

The anode 2 and the IZO layer 3A are formed through the above processes. Subsequently, the resist pattern R is removed through a resist removing step, yielding a patterned triple layer structure composed of the anode 2, the IZO layer 3A, and the hole injection layer 4B (FIG. 31A). During this process, the hole injection layer 4B is formed in locations corresponding to the anode 2 and the IZO layer 3A.

Figure 31B:
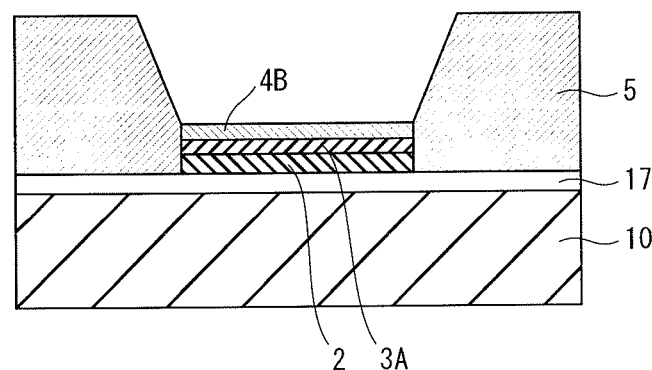

Next, the bank material layer 5X is formed on the exposed surface of the planarizing layer 17 (not shown in the figures) and is patterned to form the banks 5 (FIG. 31B).

Figure 31C:
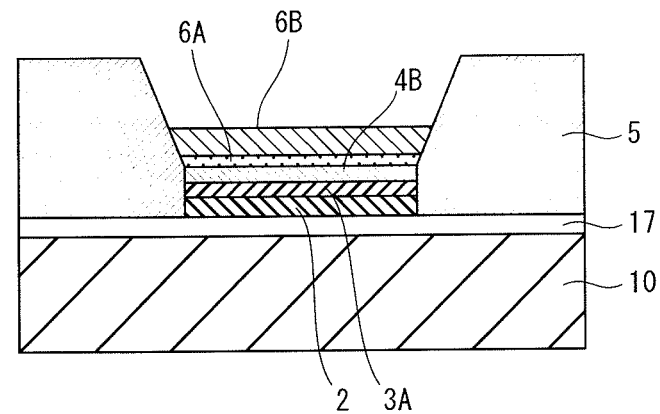

Note that with the above-described method, the buffer layers 6A and the light-emitting layers 6B can be formed by adjusting the predetermined ink, dripping the ink successively into regions partitioned by the banks 5, and drying the ink (FIG. 31C).

<Experiments and Analysis of Film Forming Conditions for Hole Injection Layers 4A and 4B>

(Film Forming Conditions for Hole Injection Layers 4A and 4B)

In Embodiment 2, the tungsten oxide that constitutes each of the hole injection layers 4A and 4B is formed under predetermined film forming conditions to allow the nanocrystal structure to be caused to exist on purpose in the hole injection layers 4A and 4B. This results in improvement in hole conductivity efficiency, thereby enabling the organic EL element 1C to be driven at a low voltage. Details on these predetermined film forming conditions are described below.

The hole injection layers 4A and 4B were formed using a DC magnetron sputtering device, with metal tungsten as the sputtering target. The substrate temperature was not controlled. Use of a reactive sputtering method in which the sputtering gas is argon gas, the reactive gas is oxygen gas, and equivalent amount of each gas are released, is considered to be desirable for film formation. Note that the method of forming the hole injection layers 4A and 4B is not limited to these conditions. Well-known methods other than sputtering may be used for film formation, such as the vapor deposition method or CVD.

In order to form the hole injection layers 4A and 4B composed of tungsten oxide having a nanocrystal structure, the atoms and clusters that hit the substrate need to reach the substrate with a kinetic energy low enough so as not to damage the orderly structure already formed on the substrate and to be able to bond together in an orderly manner while moving along substrate. It is therefore desirable to use as low a film forming rate as possible.

Here, it could be assumed that, in accordance with results of experiments which are described later, a film forming condition with use of the reactive sputtering method that can realize the low film formation rate is the above conditions (1) to (4). The inventors obtained the hole injection layers, which are each composed of tungsten oxide having the nanocrystal structure, under the film forming conditions (1) to (4), and proved the effects of reduction in driving voltage of the organic EL element.

With respect to condition (1), note that while the upper limit of the total pressure in the experiment described below is 4.7 Pa, the inventors confirmed separately that a similar trend is exhibited at least up to 7.0 Pa.

Furthermore, with respect to condition (2), while the partial pressure of the oxygen gas with respect to the total pressure is set to 50%, the inventors confirmed the reduction in driving voltage at least in the range between 50% and 70%.

A further explanation of condition (4) is now provided. When the amounts of argon gas and oxygen gas that are released are equivalent, it is assumed that film properties are determined by the input power density and the total pressure. The input power density in condition (3) changes both the number and kinetic energy of tungsten atoms and tungsten clusters released from the target by sputtering. In other words, lowering the input power density reduces the number of tungsten atoms released from the sputtering target and also lowers the kinetic energy. As a result, less tungsten reaches the substrate, arriving with a low kinetic energy. Hence, lowering the input power density should allow for film formation at a low film forming rate. Furthermore, the total pressure in condition (1) changes the mean free path of the tungsten atoms and tungsten clusters released from the sputtering target. In other words, if the total pressure is high, the tungsten atoms and tungsten clusters have a higher probability of repeatedly colliding with the gas in the chamber before reaching the substrate. The directions of arrival of the tungsten atoms and tungsten clusters thus become scattered, and kinetic energy is lost due to the collisions. As a result, less tungsten reaches the substrate, arriving with a low kinetic energy. Hence, raising the total pressure should allow for film formation at a low film forming rate.

It is considered, however, that there are limits to changing the film forming rate by independently controlling the input power density and the total pressure. Accordingly, the value yielded by dividing the total pressure by the input power density was adopted as a new parameter determining the film forming rate. This new parameter constitutes film forming condition (4).

Specifically, the above parameter (total pressure/power density) for forming the nanocrystal structure of Embodiment 2 needs to be 0.78 Pa·cm$^2$/W or greater in the range of the experiment described below. It is considered that the parameter needs to be greater than 0.7 Pa·cm$^2$/W. For even more reliable film formation, a value of 0.8 Pa·cm$^2$/W or greater is desirable. Also, the upper limit for the above parameter is 3.13 Pa·cm$^2$/W in the range of the experiment described below. Is considered acceptable for this value to be smaller than 3.2 Pa·cm$^2$/W. For even more reliable film formation, a value of 3.1 Pa·cm$^2$/W or less is desirable. Based on the above analysis of the film forming rate and the nanocrystal structure, however, a lower film forming rate is considered more desirable, and therefore restrictions are not necessarily placed on the upper limit. Film forming condition (4) was determined based on the above considerations.

The inventors confirmed in a separate experiment that for higher values of the above parameter, the film forming rate is lower, whereas for lower values of the above parameter, the film forming rate is higher.

Next, the inventors confirmed the validity of the above film forming conditions through experiments.

Figure 26:
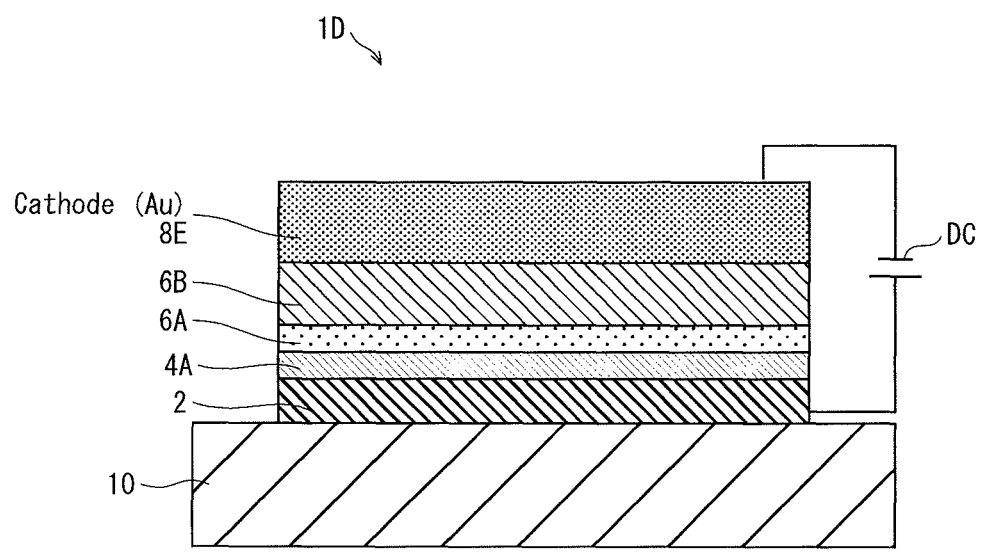
FIG. 26 is a schematic cross-sectional view illustrating a structure of a hole-only device 1D.

First, hole-only devices 1D shown in FIG. 26 were manufactured as assessment devices in order to assess the degree to which the hole conduction efficiency of the hole injection layers 4A and 4B depends on film forming conditions. As described in Embodiment 1, carries flowing in a hole-only device can be considered entirely to be holes. A hole-only device is therefore desirable when assessing hole injection efficiency.

Figure 25:
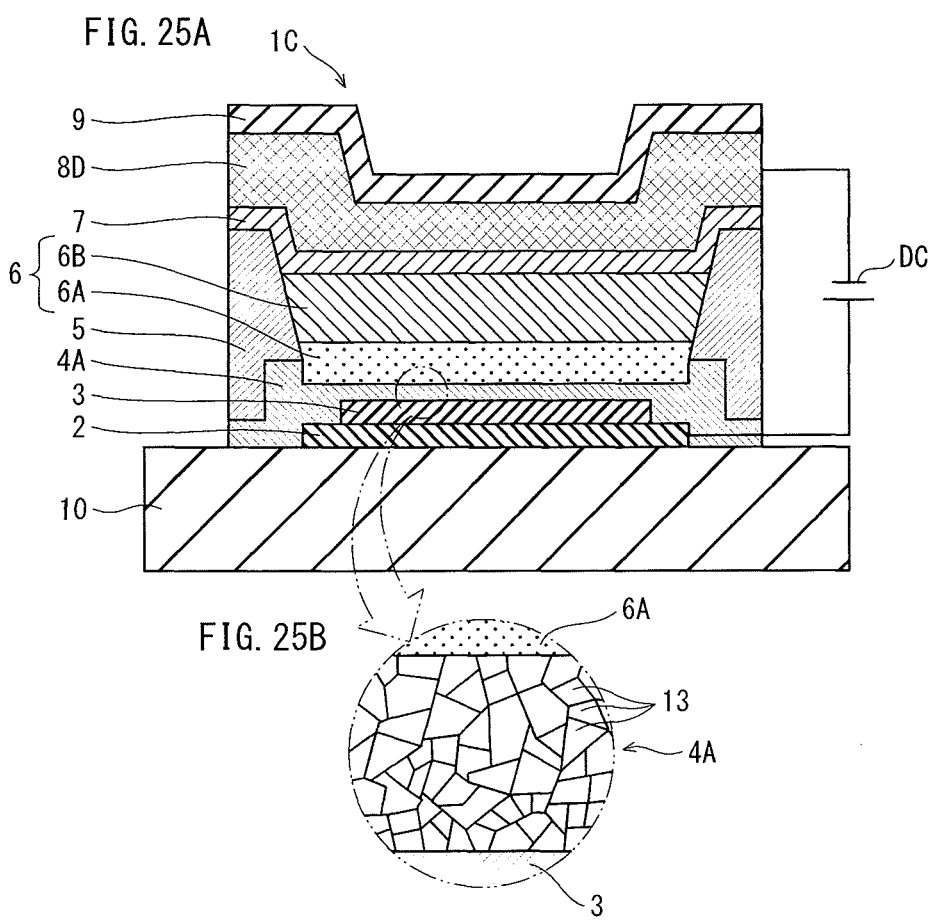
FIG. 25A is a cross-section diagram schematically illustrating the structure of an organic EL element 1C pertaining to Embodiment 2.
FIG. 25B is a partially expanded view near a hole injection layer 4A.

As illustrated in FIG. 26, the hole-only devices 1D were obtained by changing the organic EL element 1C illustrated in FIG. 25 to have the structure of an assessment device where the ITO cathode 8D is replaced with the cathode 8E composed of gold, the anode 2 is omitted and the ITO layer 3 is set as an anode, and the electron injection layer 7 and the banks 5 are omitted. More specifically, the hole-only devices 1D were manufactured by the above manufacturing method. The hole injection layer 4A, the buffer layer 6A composed of TFB, the light-emitting layer 6B composed of F8BT, and the cathode 8E composed of gold have respective film thicknesses of 30 nm, 20 nm, 70 nm, and 100 nm.

In the manufacturing of the hole-only devices 1D, the hole injection layers 4A were formed by the reactive sputtering method in a DC magnetron sputtering device. The gas introduced into the chamber was composed of at least one of argon gas and oxygen gas, and the sputtering target used was metal tungsten. Further, no control was performed on the substrate temperature, while control of the total gas pressure within the chamber was performed by adjusting the flow amount of the respective gases. The argon partial gas and the oxygen partial gas within the chamber are each 50%.

Hole-only devices 1D were manufactured with a hole injection layer 4A formed under five different film forming conditions α through 6 shown in Table 8.

Hereinafter, the hole-only device 1D formed under film forming conditions α is referred to as HOD-α, the hole-only device 1D formed under film forming conditions β is referred to as HOD-β, the hole-only device 1D formed under film forming conditions γ is referred to as HOD-γ, the hole-only device 1D formed under film forming conditions δ is referred to as HOD-δ, and the hole-only device 1D formed under film forming conditions ε is referred to as HOD-ε.

TABLE 8

| Film Forming Conditions | Total Pressure (Pa) | Oxygen Partial Pressure (%) | Input Power Density (W/cm$^2$) | Total Pressure/ Power Density (Pa · cm$^2$/W) |
|---|---|---|---|---|
| α | 4.70 | 50 | 1.50 | 3.13 |
| β | 4.70 | 50 | 3.00 | 1.57 |
| γ | 4.70 | 50 | 6.00 | 0.78 |
| δ | 2.35 | 50 | 1.50 | 1.57 |
| ε | 2.35 | 50 | 6.00 | 0.39 |

The completed hole-only devices 1D were then connected to a direct current power supply DC, and voltage was applied thereto. Furthermore, by changing the applied voltage, an electric current value per unit surface area (electric current density) was calculated for different voltages.

Figure 32:
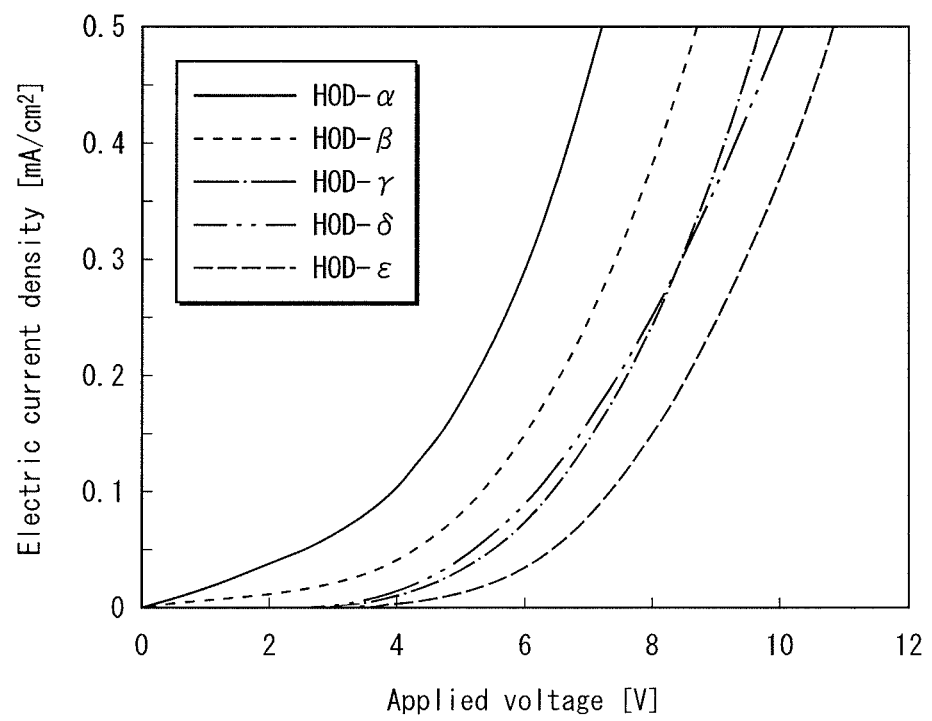
FIG. 32 is a device characteristics diagram showing relation curves illustrating relations between applied voltage and electric current density of hole-only devices.

FIG. 32 is a diagram illustrating the relationship between the voltage applied to the hole-only devices 1D and the electric current density. In FIG. 32, the vertical axis indicates electric current density (mA/cm$^2$), whereas the horizontal axis indicates applied voltage (V).

Table 9 shows the driving voltage for each of the hole-only devices 1D. Note that the expression "driving voltage" refers to the voltage applied when the electric current density value is 0.3 mA/cm$^2$.

It can be inferred that as the driving voltage grows smaller, the efficiency of hole injection from the hole injection layer 4A is higher. This is because the components of each hole-only device 1D other than the hole injection layer 4A have the same structure. Therefore, other than the hole injection layer 4, the hole injection barrier between two adjacent layers and the hole injection efficiency of each layer can be assumed to be constant. Also, the characteristics of the elements are thought to be affected more by the hole conduction efficiency of the hole injection layer 4A than by the hole injection efficiency from the hole injection layer 4A to the buffer layer 6A. Furthermore, similarly as described in Embodiment 1, it was confirmed through another experiment that the ITO layer 3 and the hole injection layer 4A in this experiment are in Schottky ohmic contact of the present invention. Accordingly, the differences in driving voltage depending on the conditions for forming the hole injection layer 4A in each hole-only device 1D strongly reflect the difference in hole conduction efficiency of the hole injection layer 4A.

TABLE 9

| Name of Sample | Driving Voltage (V) |
|---|---|
| HOD-α | 6.25 |
| HOD-β | 7.50 |
| HOD-γ | 8.50 |
| HOD-δ | 8.50 |
| HOD-ε | 9.49 |

As shown in Table 9 and FIG. 32, the electric current density-applied voltage curve rises the slowest for the HOD-ε, which has the highest driving voltage among the elements. Accordingly, it is inferred that HOD-α, HOD-β, HOD-γ, and HOD-δ have superior hole conduction efficiency as compared to HOD-ε, which is manufactured under the film forming conditions with a low total pressure and the maximum input power density.

The observation has been made of the hole conduction efficiency of the hole injection layer 4A in each of the hole-only devices 1D. However, here it should be emphasized that, with respect to essential parts relating to the characteristics of the elements, the hole-only devices 1D have the same structure as the organic EL element 1C other than the cathode 8E. Therefore, the dependence of the hole conduction efficiency of the hole injection layer 4A on the film forming conditions under which the hole injection layer 4A is formed is basically the same in the organic EL element 1C and in the hole-only devices 1D.

To confirm this point, the inventors manufactured organic EL elements 1C using hole injection layers 4A formed under the film forming conditions α through ε. Hereinafter, the organic EL element 1C formed under film forming conditions α is referred to as BPD-α, the organic EL element 1C formed under film forming conditions β is referred to as BPD-β, the organic EL element 1C formed under film forming conditions y is referred to as BPD-γ, the organic EL element 1C formed under film forming conditions δ is referred to as BPD-δ, and the organic EL element 1C formed under film forming conditions ε is referred to as BPD-ε.

The organic EL elements 1C were obtained by changing the organic EL element 1C illustrated in FIG. 25 to have the structure of an assessment device where the cathode 8D of ITO is replaced with a cathode of aluminum, the anode 2 is omitted and the ITO layer 3 is set as an anode, and the banks 5 are omitted. More specifically, the organic EL elements 1C were manufactured by the above manufacturing method. The hole injection layer 4A, the buffer layer 6A composed of TFB, the light-emitting layer 6B composed of F8BT, the electron injection layer 7 composed of a barium layer, and the cathode 8E composed of aluminum have respective film thicknesses of 30 nm, 20 nm, 70 nm, 5 nm, and 100 nm.

The organic EL elements 1C prepared under film forming conditions α through ε were then connected to a direct current power supply DC, and voltage was applied thereto. Furthermore, by changing the applied voltage, an electric current value per unit surface area (electric current density) was calculated for different voltages.

Figure 33:
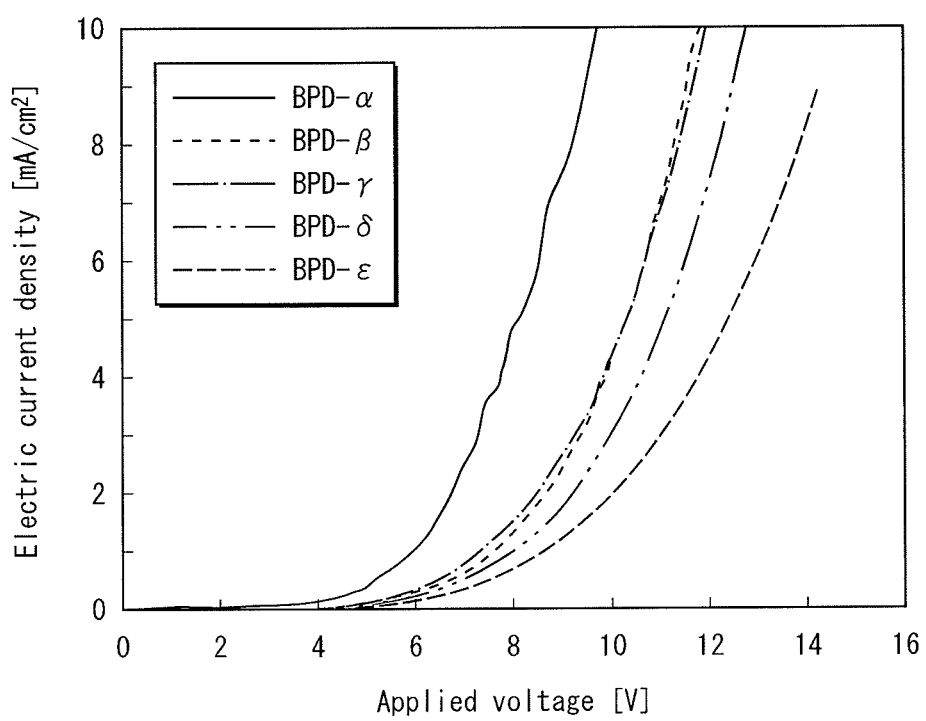
FIG. 33 is a device characteristics diagram showing relation curves illustrating relations between applied voltage and electric current density of organic EL elements.

FIG. 33 is a diagram illustrating the relationship between the voltage applied to the organic EL elements 1C and the electric current density. In FIG. 33, the vertical axis indicates electric current density ($mA/cm^2$), whereas the horizontal axis indicates applied voltage (V).

Table 10 shows the driving voltage for each of the organic EL elements 1C. Note that the expression "driving voltage" refers to the voltage applied when the electric current density value is 8 $mA/cm^2$.

TABLE 10

| Name of Sample | Driving Voltage (V) |
|---|---|
| BPD-α | 9.25 |
| BPD-β | 11.25 |
| BPD-γ | 11.50 |
| BPD-δ | 12.25 |
| BPD-ε | 14.00 |

As shown in Table 10 and FIG. 33, the electric current density-applied voltage curve rises the slowest for the BDP-ε, which has the highest driving voltage among the elements. This trend is similar to the trend observed in the hole-only devices HOD-α through HOD-ε, which were prepared under the same respective film forming conditions.

From the above results, it was confirmed that in the organic EL elements 1C as well, the hole conduction efficiency of the hole injection layer 4A depends on the film forming conditions, similar to the case of the hole-only devices 1D. Specifically, it is inferred that in the organic EL elements 1C as well, forming the film within the range of the film forming conditions α, β, γ, and δ yields the improvement in hole conduction efficiency of the hole injection layer 4A, thereby achieving a low driving voltage.

Note that among the above conditions, the condition concerning input power is represented in terms of input power density, as indicated in Table 8. When using a DC magnetron sputtering device that is different from the one used in the present experiment, a hole injection layer 4A composed of tungsten oxide with an excellent hole conduction efficiency, as in the present experiment, can be yielded by adjusting the input power so that the input power density fulfills the above condition. Conditions on total pressure and oxygen partial pressure, on the other hand, are independent of the device.

Additionally, as already explained above, no intentional adjustment of the substrate temperature was performed while forming the hole injection layer 4A by applying the reactive sputtering method, and during the experiment, the sputtering device was placed under room temperature. Therefore, the substrate was at room temperature at least before the forming of the hole injection layer 4A. However, while forming of the hole injection layer 4A is being performed, there is a possibility that the substrate temperature may rise by several tens of degrees Celsius.

Note that through a separate experiment, the inventors confirmed that when the oxygen partial pressure is raised too high, the driving voltage conversely ends up rising. Accordingly, it is desirable for the oxygen partial pressure to be between 50% and 70%.

The above experiment results indicate that for a low driving voltage, an organic EL element provided with a hole injection layer manufactured under film forming conditions α, β, γ, and δ is desirable, and that an organic EL element manufactured under film forming conditions α and β is even more desirable. Hereinafter, an organic EL display panel with a light-emitting cell that is an organic EL element provided with a hole injection layer manufactured under film forming conditions α, β, γ, or δ is the target of the present invention.

(Chemical State of Tungsten of Hole Injection Layer 4A)

Tungsten atoms with a valence of five exist in the tungsten oxide layer constituting each of the hole injection layers 4A and 4B of the organic EL element 1C of Embodiment 2. These tungsten atoms with a valence of five are formed by adjusting the film forming conditions as shown in the above experiments. Details are provided below.

In order to confirm the chemical state of the tungsten oxide layer formed under the above film forming conditions α through ε, a hard X-ray photoelectron spectroscopy measurement (hereinafter simply referred to as "HXPS measurement") experiment was performed. Typically, the optical spectrum yielded by hard X-ray photoelectron spectroscopy (hereinafter simply referred to as "HXPS spectrum") reveals information for up to a film thickness of a few dozen nanometers in the object being measured. In other words, bulk information on the film is obtained, and the measurement depth is determined by the angle between the normal line to the surface and the direction in which the photoelectron is detected. In the present experiment, this angle was adjusted to be 40° to allow for observation of the valence state in the entire direction of thickness of the tungsten oxide layer.

The conditions under which the HXPS measurement are conducted are as follows. Note that no charge-up occurred during measurement.

(HXPS Measurement Conditions)
BL46XU beamline of SPring-8 was used.
Light source: Synchrotron radiation (energy of 8 keV)
Bias: None
Electron emission angle: Angle of 40° with normal line to the substrate
Interval between measurement points: 0.05 eV Samples for HXPS measurement were manufactured under the film forming conditions α through ε shown in Table 8. A tungsten oxide layer (considered to be the hole injection layer 4A) was formed to a thickness of 30 nm by the above reactive sputtering method on an ITO substrate formed on glass. The result was taken as the sample for HXPS measurement. The samples for HXPS measurement manufactured under the film forming conditions α, β, γ, δ, and ε are hereinafter respectively referred to as sample α, sample β, sample γ, sample δ, and sample ε.

Figure 34:
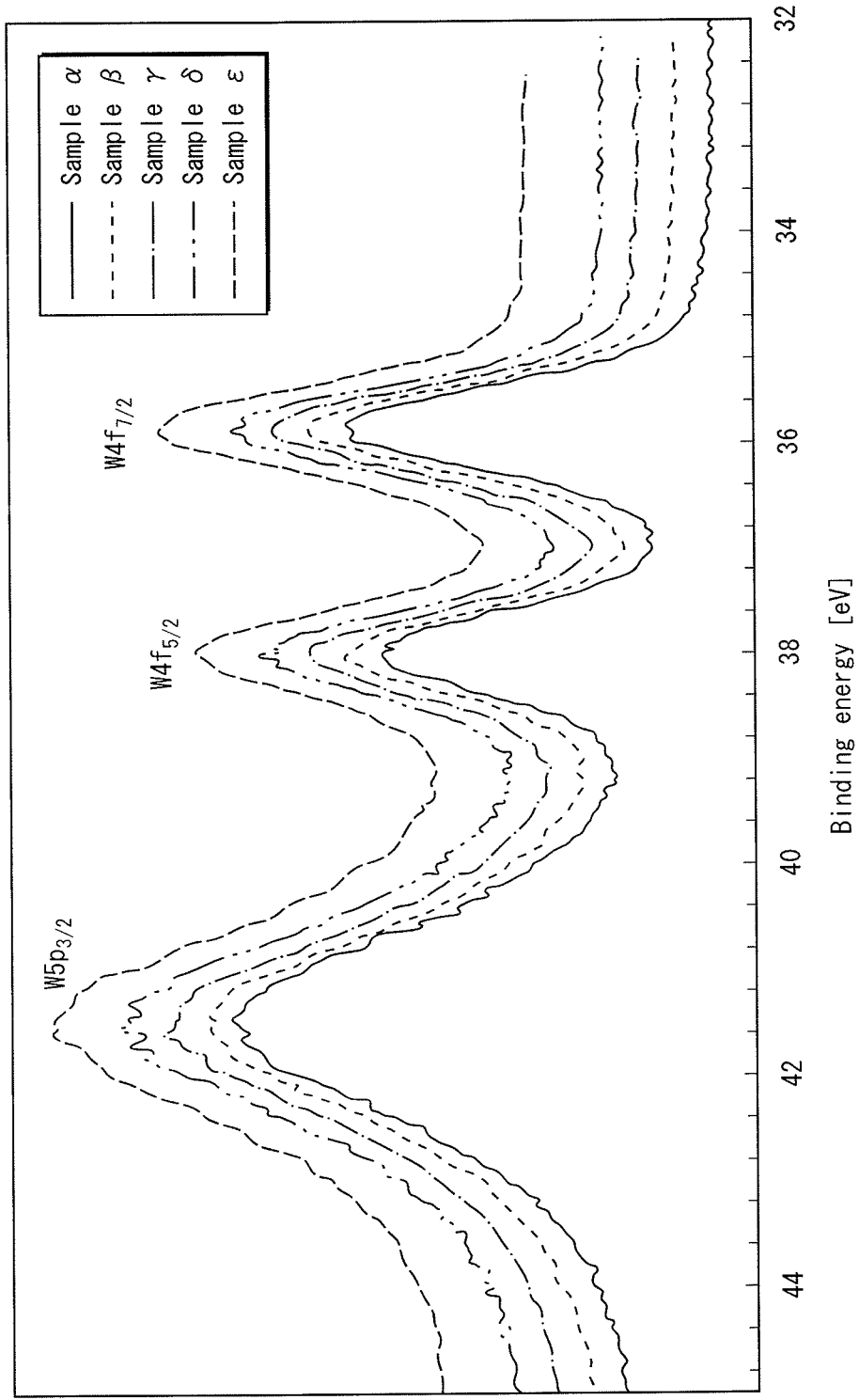
FIG. 34 is a diagram illustrating spectra belonging to $W5p_{3/2}$, $W4f_{5/2}$, and $W4f_{7/2}$, as obtained by HXPS measurement of a tungsten oxide layer.

HXPS measurement was performed on the hole injection layer 4A in each of the samples α through ε. FIG. 34 is a diagram illustrating the resulting spectra. The origin of the horizontal axis, which indicates binding energy, corresponds to the Fermi level of the ITO substrate, and the left direction with respect to the origin is positive. The vertical axis indicates photoelectron intensity.

Three peaks can be observed in the binding energy regions shown in FIG. 34. From left to right in FIG. 34, the peaks belong to the following energy levels of tungsten: $5p_{3/2}$ ($W5p_{3/2}$), $4f_{5/2}$ ($W4f_{5/2}$), and $4f_{7/2}$ ($W4f_{7/2}$).

Next, peak fitting analysis was performed on the peaks belonging to $W5p_{3/2}$, $W4f_{5/2}$, and $W4f_{7/2}$ in the spectrum of each sample, using XPSPEAK 4.1, which is software for photoelectron spectroscopy analysis. First, based on the photoionization cross-section for the hard X-ray energy, the area intensity ratio of each component corresponding to $W4f_{7/2}$, $W4f_{5/2}$, and $W5p_{3/2}$ was fixed as follows: $W4f_{7/2}$:$W4f_{5/2}$: $W5p_{3/2}$=4:3:10.5. Next, as shown in Table 11, the position of the peak top of the $W4f_{7/2}$ component with a valence of six ($W^{6+}4f_{7/2}$) was aligned with a binding energy of 35.7 eV. The location of the peak top and the initial value of the full width at half maximum were set within the range shown in Table 11 for the component belonging to the surface photoelectrons of $W5p_{3/2}$, $W4f_{5/2}$, $W4f_{7/2}$, the component belonging to the valence of six, and the component belonging to the valence of five. In the Gaussian-Lorentzian mixed function used for fitting of the components, the initial value of the ratio in the Lorentzian function was also set within the range indicated in Table 11. Furthermore, the initial value of the area intensity of each component was set freely while maintaining the above intensity ratio. Optimization calculations were performed a maximum of 100 times by varying the area intensity for each component while maintaining the above intensity ratio, and by varying the peak location, the full width at half maximum, and the ratio in the Lorentzian function for each component within the ranges indicated in Table 11. These calculations yielded the final peak fitting analysis results.

belonging to the energy levels of $W5p_{3/2}$, $W4f_{5/2}$, and $W4f_{7/2}$ can all be described well by the sum of the component (surface) belonging to the photoelectrons from the surface of the hole injection layer 4A and the component ($W^{6+}$) belonging to a valence of six, as well as the component ($W^{5+}$) belonging to a valence of five, included within the hole injection layer 4A.

Figure 35A:
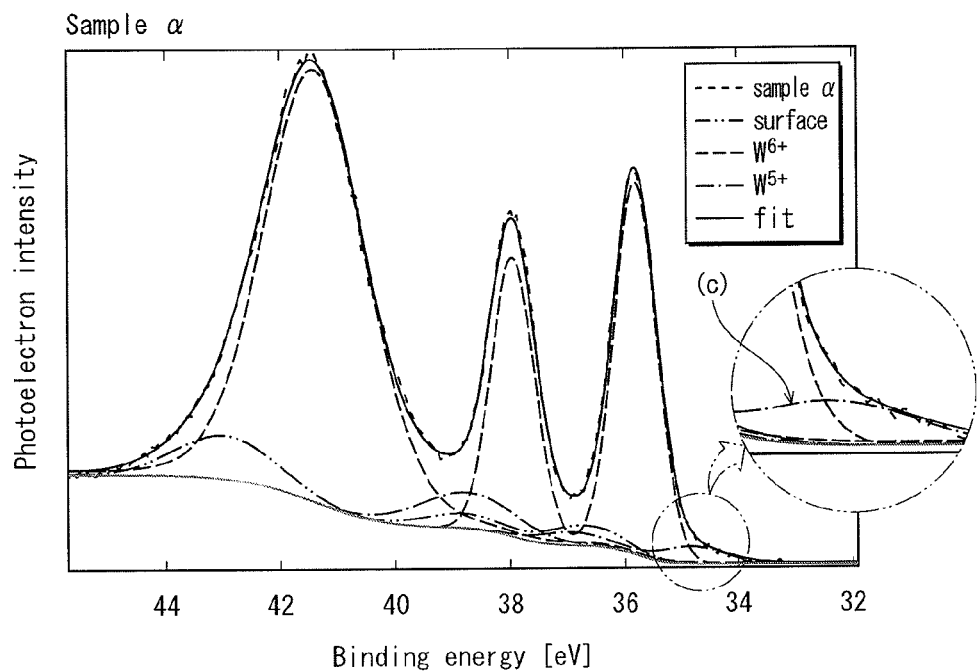
FIG. 35A shows peak fitting analysis results for sample α in FIG. 34.
Figure 35B:
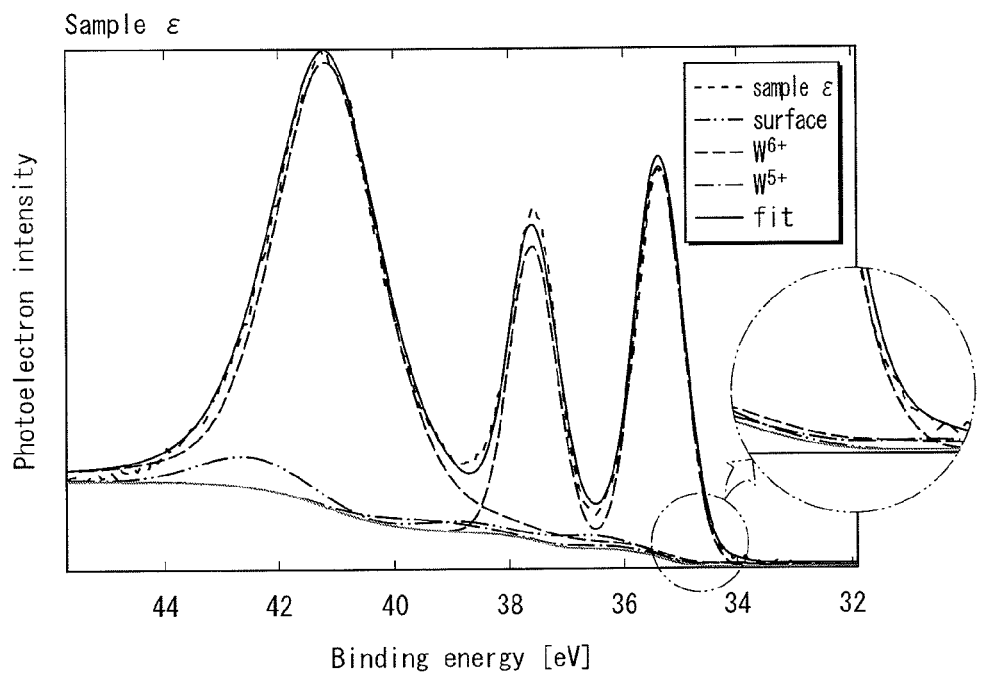
FIG. 35B shows peak fitting analysis results for sample ε.

Furthermore, in the binding energy region that is between 0.3 eV and 1.8 eV lower than the component belonging to a valence of six ($W^{6+}$) in the sample α of FIG. 35A, the existence of a corresponding component belonging to a valence of five ($W^{5+}$) can be confirmed. By contrast, in the sample ε of FIG. 35B, no such component belonging to a valence of five can be confirmed. For the purposes of illustration, the circled region in each of FIGS. 35A and 35B is shown enlarged to the right. As seen in the enlarged diagrams, a ridge in the alternating long and short dashed line for $W^{5+}$ (labeled (c) in FIG. 35A) can be clearly observed for the sample α, but no such ridge can be observed for the sample ε. Furthermore, looking more closely at the enlarged diagrams, the solid line (fit), which is the sum of the components resulting from peak fitting, exhibits a large "shift" in the sample α with respect to the dotted line ($W^{6+}$), which corresponds only to the component with a valence of six. In the sample ε, however, the "shift" is not as large as in the sample α. In other words, the "shift" in sample α can be inferred as suggestive of the existence of tungsten atoms with a valence of five.

Next, the ratio of tungsten atoms with a valence of five to tungsten atoms with a valence of six, i.e. $W^{5+}/W^{6+}$, was calculated for the samples α through ε. This ratio was calculated by dividing the area intensity of the component belonging to a valence of five by the area intensity of the component belonging to a valence of six in the peak fitting analysis results for each sample.

TABLE 11

| | $W5p_{3/2}$ | | | $W4f_{5/2}$ | | | $W4f_{7/2}$ | | |
|---|---|---|---|---|---|---|---|---|---|
| Corresponding peak | $W^{sur}5p_{3/2}$ | $W^{6+}5p_{3/2}$ | $W^{5+}5p_{3/2}$ | $W^{sur}4f_{5/2}$ | $W^{6+}4f_{5/2}$ | $W^{5+}4f_{5/2}$ | $W^{sur}4f_{7/2}$ | $W^{6+}4f_{7/2}$ | $W^{5+}4f_{7/2}$ |
| Peak Energy (eV) | 42.30 to 43.07 | 41.20 to 41.30 | 39.70 to 38.65 | 38.75 to 39.13 | 37.80 to 37.85 | 36.72 to 36.95 | 36.60 to 36.90 | 35.70 (reference) | 34.60 to 34.80 |
| Value of full width at half maximum (eV) | 1.73 to 2.40 | 1.93 to 2.24 | 1.8 to 2.86 | 1.40 to 1.60 | 0.87 to 0.98 | 0.90 to 1.50 | 1.40 to 1.60 | 0.87 to 0.98 | 0.90 to 1.50 |
| Lorentzian function ratio (%) | 0 | 13 to 40 | 0 to 25 | 0 to 57 | 0 to 6 | 0 to 20 | 0 to 57 | 0 to 6 | 0 to 20 |

FIGS. 35A and 35B show the final peak fitting analysis results. FIG. 35A shows the analysis results for the sample α, and FIG. 35B shows the analysis results for the sample ε.

In both FIGS. 35A and 35B, the dashed lines (sample α, sample ε) are actual measured spectra (corresponding to the spectra in FIG. 34), the lines with alternate long and two short dashes (surface) are the component belonging to the surface photoelectrons ($W^{sur}5p_{3/2}$, $W^{sur}4f_{5/2}$, $W^{sur}4f_{7/2}$), the dotted lines ($W^{6+}$) are the component belonging to the valence of six ($W^{6+}5p_{3/2}$, $W^{6+}4f_{5/2}$, $W^{6+}4f_{7/2}$), and the alternating long and short dashed lines ($W^{5+}$) are the component belonging to the valence of five ($W^{5+}5p_{3/2}$, $W^{5+}4f_{5/2}$, $W^{5+}4f_{7/2}$). The solid lines (fit) are the spectra yielded by summing the components indicated by the lines with alternate long and two short dashes and the alternating long and short dashed lines.

The spectra for the dashed lines and the solid lines in FIGS. 35A and 35B match extremely well. In other words, the peaks Note that the area intensity ratio of the component belonging to a valence of five to the component belonging to a valence of six should be the same for $W5p_{3/2}$, $W4f_{5/2}$, and $W4f_{7/2}$ based on the principle of measurement. In the present experiment, it was confirmed that these values are indeed the same. Therefore, the following analysis only refers to $W4f_{7/2}$.

Table 12 shows the ratio $W^{5+}/W^{6+}$ in $W4f_{7/2}$ for the samples α through ε.

TABLE 12

| Name of Sample | $W^{5+}/W^{6+}$ |
|---|---|
| Sample α | 7.4% |
| Sample β | 6.1% |
| Sample γ | 3.2% |
| Sample δ | 3.2% |
| Sample ε | 1.8% |

Based on the values of $W^{5+}/W^{6+}$ shown in Table 12, the sample with the largest ratio of tungsten atoms with a valence of five in the hole injection layer 4A is sample α. The ratio then tends to decrease in the order of sample β, sample γ, and sample δ, with sample ε having the lowest ratio. Comparing the results from Table 10 and Table 12, it is clear that as the ratio of tungsten atoms with a valence of five in the hole injection layer 4A increases, the driving voltage of the organic EL elements tends to be lower.

Using the above HXPS measurement to calculate the composition ratio of tungsten to oxygen, it was confirmed that the ratio of the number of tungsten atoms to the number of oxygen atoms in the hole injection layer 4A was nearly 1:3 on average throughout the layer in all of the samples α through ε. Based on this ratio, it can be assumed that in all of the samples α through ε, nearly the entire hole injection layer 4A has a basic structure with atomic coordinates based on tungsten trioxide. Note that the inventors performed X-ray absorption fine structure (XAFS) measurement with respect to the hole injection layer 4A of each of the samples α through ε and confirmed that the above-mentioned basic structure is formed therein.

(Electronic State of Hole Injection Layer 4A)

The hole injection layer 4A composed of tungsten oxide of Embodiment 2 has an occupied energy level near the Fermi surface, like the hole injection layer 4 of Embodiment 1. Due to the action of the occupied energy level, the interface energy level is aligned between the hole injection layer 4A and the buffer layer 6A, thereby reducing the hole injection barrier between the hole injection layer 4A and the buffer layer 6A. As a result, the organic EL element of Embodiment 2 can be driven at a low voltage.

As described below, this occupied energy level near the Fermi surface exists not only at the above interface, but also throughout the hole injection layer 4A at the grain boundaries of the nanocrystals, thus serving as a conduction path for holes. This provides the hole injection layer 4A with an excellent hole conduction efficiency, so that the organic EL element of Embodiment 2 can be driven at a lower voltage.

An experiment to confirm the existence of the occupied energy level near the Fermi surface was performed using UPS measurement on the hole injection layer 4A in each of the above samples α through ε.

The forming of the hole injection layer 4A of each of the sample devices was performed inside a sputtering device. Then, to prevent atmospheric exposure, the samples ε through ε were transported to a glovebox which was connected to the sputtering device and which was filled with nitrogen gas. Subsequently, the sample devices were sealed inside transfer vessels in the glovebox, and were mounted on a photoelectron spectroscopy device. After formation, the hole injection layer 4A was therefore not exposed to the atmosphere before UPS measurement was performed.

The conditions under which the UPS measurement was conducted are as follows. Note that charge-up did not occur during measurement.

Figure 36:
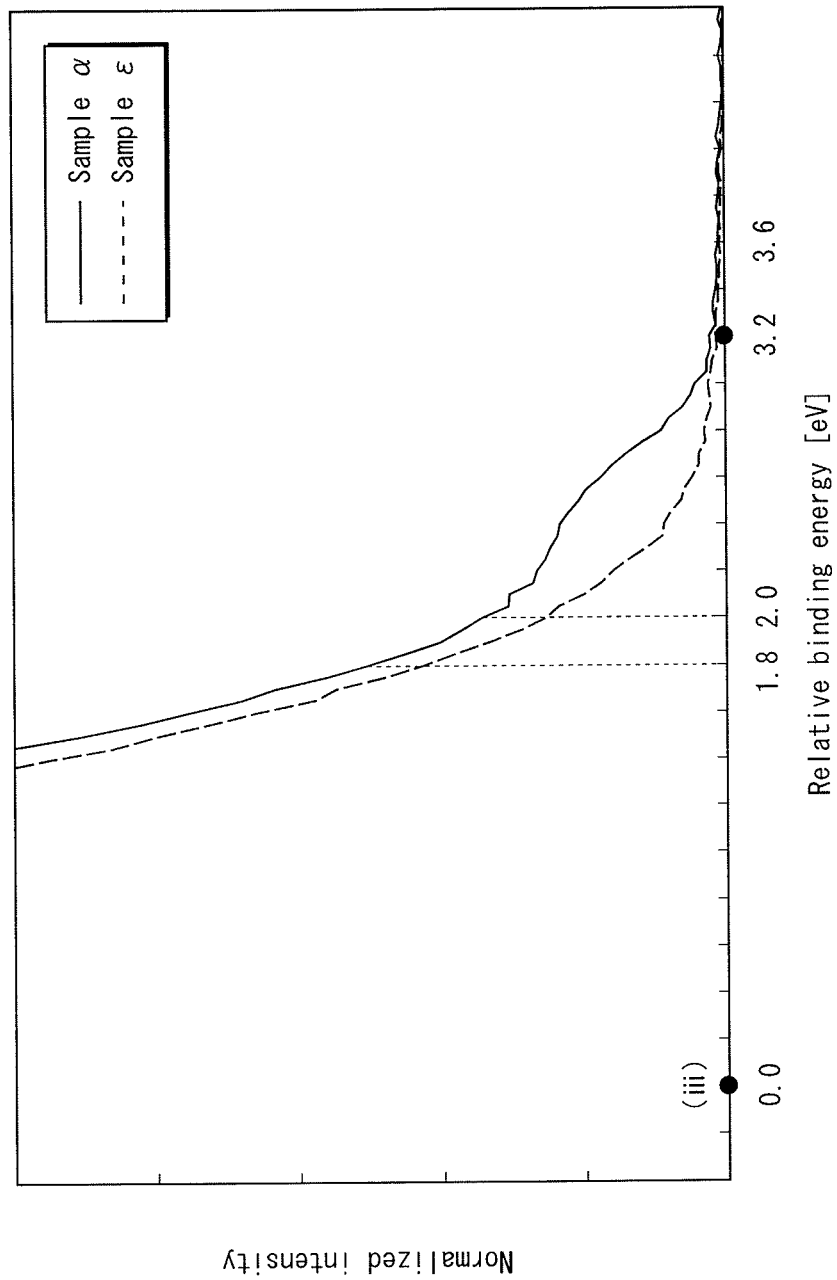
FIG. 36 is a diagram illustrating UPS spectra of a tungsten oxide layer.

Light source: He I line
Bias: None
Electron emission angle: Direction of normal line to the substrate
Interval between measurement points: 0.05 eV FIG. 36 is a diagram illustrating a UPS spectrum of the hole injection layer 4A in the samples α and ε within area y. In FIG. 36, labels such as area y and point (iii) are as described in Embodiment 1, and the horizontal axis indicates relative binding energy with point (iii) as the origin.

As illustrated in FIG. 36, the spectral protrusion near the Fermi surface described in Embodiment 1 was confirmed in the hole injection layer 4A of the sample α in an area between a point which is 3.6 eV lower in binding energy than point (iii) and a point which is 1.8 eV lower in binding energy than point (iii), point (iii) being the location at which the valence band rises. On the other hand, this sort of spectral protrusion was not confirmed in the sample ε. Note that in the samples β, γ, and δ as well, the above spectral protrusion was confirmed with a shape differing little from sample α in terms of normalized intensity.

UPS measurement, however, is only an assessment of the surface layer. Upon attempting to confirm the existence of the spectral protrusion near the Fermi surface throughout the entire hole injection layer 4A by performing HXPS measurement on the hole injection layer 4A in the samples α and ε, the spectral protrusion was confirmed in the sample α, as expected, but not in the sample ε.

The above experiment proved that the hole injection layer 4A of Embodiment 2 has an occupied energy level near the Fermi surface. Therefore, when a tungsten oxide layer having an upward protrusion (not necessarily a peak) in an area which is approximately between 1.8 eV and 3.6 eV lower in terms of binding energy than point (iii) in the photoelectron spectrum, i.e. a tungsten oxide layer having an occupied energy level near the Fermi surface, is adopted as the hole injection layer, the organic EL element of Embodiment 2 exhibits excellent hole conduction efficiency.

Here, the characteristics of the hole-only devices and the organic EL elements of Embodiment 2 described thus far are thought to be affected more by the hole conduction efficiency of the hole injection layer 4 than by the hole injection efficiency from the ITO layer 3 to the hole injection layer 4A and the hole injection efficiency from the hole injection layer 4A to the buffer layer 6A. The reasons are as follows.

In the hole injection layer 4A formed under all of the film forming conditions α, β, γ, and δ, the spectral protrusion near the Fermi surface was confirmed by UPS measurement, as described above. In terms of FIG. 14 in Embodiment 1, this means that these hole injection layers 4A all have a number density sufficient for injection sites x to be confirmed by UPS measurement. Furthermore, the shape of the spectral protrusion and the normalized intensity did not differ greatly between hole injection layers 4A under conditions α, β, γ, and δ. Accordingly, the number density of the injection sites x can be assumed to be equivalent in each of the hole injection layers 4A under conditions α, β, γ, and δ. Considering how film forming condition α is equivalent to the above film forming condition A described in Embodiment 1, the hole injection layers 4A under conditions α, β, γ, and δ can all be assumed to have a sufficient number density of injection sites x with respect to the number density of injection sites y in the buffer layer 6A. In other words, the hole injection layers 4A under conditions α, β, γ, and δ are all considered to have equivalent hole injection efficiency from the hole injection layer 4A to the buffer layer 6A.

The driving voltages of HOD-α, HOD-β, HOD-γ, and HOD-δ in Table 9 are all good; however, they represent a spread of 2.25 V. Therefore, a factor other than the hole injection efficiency from the hole injection layer 4A to the buffer layer 6A must affect the spread. Furthermore, in Embodiment 2, Schottky ohmic contact forms between the ITO layer 3 and the hole injection layer 4A, as described above. Accordingly, the factor, which affects the spread, is considered to be remaining one, that is, the hole conduction efficiency of the hole injection layer 4A itself.

(Analysis of Relationship between Value of $W^{5+}/W^{6+}$ and Hole Conduction Efficiency)

Figure 37:
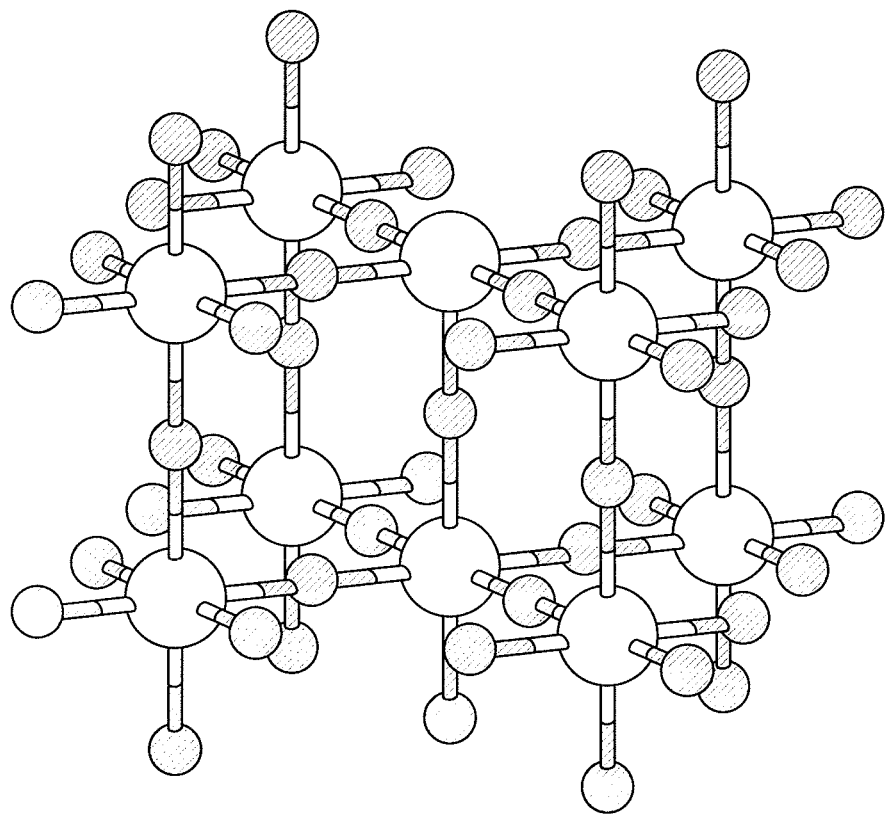
FIG. 37 is a diagram illustrating the crystal structure of tungsten trioxide.

FIG. 37 is a diagram illustrating the tungsten oxide crystal structure. In the tungsten oxide of Embodiment 2, as described above, the composition ratio of tungsten to oxygen is nearly 1:3. Therefore, tungsten trioxide is described here as an example.

As shown in FIG. 37, a tungsten trioxide crystal is a structure in which six oxygen atoms and one tungsten atom bind in octahedral coordination, with octahedrons sharing oxygen atoms at vertices. (To simplify the illustration, FIG. 37 shows octahedrons in perfect alignment, like rhenium trioxide. In reality, the octahedrons are in a slightly distorted arrangement).

These tungsten atoms that are bound to six oxygen atoms in octahedral coordination are tungsten atoms with a valence of six. On the other hand, tungsten atoms with a lower valence than six correspond to structures in which the octahedral coordination has somehow become disrupted. A typical example is when one of the six oxygen atoms escapes, forming an oxygen vacancy. In this case, the tungsten atom bonded with the remaining five oxygen atoms has a valence of five.

Typically, when an oxygen vacancy exists in a metal oxide, an electron left behind by the oxygen atom that has escaped is provided to a metal atom near the vacancy in order to maintain electric neutrality. The valence of the metal atom thus lowers. An electron is thus provided in this way to the tungsten atom with a valence of five. This electron is assumed to combine with the electron that was used to bond with the oxygen atom that escaped, thus forming a lone pair of electrons.

Based on the above analysis, the mechanism for hole conduction in the hole injection layer 4A of Embodiment 2 that has tungsten atoms with a valence of five is, for example, as follows.

A tungsten atom with a valence of five can supply a hole with an electron from its own lone pair of electrons. Accordingly, if tungsten atoms with a valence of five exist within a certain distance from each other, a hole can hop between the lone pair of electrons of tungsten atoms with a valence of five due to the voltage applied to the hole injection layer. Furthermore, if the tungsten atoms with a valence of five are nearly adjacent, the overlap between 5d orbitals corresponding to the lone pairs of electrons grows large, so that holes can move easily without hopping.

In other words, in Embodiment 2, holes are thought to be conducted between the tungsten atoms with a valence of five that exist in the hole injection layer 4A.

Based on the above inference, if the value of $W^{5+}/W^{6+}$ is high, i.e. if the proportion of tungsten atoms with a valence of five is high in the hole injection layer 4A, as in the sample α, tungsten atoms with a valence of five are more likely to be close or adjacent, thus facilitating hole conduction at a low voltage. This provides the organic EL element 1C with excellent hole conduction efficiency.

Note that in samples γ and δ, while the value of $W^{5+}/W^{6+}$ is not as high as in the sample α, a value of approximately 3.2% provided the element with a good, low driving voltage. It is therefore considered sufficient for the value of $W^{5+}/W^{6+}$ to be approximately 3.2% or greater.

(Microstructure of Tungsten Oxide in Hole Injection Layer 4A)

A nanocrystal structure exists in the tungsten oxide layer constituting the hole injection layer 4A of Embodiment 2. This nanocrystal structure is formed by adjusting the film forming conditions. Details are provided below.

In order to confirm the existence of the nanocrystal structure in the hole injection layer 4A under each of the film forming conditions α through ε in Table 8, a transmission electron microscope (TEM) measurement experiment was performed.

The hole injection layers 4A in the sample devices for TEM measurement were formed with a DC magnetron sputtering device. Specifically, a tungsten oxide layer (considered to be the hole injection layer 4A) was formed to a thickness of 30 nm by the above reactive sputtering method on an ITO substrate formed on glass.

Hereinafter, the TEM measurement samples manufactured under film forming conditions α, β, γ, δ, and ε are referred to as samples α, β, γ, δ, and ε.

Typically, TEM measurement is performed on a surface by selecting a thin sample device. In Embodiment 2, a cross-section of the hole injection layer 4A was designated as the target for measurement. A cross-section was manufactured by using a focused ion beam (FIB) device to process the sample device, and the thickness of the laminate was adjusted to approximately 50 nm. The conditions for FIB processing and TEM measurement are as follows.

Figure 38:
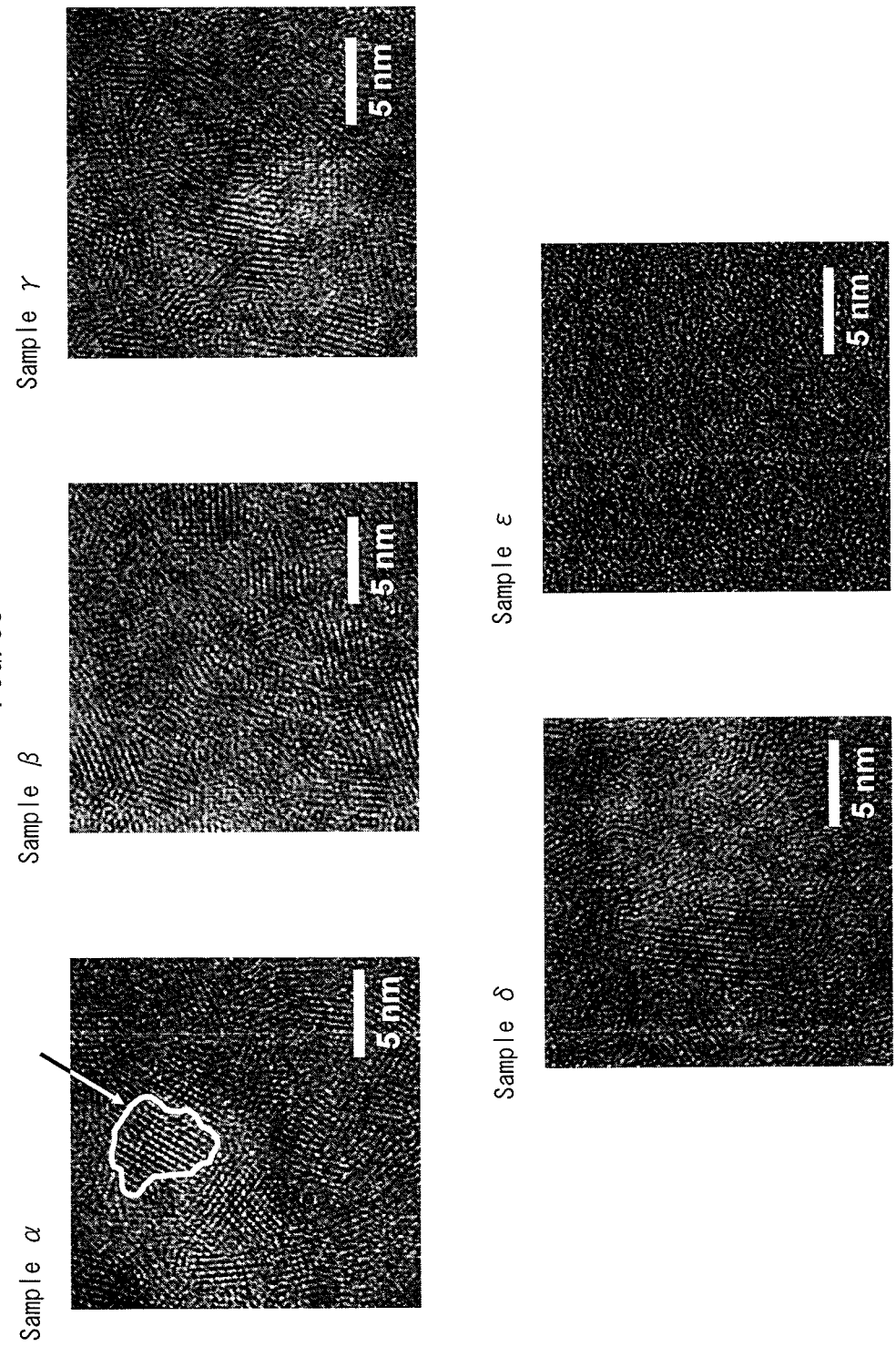
FIG. 38 shows cross-sectional TEM photographs of the tungsten oxide layer.

(Conditions for FIB Processing)
Device used: Quanta200 (manufactured by FEI Company)
Accelerating voltage: 30 kV (final voltage: 5 kV)
Laminate thickness: Approximately 50 nm
(Conditions for TEM Measurement)
Device used: Topcon EM-002B (manufactured by Topcon Technohouse Corporation)
Measurement method: high-resolution electron microscopy
Accelerating voltage: 200 kV FIG. 38 is a diagram illustrating a TEM measurement photograph of a cross-section of the hole injection layer 4A in the samples α through ε. The magnification ratio in each photograph is as indicated by the scale bar shown in each photograph. The photographs are shown with 256 gradations from the darkest to the brightest region.

In each TEM photograph for the samples α, β, γ, and δ, regular linear structures can be observed based on how bright regions are partially aligned in the same direction. As indicated by the scale bar, the linear structures occur with an interval approximately between 1.85 angstroms and 5.55 angstroms. On the other hand, the bright regions are scattered irregularly in the sample ε, with no regular linear structures being observable.

Typically, in a TEM photograph, regions with the above linear structures represent one microscopic crystal. In the TEM pictures in FIG. 38, the size of these crystals can be seen to be approximately between 5 nm and 10 nm. Therefore, the absence or presence of the above linear structure can be interpreted as follows: whereas the nanocrystal structure can be confirmed in the tungsten oxide of samples α, β, γ, and δ, the nanocrystal structure cannot be confirmed in sample ε, which is thought to have an amorphous structure nearly throughout the sample device.

In the TEM photograph of sample α in FIG. 38, one of the nanocrystals, chosen arbitrarily, is outlined with a white line. Note that this outline is not precise, but rather is meant to be an example. This is because the TEM photograph shows not only the uppermost surface in the cross-section, but also the conditions lower in the layer, thus making it difficult to precisely identify the outline. The size of the outlined nanocrystal appears to be approximately 5 nm.

FIG. 39 shows the results of a 2D Fourier transform on the TEM measurement photographs in FIG. 38 (hereinafter referred to as 2D Fourier transform images). The 2D Fourier transform images are a distribution of the wavelengths in the reciprocal space of the TEM measurement photographs in FIG. 38 and therefore indicate the periodicity of the TEM measurement photographs. The 2D Fourier transform images in FIG. 39 were created by performing a Fourier transform on the TEM photographs of FIG. 38 using LAview Version #1.77, which is image processing software.

In the 2D Fourier transform images for the samples α, β, γ, and δ, bright regions formed by two or three concentric circles centering on the center point (Γ point) can be seen relatively clearly. On the other hand, in the sample ε, such a bright region formed by concentric circles is not clear.

The lack of clarity of the bright region formed by concentric circles indicates the loss of order in the TEM photograph of FIG. 38. In other words, the hole injection layer 4A in the samples α, β, γ, and δ, in which the bright region formed by concentric circles is clear, indicates a relatively high level of regularity and orderliness in the layer, whereas the hole injection layer 4A in the sample ε has a low level of regularity and orderliness.

Figure 40A:
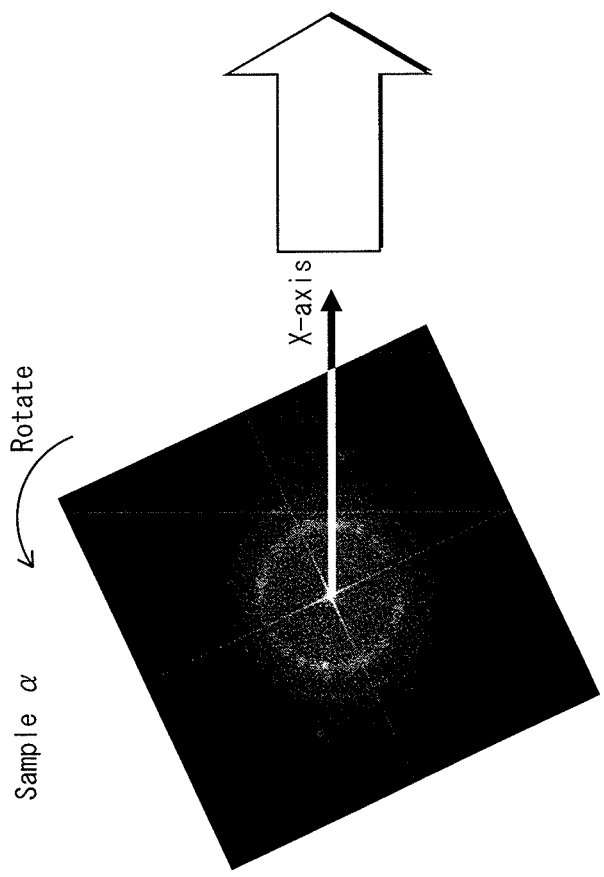
FIGS. 40A and 40B are diagrams illustrating the creation of a plot of change in luminance from the 2D Fourier transform image shown in FIG. 39.
Figure 40B:
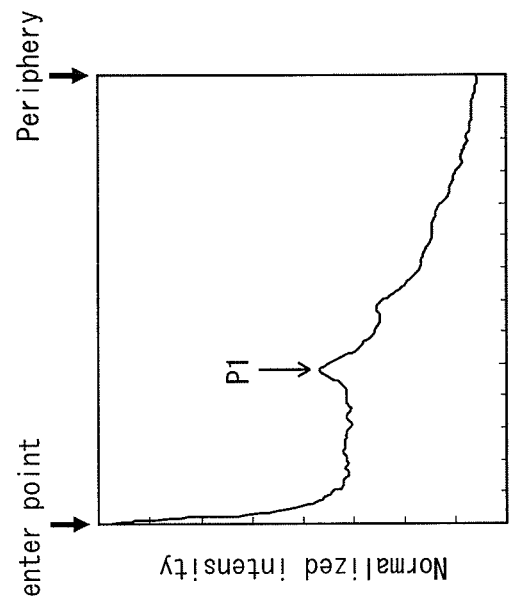

To clearly express this orderliness, graphs showing the change in luminance vs. the distance from the center of the image were created for each 2D Fourier transform image in FIG. 39. FIGS. 40A and 40B show an outline of the method of creating the graphs, using the sample α as an example.

As illustrated in FIG. 40A, a 2D Fourier transform image was rotated 1° at a time from 0° to 359°, with the center point is the center of rotation. Upon every degree of rotation, the luminance versus the distance from the center point along the X-axis was measured. Measurement results for each degree of rotation were then summed up and divided by 360, yielding the average luminance versus the distance from the center point (hereinafter referred to as normalized luminance). FIG. 40B shows a plot with distance from the center point along the horizontal axis and normalized luminance for each distance along the vertical axis. Microsoft Office Picture Manager was used to rotate the 2D Fourier transform images, and the image processing software ImageNos was used to measure the distance from the center point and the luminance. Hereinafter, the plot showing the relationship between the distance from the center point and the normalized luminance at each distance, as created with the method described in FIGS. 40A and 40B, is referred to as a "plot of change in luminance".

FIGS. 41 and 42 illustrate the plots of change in luminance for samples α through ε. Apart from a high luminance region at the center point, each of the sample devices exhibited a peak as indicated by the arrows. Hereinafter, the peak indicated by the arrow nearest the center point in the plot of change in luminance is referred to as a "peak P1".

Figure 43:
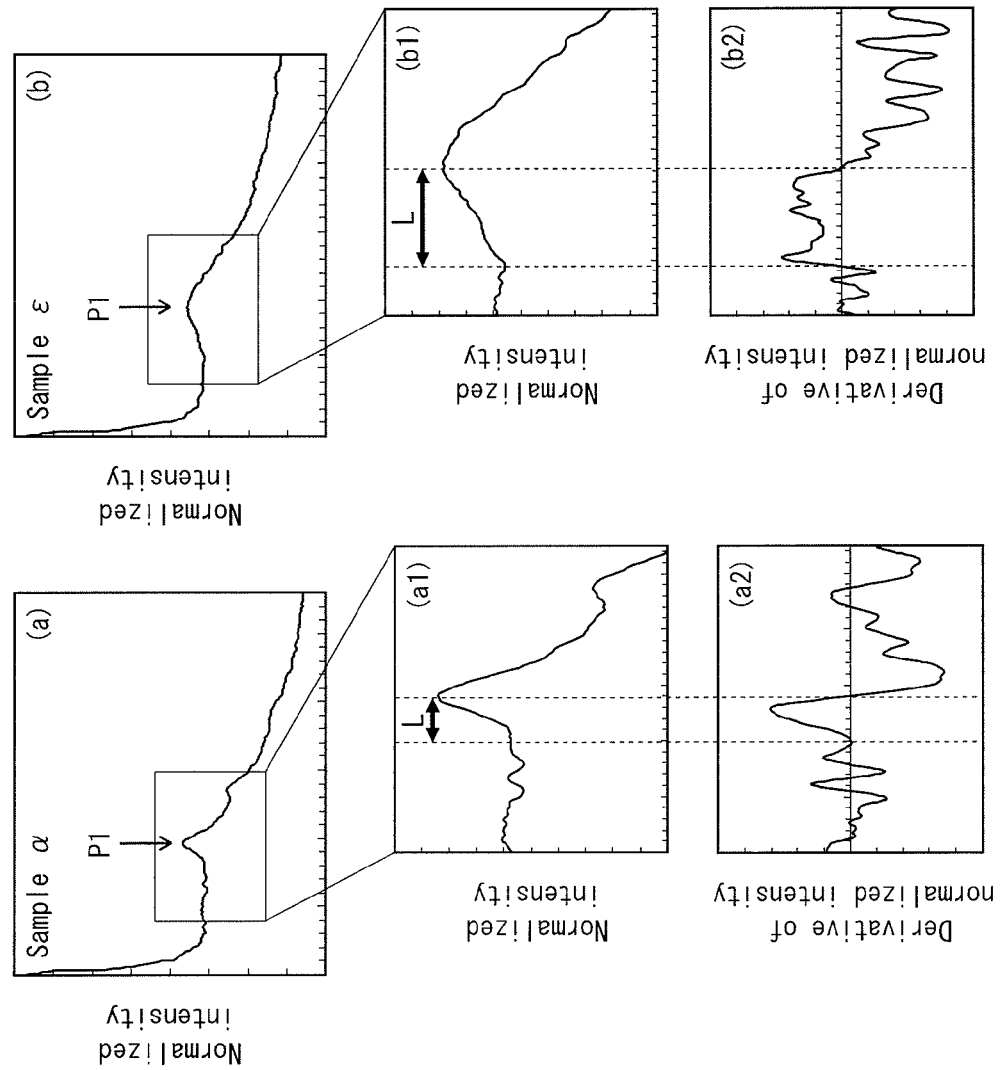
FIG. 43 illustrates plots of change in luminance for samples α and ε in (a) and (b), with (a1) and (b1) being enlarged diagrams of each peak closest to the center point in the plots of change in luminance, and (a2) and (b2) being the first derivative of the plot of change in luminance in (a1) and (b1).

FIGS. 41 and 42 show that as compared to the peak P1 in the sample ε, the peak P1 in the samples α, β, γ, and δ is a pointed, convex shape. The sharpness of the peak P1 in each sample device was quantified for comparison. FIG. 43 show an outline of the method of assessment, using the samples α and ε as examples.

FIG. 43 illustrates plots of change in luminance for the samples α and ε respectively. In FIG. 43, (a1) and (b1) are enlarged diagrams of each peak P1 and the surrounding region. The "L" in the figures represents the "peak width L of the peak P1" and is used as an index of how "pointed" the peak P1 is.

In order to more accurately determine this "peak width L of the peak P1", the first derivative of the plot of change in luminance in (a1) and (b1) is shown in (a2) and (b2) in FIG. 43. In (a2) and (b2) in FIG. 43, the peak width L is the difference between the value along the horizontal axis corresponding to the peak top of the peak P1 and the value along the horizontal axis, in the direction of the center point from the peak, corresponding to the position at which the derivative first becomes zero.

Table 13 shows the values of the peak width L in the samples α through ε, with the value along the horizontal axis corresponding to the peak top of the peak P1 normalized as 100.

TABLE 13

| Name of Sample | Peak Width L |
|---|---|
| Sample α | 16.7 |
| Sample β | 18.1 |
| Sample γ | 21.3 |
| Sample δ | 21.9 |
| Sample ε | 37.6 |

As shown in Table 13, the peak width L is smallest for the sample α and increases in the order of the samples β, γ, and δ, with the samples having the largest value. The peak width for samples γ and δ is not as small as for the sample α. However, even with a value of 21.9, the organic EL element 1C having the hole injection layer 4A under film forming conditions γ and δ achieves good hole conduction efficiency, as described above.

The value of the peak width L in Table 13 indicates the clarity of the bright region formed by the concentric circle closest to the center point in the 2D Fourier transform images of FIG. 39. As the value of the peak width L is smaller, the extent of the region formed by the concentric circles is also smaller. Accordingly, the TEM photograph in FIG. 38 before the 2D Fourier transform exhibits a greater level of regularity and orderliness. This is considered to correspond to how the proportion of the area occupied by the nanocrystal structure in the TEM photograph is larger. Conversely, as the value of the peak width L is larger, the extent of the region formed by the concentric circles is also larger. Accordingly, the TEM photograph in FIG. 38 before the 2D Fourier transform exhibits a lower level of regularity and orderliness. This is considered to correspond to how the proportion of the area occupied by the nanocrystal structure in the TEM photograph is smaller.

(Analysis of Relationship Between Nanocrystal Structure and Hole Conduction Efficiency)

The experiments in Embodiment 2 have revealed the following. A hole injection layer with good hole conduction efficiency has an occupied energy level near the Fermi surface throughout the entire layer, and the proportion of tungsten atoms with a valence of five is high. Furthermore, the hole injection layer has a nanocrystal structure, and the layer is regular and orderly. Conversely, in a hole injection layer with poor hole conduction efficiency, no occupied energy level near the Fermi surface could be confirmed throughout the entire layer, and the proportion of tungsten atoms with a valence of five is extremely low. No nanocrystal structure could be confirmed in the hole injection layer, and the structure of the layer was neither regular nor orderly. The relationship between these experimental results is analyzed below.

First, the relationship between the nanocrystal structure (the regularity of the film structure) and the tungsten atoms with a valence of five is examined.

As described above, in the hole injection layer formed under each film forming condition in Embodiment 2, the composition ratio of tungsten to oxygen is nearly 1:3. Accordingly, the nanocrystal structure that provides the layer structure with regularity as observed in the hole injection layers under film forming conditions α, β, γ, and δ is assumed to be a microcrystal structure of tungsten trioxide.

Typically, when an oxygen vacancy occurs within a nanoscale microcrystal, the region over which the oxygen vacancy exerts an influence is extremely large in relative terms, due to the small size of the microcrystal. The microcrystal thus becomes greatly distorted, making it difficult to maintain the crystal structure. Accordingly, tungsten atoms with a valence of five that derive from a structure similar to an oxygen vacancy are unlikely to be included within the nanocrystal.

This is not necessarily true, however, along the surface of the nanocrystal, nor at the grain boundaries between nanocrystals. Typically, a structure similar to an oxygen vacancy, known as a surface oxygen vacancy, easily forms on surfaces or grain boundaries where the crystal periodicity is interrupted. For example, Non-Patent Literature 7 reports that the surface of tungsten trioxide crystals is more stable when half of the tungsten atoms along the outermost surface do not terminate in oxygen atoms than when all of the tungsten atoms along the outermost surface terminate in oxygen atoms. In this way, it is considered that a large number of tungsten atoms with a valence of five that do not terminate in oxygen atoms exist along the surface and grain boundaries of the nanocrystals.

On the other hand, in the hole injection layer under film forming condition E, almost no tungsten atoms with a valence of five are present, and no nanocrystal structure was confirmed. The entire layer had an amorphous structure with little regularity. This is considered to be because while the octahedrons that represent the basic structure of tungsten trioxide share an oxygen atom at the vertices without interruption (and therefore do not become tungsten atoms with a valence of five), the arrangement of the octahedrons lacks periodicity and order.

Next, the relationship between the occupied energy level near the Fermi surface and the tungsten atoms with a valence of five is described.

As described in Embodiment 1, it is considered that the occupied energy level near the Fermi surface derives from structures similar to an oxygen vacancy. It is also considered that tungsten atoms with a valence of five derive from structures similar to an oxygen vacancy. In other words, the occupied energy level near the Fermi surface and the tungsten atoms with a valence of five both derive from the structures similar to an oxygen vacancy. Specifically, as described in Embodiment 1, many reports have been made that it can be inferred that 5d orbitals of tungsten atoms with a valence of five, which are not used for binding with oxygen atoms, correspond to the occupied energy level near the Fermi surface.

Based on the above, it can be inferred that in a hole injection layer with good hole conduction efficiency, a large number of tungsten atoms with a valence of five exists along the surface and grain boundaries of the nanocrystals. Therefore, along the surface and at the grain boundaries, the overlap between 5d orbitals of the tungsten atoms with a valence of five grows large, so that the occupied energy level near the Fermi surface exists continuously. On the other hand, a hole injection layer with poor hole conduction efficiency is amorphous, having almost no structures similar to an oxygen vacancy nor tungsten atoms with a valence of five deriving from such structures, and thus it can be inferred that no occupied energy level near the Fermi surface exists in the layer.

Next, the mechanism for hole conduction in the hole injection layer of the present invention is analyzed further. The conduction of holes between tungsten atoms with a valence of five in the hole injection layer 4A has already been analyzed. Based on the correlation between the above experiment results, however, it is possible to extrapolate a more concrete image.

Figure 44A:
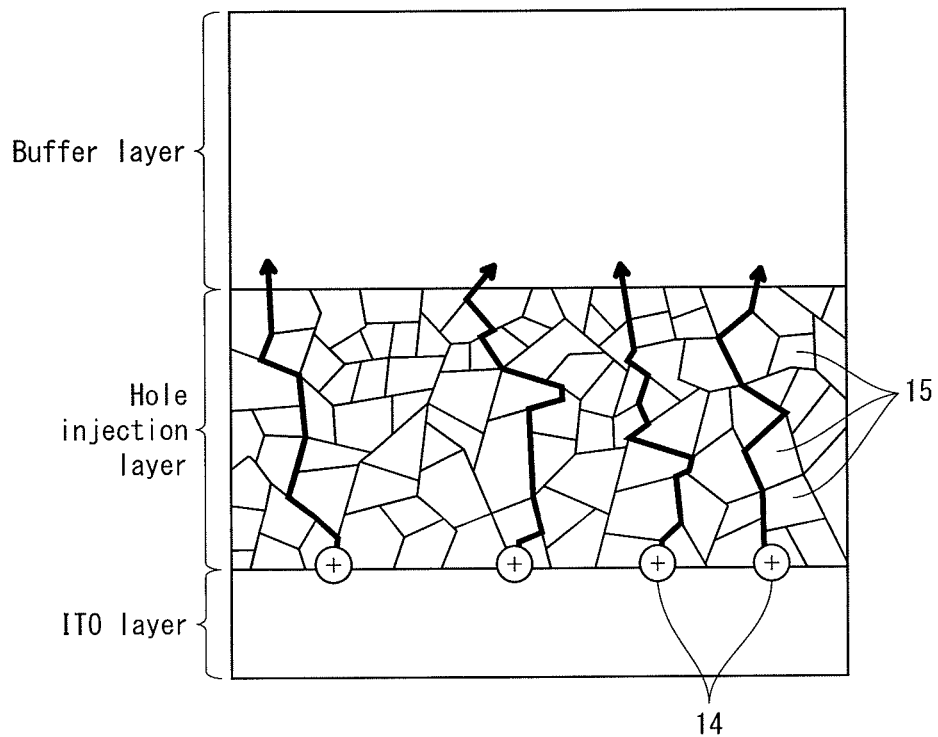
FIG. 44A is a diagram schematically illustrating hole conduction when the tungsten oxide layer is formed mainly from nanocrystal structures.
Figure 44B:
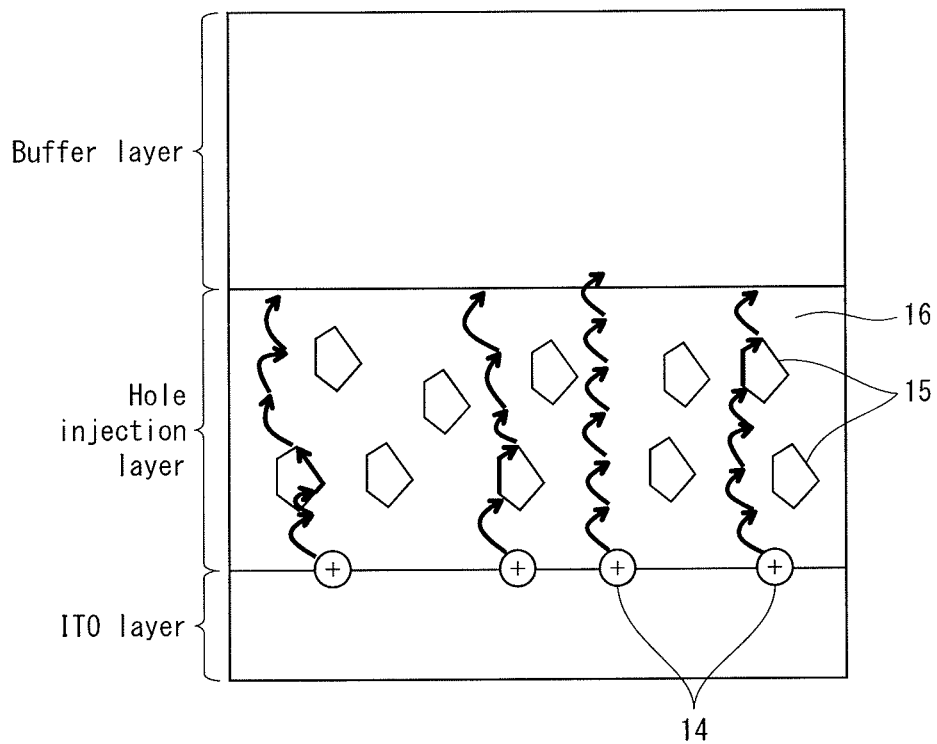
FIG. 44B is a diagram schematically illustrating hole conduction when the tungsten oxide layer is formed mainly from an amorphous structure.

First, hole conduction is described in a hole injection layer composed of tungsten oxide with a mainly amorphous structure, as in the hole injection layer formed under film forming condition ε. FIG. 44B shows the conduction of holes 14 in a hole injection layer in which an amorphous structure 16 is dominant, with few (or no) nanocrystals 15 present. Tungsten atoms with a valence of five are scattered throughout the amorphous structure 16, and upon the application of voltage to the hole injection layer, holes 14 hop between tungsten atoms with a valence of five that are relatively close to each other. Receiving the force of the electrical field, the holes 14 move to the buffer layer by hopping between tungsten atoms with a valence of five that are close to each other. In other words, in the amorphous structure 16, the holes 14 move through hopping conduction.

When the number of tungsten atoms with a valence of five is extremely low, as in the hole injection layer under film forming condition c, the tungsten atoms with a valence of five are separated by a long distance. In order to hop across this long distance, an extremely high voltage needs to be applied, thus raising the driving voltage of the element.

In order to avoid this increase in voltage, the number of tungsten atoms with a valence of five, and therefore the structures similar to an oxygen vacancy, should be increased in the amorphous structure 16. It is in fact possible to manufacture an amorphous layer that includes many structures similar to an oxygen vacancy by forming the tungsten oxide through, for example, vacuum deposition under predetermined conditions.

Such an amorphous layer with many structures similar to an oxygen vacancy, however, loses chemical stability. Furthermore, a clear discoloring occurs due to the absorption of light by the structures similar to an oxygen vacancy. Therefore, this approach is not practical for the mass production of organic EL panels. By contrast, in the hole injection layer of the present invention, the composition ratio of tungsten to oxygen is nearly 1:3. Therefore, few structures similar to an oxygen vacancy are found throughout the layer, and the layer has a crystalline structure. This hole injection layer thus exhibits relatively good chemical stability and less discoloring.

Note that many tungsten atoms with a valence of five exist along the surface of the nanocrystals 15 in FIG. 44B. Therefore, occupied energy levels near the Fermi surface that allow for the exchange of holes exist along the surface of the nanocrystals 15. As a result, once the holes 14 reach the surface of the nanocrystals 15, this is the only location at which the holes 14 move easily. In order to reach the buffer layer, however, the holes 14 must traverse the amorphous structure 16, thus preventing the hole conduction efficiency from improving.

Next, hole conduction within a tungsten oxide layer having the nanocrystal structure of the present invention is described. FIG. 44A shows the conduction of holes 14 in a hole injection layer with little (or none) of the amorphous structure 16 and abundant nanocrystals 15. First, as described above, abundant tungsten atoms with a valence of five exist along the surface and grain boundaries of the nanocrystals 15. Therefore, an unoccupied energy level near the Fermi surface that can exchange holes is nearly continuous along the surface and grain boundaries. Furthermore, since abundant nanocrystals 15 are present in FIG. 44A, the surfaces and grain boundaries of these nanocrystals 15 are also continuous. In other words, continuous hole conduction paths exist along the continuous surfaces and grain boundaries of the nanocrystals 15, as indicated by the boldface arrows. As a result, upon applying voltage to the hole injection layer, the holes 14 are easily conducted along the occupied energy levels near the Fermi surface that extend along these continuous surfaces and grain boundaries, thus allowing the holes 14 to reach the buffer layer at a low driving voltage.

Based on the above analysis, the important factors for achieving a metal oxide layer with good hole conduction efficiency are (1) the existence of portions that can exchange holes, and (2) continuity among these portions. Accordingly, a metal oxide layer that (1) includes metal atoms at a lower valence than the maximum possible valence and that (2) has a nanocrystal structure can be considered a good structure for hole conduction.

The experiments in the analysis provided for Embodiment 2 above are based on mainly the hole injection layer 4A, and of course hold as well for the hole injection layer 4B.
(Additional Matters)

The expression "occupied energy level" as referred to in the present invention includes an energy level of a so-called semi-occupied orbital, which is an electron orbital which is occupied by at least one electron.

The method of forming the hole injection layer of the present invention is not limited to the reactive sputtering method. For example, the vapor deposition method, the CVD method, or the like may be used instead.

Further, the implementation of the organic EL element of the present invention is not limited to a structure where the organic EL element is used in an independent state. A plurality of the organic EL elements of the present invention may be integrated on a substrate as pixels to form an organic EL light-emitting device. An organic EL light-emitting device so yielded may be implemented by appropriately arranging the thickness of each of the layers in each of the organic EL elements, and is utilizable as a lighting device and so on. Alternatively, such organic EL light-emitting device is utilizable as an organic EL panel, which is an image display device.

In Embodiment 2, the position at which the peak P1 in FIG. 43 begins to rise is the position along the horizontal axis, in the direction of the center point from the top of the peak P1, at which the derivative first becomes zero in (a2) and (b2) in FIG. 43. The method of determining the position at which the peak P1 begins to rise is not, however, limited in this way. For example, in (a1) of FIG. 43 the average value of the normalized luminance near the peak P1 may be used as a baseline, with the position at which the peak P1 begins to rise being defined as the intersection of this baseline and the line in the graph near the peak P1.

In the organic EL element of the present invention, a hole transport layer may be provided between the hole injection layer and the light-emitting layer. The hole transport layer has the function of transporting holes injected from the hole injection layer to the light-emitting layer. An organic material with hole transporting properties is used as the hole transport layer. The organic material for the hole transport layer is an organic substance having the property of conducting holes via an intermolecular charge-transfer reaction. This is also known as a p-type organic semiconductor.

The material for the hole transport layer may be either a high molecular material or a low molecular material, and the hole transport layer may be formed by wet printing, for example. When forming the light-emitting layer, which is the uppermost layer, it is desirable for the material for the hole transport layer to include a cross-linking agent so as not to mix with the material for the light-emitting layer. Examples of the material for the hole transport layer are a copolymer that includes a fluorene region and a triarylamine region, and a triarylamine derivative with a low molecular weight. An example of a cross-linking agent is dipentaerythritol hexaacrylate. In this case, it is desirable that the cross-linking agent be formed from poly3,4ethylenedioxythiophene) doped with polystyrene sulfonic acid (PEDOT:PSS) or a derivative thereof (a copolymer or the like).

The organic EL element 1C has the structure where since the anode 2 is a thin film of silver, the ITO layer 3 is formed on the anode 2 so as to improve the bondability between the layers. In the case where the anode 2 is formed from a material mainly containing aluminum, the bondability is improved, and accordingly the anode 2 may be a single layer without forming the ITO layer 3 thereon.

Figure 45:
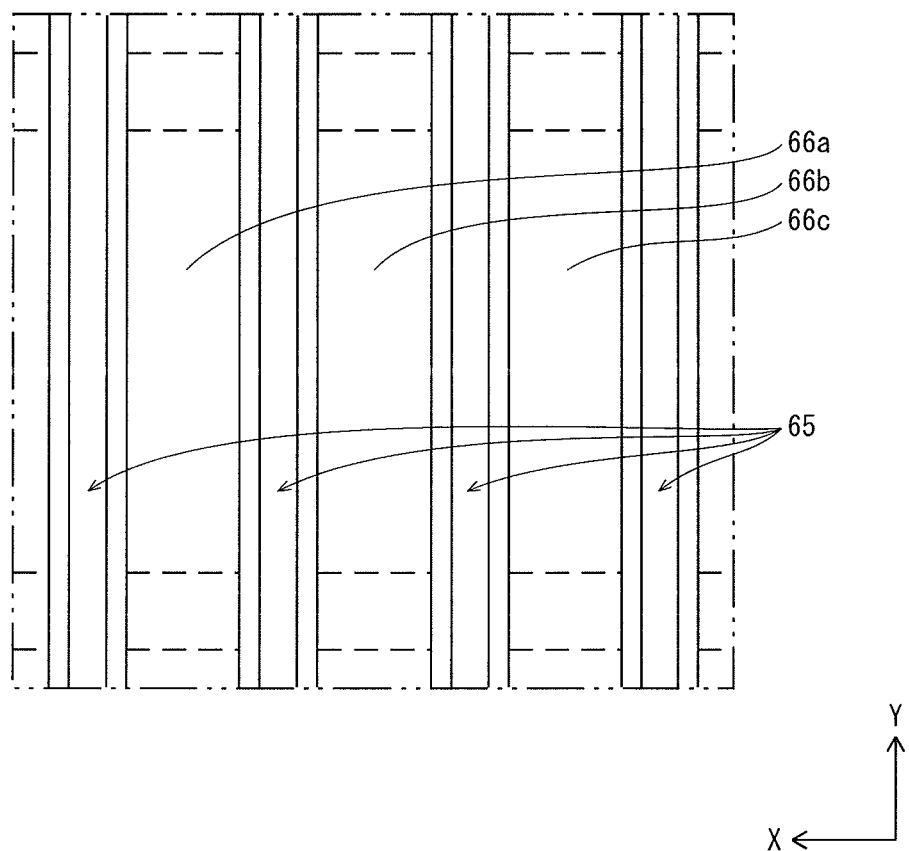
FIG. 45 is a plan view illustrating part of an organic EL panel according to a modification.

In the case where an organic EL panel is manufactured with use of the organic EL element of the present invention, the bank structure is not limited to so-called the pixel bank structure, and the line bank structure is also adoptable. FIG. 45 illustrates the structure of an organic EL panel where a plurality of line banks 65 are arranged to separate light-emitting layers 66a, 66b, and 66c adjacent in the X-axis direction. In the case where the line banks 65 are adopted, it is possible to enable light-emitting layers adjacent in the Y-axis direction to emit light without influencing one another although not being defined by bank elements, by appropriately setting a driving method, an area of the anode, intervals between the light-emitting layers, and so on.

In Embodiments 1 and 2, an organic material is used as the bank material, but alternatively an inorganic material may be used. In this case as well, the bank material layer is formed by application or by another method, as when using an organic material. The bank material layer can be removed by forming a resist pattern on the bank material layer and then performing etching with a predetermined etchant (TMAH solution or the like).

INDUSTRIAL APPLICABILITY

The organic EL element pertaining to the present invention is to be used as display elements for mobile phone displays and TVs, and as a light source for various applications. Regardless of the specific use thereof, the organic EL element of the present invention is applicable as an organic EL element having a wide range of luminous intensity from low luminous intensity to high luminous intensity for the use as a light source or the like, and which can be driven at a low voltage. The organic EL element of the present invention, for having such a high level of performance, may be used in a wide range of applications, including those for household use, those for use in public facilities, and those for professional use. More specifically, such applications include: various display devices; TV apparatuses; displays for portable electronic devices; illumination light sources, and etc.

REFERENCE SIGNS LIST 1 and 1C organic EL element
1A sample for photoelectron spectroscopy measurement
1B and 1D hole-only device
2 anode
3 ITO layer
3A IZO layer
4X thin film (tungsten oxide film)
4, 4A, and 4B hole injection layer
5X bank material layer
5 bank
6A buffer layer 6B light-emitting layer
8 cathode (double-layer)
8A barium layer (layer constituting cathode)
8B aluminum layer (layer constituting cathode)
8C and 8E cathode (Au single layer)
8 cathode ITO single layer)
9 sealing layer
10 substrate
11 silicon substrate
12 tungsten oxide layer
13 and 15 nanocrystal
14 hole
16 amorphous structure
17 planarizing film
DC direct current power supply

The invention claimed is:

1. An organic EL element, comprising:
an anode;
a functional layer containing an organic material; and
a hole injection layer for injecting holes to the functional layer, the hole injection layer being between the anode and the functional layer and in contact with the anode,
wherein the hole injection layer comprises tungsten oxide, is at least 2 nm thick, and includes an occupied energy level that is 1.8 electron volts to 3.6 electron volts lower than a lowest energy level of a valence band of the hole injection layer in terms of a binding energy, and
the occupied energy level at an interface between the hole injection layer and the anode is approximately equal to an energy level of a Fermi level of the anode in terms of the binding energy.

2. The organic EL element of claim 1, wherein
a gap between the occupied energy level at the interface between the hole injection layer and the anode and the energy level of the Fermi level of the anode is at most 0.3 electron volts in terms of the binding energy.

3. The organic EL element of claim 1, wherein
an ultraviolet photoelectron spectroscopy spectrum of the hole injection layer exhibits an upward protrusion that is 1.8 electron volts to 3.6 electron volts lower than the lowest energy level of the valence band in terms of the binding energy, where the ultraviolet photoelectron spectroscopy spectrum expresses a relation between the binding energy and one of photoelectron intensity and normalized intensity of the photoelectron intensity.

4. The organic EL element of claim 1, wherein
an X-ray photoelectron spectroscopy spectrum of the hole injection layer exhibits an upward protrusion that is 1.8 electron volts to 3.6 electron volts lower than the lowest energy level of the valence band in terms of the binding energy, where the X-ray photoelectron spectroscopy spectrum expresses a relation between the binding energy and one of photoelectron intensity and normalized intensity of the photoelectron intensity.

5. The organic EL element of claim 1, wherein
a differential spectrum obtained by differentiating an ultraviolet photoelectron spectroscopy spectrum of the hole injection layer has a shape that is expressed by a non-exponential function throughout a range between 2.0 electron volts and 3.2 electron volts lower than the lowest energy level of the valence band in terms of the binding energy, where the ultraviolet photoelectron spectroscopy spectrum expresses a relation between the binding energy and one of photoelectron intensity and normalized intensity of the photoelectron intensity.

6. The organic EL element of claim 1, wherein
the hole injection layer is in contact with the functional layer, and
the occupied energy level at an interface between the hole injection layer and the functional layer is approximately equal to an energy level of a highest occupied molecular orbital of the functional layer in terms of the binding energy.

7. The organic EL element of claim 1, wherein
a gap between the occupied energy level at an interface between the hole injection layer and the functional layer and an energy level of a highest occupied molecular orbital of the functional layer is at most 0.3 electron volts in terms of the binding energy.

8. The organic EL element of claim 1, wherein
the hole injection layer is a metal oxide film,
metal atoms constituting the metal oxide include both metal atoms at a maximum valence thereof and metal atoms at a valence less than the maximum valence, and
the metal oxide film includes a crystal of the metal oxide, a particle diameter of the crystal being on an order of nanometers.

9. The organic EL element of claim 8, wherein
the metal atoms at the maximum valence are tungsten atoms with a valence of six, and
the metal atoms at the valence less than the maximum valence are tungsten atoms with a valence of five.

10. The organic EL element of claim 9, wherein
a ratio $W^{5+}/W^{6+}$ of the number of the tungsten atoms with a valence of five to the number of the tungsten atoms with a valence of six is at least 3.2%.

11. The organic EL element of claim 9, wherein
the ratio $W^{5+}/W^{6+}$ is at least 3.2% and at most 7.4%.

12. The organic EL element of claim 9, wherein
a hard X-ray photoelectron spectroscopy spectrum of the hole injection layer formed from tungsten oxide includes a first component and a second component, the first component corresponding to a $4f_{7/2}$ energy level of the tungsten atoms with a valence of six, and the second component being in a region lower than the first component in terms of the binding energy.

13. The organic EL element of claim 12, wherein
the second component is in a region between 0.3 electron volts and 1.8 electron volts lower, in terms of the binding energy, than a peak top of the first component.

14. The organic EL element of claim 12, wherein
an area intensity of the second component is between 3.2% and 7.4% of an area intensity of the first component.

15. The organic EL element of claim 9, wherein
tungsten atoms at a valence less than the maximum valence cause an electronic state of the hole injection layer formed from tungsten oxide to have an occupied energy level in a range between 1.8 electron volts and 3.6 electron volts lower than a lowest energy level of a valence band in terms of the binding energy.

16. The organic EL element of claim 9, wherein
the hole injection layer formed from tungsten oxide includes a plurality of crystals of the tungsten oxide, each of the crystals having a particle diameter of between 5 nm and 10 nm.

17. The organic EL element of claim 9, wherein
regular linear structures at intervals of between 1.85 angstroms and 5.55 angstroms appear in a lattice image by transmission electron microscopy observation of the hole injection layer formed from tungsten oxide.

18. The organic EL element of claim 17, wherein
in a 2D Fourier transform image of the lattice image, a bright region formed by concentric circles centering on a center point of the 2D Fourier transform image appears.

19. The organic EL element of claim 18, wherein
in a plot of distance from the center point versus normalized luminance of luminance of the 2D Fourier transform image at the corresponding distance, at least one peak of the normalized luminance appears other than the center point.

20. The organic EL element of claim 19, wherein
with a peak width being a difference between the distance corresponding to a position of a peak top of the normalized luminance appearing closest to the center point in the plot and the distance corresponding to a position at which a peak of the normalized luminance begins to rise, the peak width is less than 22 when the distance corresponding to the peak top is 100.

21. The organic EL element of claim 1, wherein
the functional layer comprises an amine-containing material.

22. The organic EL element of claim 1, wherein
the functional layer includes at least one of a hole transfer layer that transfers the holes, a light-emitting layer that emits light by recombination of electrons and the holes injected to the functional layer, and a buffer layer that one of adjusts optical characteristics of the organic EL element and blocks electrons.

23. The organic EL element of claim 1, wherein
the occupied energy level is 2.0 electron volts to 3.2 electron volts lower than the lowest energy level of the valence band in terms of the binding energy.

24. The organic EL element of claim 1, wherein
an ultraviolet photoelectron spectroscopy spectrum of the hole injection layer, using a He I line as a light source and a normal line direction of a surface of the substrate as an electron emission angle, exhibits an upward protrusion that is 1.8 electron volts to 3.6 electron volts lower than a lowest energy level of a valence band of the hole injection layer in terms of binding energy, the upward protrusion corresponding to the occupied energy level of the hole injection layer.

25. An organic EL element, comprising:
an anode;
a tungsten oxide layer that is in contact with the anode;
a layer that is disposed opposite the anode with the tungsten oxide layer being interposed therebetween, and contains an organic material; and
a cathode that is disposed opposite the anode with the layer containing the organic material being interposed therebetween,
wherein the tungsten oxide layer is at least 2 nm thick, and includes an occupied energy level that is 1.8 electron volts to 3.6 electron volts lower than a lowest energy level of a valence band of the tungsten oxide layer in terms of a binding energy.

26. A display device comprising the organic EL element of claim 1.

27. A light-emitting device comprising the organic EL element claim 1.

28. The organic EL element of claim 25, wherein
an ultraviolet photoelectron spectroscopy spectrum of the hole injection layer, using a He I line as a light source and a normal line direction of a surface of the substrate as an electron emission angle, exhibits an upward protrusion that is 1.8 electron volts to 3.6 electron volts lower than a lowest energy level of a valence band of the hole injection layer in terms of binding energy, the upward protrusion corresponding to the occupied energy level of the hole injection layer.

29. A manufacturing method for an organic EL element, comprising:
preparing an anode;
forming a tungsten oxide layer above the anode by introducing a gas comprising an argon gas and an oxygen gas to a chamber of a sputtering device, a total pressure of the gas in the chamber being greater than 2.7 pascals and at most equal to 7.0 pascals, a partial pressure ratio of the oxygen gas with respect to the total pressure of the gas in the chamber being at least 50% and at most 70%, and an input power density per unit surface area of a sputtering target being at least 1 W/cm$^2$ and at most 2.8 W/cm$^2$;
forming a functional layer containing an organic material above the tungsten oxide layer; and
forming a cathode above the functional layer, wherein
in the forming of the tungsten oxide layer, the tungsten oxide layer is formed so as to be at least 2 nm thick.

30. The manufacturing method of claim 29, wherein
in the forming of the tungsten oxide layer, the tungsten oxide layer is formed such that an ultraviolet photoelectron spectroscopy spectrum of the tungsten oxide layer exhibits an upward protrusion that is 1.8 electron volts to 3.6 electron volts lower than a lowest energy level of a valence band of the tungsten oxide layer in terms of the binding energy.

31. The manufacturing method of claim 29, wherein
in the forming of the tungsten oxide layer, the tungsten oxide layer is formed such that a differential spectrum, obtained by differentiating an ultraviolet photoelectron spectroscopy spectrum of the tungsten oxide layer, has a shape that is expressed by a non-exponential function throughout a range between 2.0 electron volts and 3.2 electron volts lower than a lowest energy level of a valence band of the tungsten oxide layer in terms of the binding energy.

32. The manufacturing method of claim 31, wherein
in the forming of the tungsten oxide layer, a value, yielded by dividing the total pressure of the gas by the input power density, is larger than 0.7 Pa·cm$^2$/W.

33. The manufacturing method of claim 32, wherein
in the forming of the tungsten oxide layer, the value, yielded by dividing the total pressure of the gas by the input power density, is smaller than 3.2 Pa·cm$^2$/W.

* * * * *